United States Patent
Pacala et al.

(10) Patent No.: US 11,150,347 B2
(45) Date of Patent: Oct. 19, 2021

(54) MICRO-OPTICS FOR OPTICAL IMAGER WITH NON-UNIFORM FILTER

(71) Applicant: Ouster, Inc., San Francisco, CA (US)

(72) Inventors: Angus Pacala, San Francisco, CA (US); Mark Frichtl, San Francisco, CA (US)

(73) Assignee: OUSTER, INC., San Francisco, CA (US)

( * ) Notice: Subject to any disclaimer, the term of this patent is extended or adjusted under 35 U.S.C. 154(b) by 109 days.

(21) Appl. No.: 15/979,253

(22) Filed: May 14, 2018

(65) Prior Publication Data

US 2018/0329035 A1    Nov. 15, 2018

Related U.S. Application Data

(60) Provisional application No. 62/506,449, filed on May 15, 2017, provisional application No. 62/506,437, (Continued)

(51) Int. Cl.
*G01S 17/10* (2020.01)
*G02B 27/30* (2006.01)
(Continued)

(52) U.S. Cl.
CPC .............. *G01S 17/10* (2013.01); *G01S 7/486* (2013.01); *G01S 7/4813* (2013.01); (Continued)

(58) Field of Classification Search
CPC ................... G01J 3/0229; G01J 3/0294; G01J 2003/2806; G01J 2003/2826; G01J 3/46; G01J 3/51; G01S 17/188
(Continued)

(56) References Cited

U.S. PATENT DOCUMENTS

| 4,003,660 A | 1/1977 | Christie, Jr. et al. |
| 4,275,950 A | 6/1981 | Meyer |

(Continued)

FOREIGN PATENT DOCUMENTS

| CN | 1918427 | 2/2007 |
| CN | 101413905 | 4/2009 |

(Continued)

OTHER PUBLICATIONS

European Patent Office; Extended European Search Report received in European Application No. 16865297.2, dated Jun. 11, 2019; 9 pages.

(Continued)

*Primary Examiner* — Kevin K Pyo
(74) *Attorney, Agent, or Firm* — Kilpatrick Townsend & Stockton LLP

(57) ABSTRACT

Embodiments describe optical imagers that include one or more micro-optic components. Some imagers can be passive imagers that include a light detection system for receiving ambient light from a field. Some imagers can be active imagers that include a light emission system in addition to the light detection system. The light emission system can be configured to emit light into the field such that emitted light is reflected off surfaces of an object in the field and received by the light detection system. In some embodiments, the light detection system and/or the light emission system includes micro-optic components for improving operational performance.

21 Claims, 36 Drawing Sheets

Related U.S. Application Data filed on May 15, 2017, provisional application No. 62/506,445, filed on May 15, 2017, provisional application No. 62/515,291, filed on Jun. 5, 2017.

(51) Int. Cl.

| | | |
|---|---|---|
| *G01S 7/486* | (2020.01) | |
| *G02B 27/00* | (2006.01) | |
| *G02B 27/09* | (2006.01) | |
| *G01S 17/42* | (2006.01) | |
| *G01S 7/481* | (2006.01) | |
| *G01S 7/4863* | (2020.01) | |
| *G01S 7/4865* | (2020.01) | |
| *H01L 31/0232* | (2014.01) | |
| *H01L 31/0216* | (2014.01) | |
| *G01S 17/931* | (2020.01) | |
| *G01S 17/89* | (2020.01) | |
| *H01L 27/146* | (2006.01) | |
| *H01L 31/02* | (2006.01) | |
| *G01S 17/08* | (2006.01) | |
| *H04B 10/50* | (2013.01) | |
| *H04B 10/67* | (2013.01) | |
| *H04B 10/69* | (2013.01) | |
| *H04B 10/80* | (2013.01) | |
| *H01L 27/144* | (2006.01) | |
| *H01L 31/107* | (2006.01) | |
| *G02B 5/20* | (2006.01) | |

(52) U.S. Cl.
CPC .......... *G01S 7/4815* (2013.01); *G01S 7/4816* (2013.01); *G01S 7/4817* (2013.01); *G01S 7/4863* (2013.01); *G01S 7/4865* (2013.01); *G01S 17/08* (2013.01); *G01S 17/42* (2013.01); *G01S 17/89* (2013.01); *G01S 17/931* (2020.01); *G02B 27/0037* (2013.01); *G02B 27/0955* (2013.01); *G02B 27/30* (2013.01); *H01L 27/1446* (2013.01); *H01L 27/14643* (2013.01); *H01L 31/02027* (2013.01); *H01L 31/02162* (2013.01); *H01L 31/02164* (2013.01); *H01L 31/02165* (2013.01); *H01L 31/02325* (2013.01); *H01L 31/02327* (2013.01); *H01L 31/107* (2013.01); *H04B 10/503* (2013.01); *H04B 10/675* (2013.01); *H04B 10/6973* (2013.01); *H04B 10/801* (2013.01); *G02B 5/205* (2013.01)

(58) Field of Classification Search
USPC ...................................... 250/214 A, 226, 239
See application file for complete search history.

(56) References Cited

U.S. PATENT DOCUMENTS

| | | | |
|---|---|---|---|
| 4,358,851 A | 11/1982 | Scifres et al. | |
| 4,634,272 A | 1/1987 | Endo | |
| 4,676,599 A | 6/1987 | Cruz | |
| 4,702,600 A | 10/1987 | Handrich et al. | |
| 4,744,667 A | 5/1988 | Fay et al. | |
| 4,851,664 A | 7/1989 | Rieger | |
| 5,084,596 A | 1/1992 | Borsh | |
| 5,267,016 A | 11/1993 | Meinzer et al. | |
| 5,288,992 A | 2/1994 | Fohl | |
| 5,745,153 A | 4/1998 | Kessler et al. | |
| 5,982,552 A | 11/1999 | Nakama et al. | |
| 6,014,232 A | 1/2000 | Clarke | |
| 6,133,989 A | 10/2000 | Stettner et al. | |
| 6,255,133 B1 | 7/2001 | Ormond | |
| 6,374,024 B1 | 4/2002 | Iijima | |
| 6,414,746 B1 | 7/2002 | Stettner et al. | |
| 6,433,934 B1 | 8/2002 | Reznichenko et al. | |
| 6,690,019 B2 | 2/2004 | Stettner et al. | |
| 6,721,262 B1 | 4/2004 | Jordache et al. | |
| 7,091,462 B2 | 8/2006 | Wilson et al. | |
| D531,525 S | 11/2006 | Dold et al. | |
| 7,170,542 B2 | 1/2007 | Hanina et al. | |
| 7,196,301 B2 | 3/2007 | Thomas et al. | |
| 7,295,298 B2 | 11/2007 | Willhoeft et al. | |
| 7,345,271 B2 | 3/2008 | Boehlau et al. | |
| 7,421,159 B2 | 9/2008 | Yang et al. | |
| 7,433,042 B1 | 10/2008 | Cavanaugh et al. | |
| 7,808,706 B2 | 10/2010 | Fadel et al. | |
| 7,969,558 B2 | 6/2011 | Hall | |
| 8,013,983 B2 | 9/2011 | Lin et al. | |
| 8,130,367 B2 | 3/2012 | Stettner et al. | |
| D659,030 S | 5/2012 | Anselment et al. | |
| 8,319,949 B2 | 11/2012 | Cantin et al. | |
| 8,089,618 B2 | 12/2012 | Yang | |
| 8,330,840 B2 | 12/2012 | Lenchenkov | |
| 8,374,405 B2 | 2/2013 | Lee et al. | |
| 8,384,997 B2 | 2/2013 | Shpunt et al. | |
| 8,494,252 B2 | 7/2013 | Freedman et al. | |
| 8,633,384 B1 | 1/2014 | Shotey et al. | |
| 8,675,181 B2 | 3/2014 | Hall | |
| 8,717,488 B2 | 6/2014 | Shpunt et al. | |
| 8,742,325 B1 | 6/2014 | Droz et al. | |
| 8,743,176 B2 | 6/2014 | Stettner et al. | |
| 8,761,495 B2 | 6/2014 | Freedman et al. | |
| 8,767,190 B2 | 7/2014 | Hall | |
| 8,829,406 B2 | 9/2014 | Akerman et al. | |
| 8,836,922 B1 | 9/2014 | Pennecot et al. | |
| 8,848,039 B2 | 9/2014 | Spektor et al. | |
| 9,041,915 B2 | 5/2015 | Earnhart et al. | |
| 9,063,549 B1 | 6/2015 | Pennecot et al. | |
| 9,071,763 B1 | 6/2015 | Templeton et al. | |
| 9,086,273 B1 | 7/2015 | Gruver et al. | |
| 9,111,444 B2 | 8/2015 | Kaganovich | |
| 9,157,790 B2 | 10/2015 | Shpunt et al. | |
| 9,164,511 B1 | 10/2015 | Ferguson et al. | |
| 9,176,051 B2 | 11/2015 | Mappes et al. | |
| 9,229,109 B2 | 1/2016 | Stettner et al. | |
| 9,285,464 B2 | 3/2016 | Pennecot et al. | |
| 9,299,731 B1 | 3/2016 | Lenius et al. | |
| 9,366,573 B2 * | 6/2016 | Geelen ................. | G01J 3/0235 |
| 9,368,936 B1 | 6/2016 | Lenius et al. | |
| 9,369,689 B1 | 6/2016 | Tran et al. | |
| 9,285,477 B1 | 7/2016 | Smith et al. | |
| 9,383,753 B1 | 7/2016 | Templeton et al. | |
| 9,425,654 B2 | 8/2016 | Lenius et al. | |
| 9,435,891 B2 | 9/2016 | Oggier | |
| 9,470,520 B2 | 10/2016 | Schwarz et al. | |
| 9,489,601 B2 | 11/2016 | Fairfield et al. | |
| 9,525,863 B2 | 12/2016 | Nawasra et al. | |
| 9,529,079 B1 | 12/2016 | Droz et al. | |
| 9,551,791 B2 | 1/2017 | Van Den Bossche et al. | |
| 9,882,433 B2 | 1/2018 | Lenius et al. | |
| 9,917,423 B2 | 3/2018 | Song | |
| 9,935,514 B1 | 4/2018 | Lenius et al. | |
| 9,989,406 B2 | 6/2018 | Pacala | |
| 9,992,477 B2 | 6/2018 | Pacala | |
| 10,063,849 B2 | 8/2018 | Pacala | |
| 10,066,990 B2 * | 9/2018 | Rosen ................... | G01J 3/0256 |
| 10,183,541 B2 | 1/2019 | Van Den Bossche et al. | |
| 10,222,458 B2 | 3/2019 | Pacala et al. | |
| 10,222,475 B2 | 3/2019 | Pacala et al. | |
| 10,663,586 B2 | 5/2020 | Pacala et al. | |
| 11,016,192 B2 | 5/2021 | Pacala et al. | |
| 11,016,193 B2 | 5/2021 | Pacala et al. | |
| 11,086,013 B2 | 8/2021 | Pacala et al. | |
| 2003/0006676 A1 | 1/2003 | Smith et al. | |
| 2003/0047752 A1 | 3/2003 | Campbell | |
| 2004/0061502 A1 | 4/2004 | Hasser | |
| 2004/0223071 A1 | 11/2004 | Wells | |
| 2005/0030409 A1 | 2/2005 | Matherson | |
| 2005/0035474 A1 | 2/2005 | Itoh | |
| 2006/0244851 A1 | 11/2006 | Cartlidge | |
| 2007/0002434 A1 | 1/2007 | Juskaitis et al. | |
| 2007/0007563 A1 | 1/2007 | Mouli | |
| 2007/0058981 A1 | 3/2007 | Tamanuki et al. | |

(56) References Cited

U.S. PATENT DOCUMENTS

| | | |
|---|---|---|
| 2007/0060806 A1 | 3/2007 | Hunter et al. |
| 2007/0228262 A1 | 10/2007 | Cantin et al. |
| 2008/0153189 A1 | 6/2008 | Plaine |
| 2009/0016642 A1 | 1/2009 | Hart |
| 2009/0040629 A1 | 2/2009 | Bechtel |
| 2009/0179142 A1 | 7/2009 | Duparre et al. |
| 2009/0295910 A1 | 12/2009 | Mir et al. |
| 2010/0008588 A1 | 1/2010 | Feldkhun et al. |
| 2010/0020306 A1 | 1/2010 | Hall |
| 2010/0110275 A1 | 5/2010 | Mathieu |
| 2010/0123893 A1 | 5/2010 | Yang |
| 2010/0204964 A1 | 8/2010 | Pack et al. |
| 2011/0025843 A1 | 2/2011 | Oggier et al. |
| 2011/0032398 A1 | 2/2011 | Lenchenkov |
| 2011/0037849 A1 | 2/2011 | Niclass et al. |
| 2011/0116262 A1 | 5/2011 | Marson |
| 2011/0216304 A1 | 9/2011 | Hall |
| 2011/0266022 A1 | 11/2011 | Jafari |
| 2012/0044476 A1 | 2/2012 | Earnhart et al. |
| 2012/0140109 A1 | 6/2012 | Shpunt et al. |
| 2012/0154914 A1 | 6/2012 | Moriguchi et al. |
| 2012/0170029 A1 | 7/2012 | Azzazy et al. |
| 2012/0182464 A1 | 7/2012 | Shpunt et al. |
| 2012/0287417 A1 | 11/2012 | Mimeault |
| 2012/0320164 A1 | 12/2012 | Lipton |
| 2013/0044310 A1 | 2/2013 | Mimeault |
| 2013/0141549 A1 | 6/2013 | Beers et al. |
| 2013/0206967 A1 | 8/2013 | Shpunt et al. |
| 2013/0294089 A1 | 11/2013 | Freedman et al. |
| 2013/0300840 A1 | 11/2013 | Borowski |
| 2013/0325241 A1 | 12/2013 | Lombrozo et al. |
| 2014/0111812 A1 | 4/2014 | Baeg et al. |
| 2014/0118335 A1 | 5/2014 | Gurman |
| 2014/0118493 A1 | 5/2014 | Sali et al. |
| 2014/0153001 A1 | 6/2014 | Chayat et al. |
| 2014/0158900 A1 | 6/2014 | Yoon |
| 2014/0168631 A1 | 6/2014 | Haslim et al. |
| 2014/0176933 A1 | 6/2014 | Haslim et al. |
| 2014/0211194 A1 | 7/2014 | Pacala et al. |
| 2014/0224792 A1 | 8/2014 | Beneke |
| 2014/0269796 A1 | 9/2014 | Geske |
| 2014/0285628 A1 | 9/2014 | Shpunt et al. |
| 2014/0291491 A1 | 10/2014 | Shpunt et al. |
| 2014/0293263 A1 | 10/2014 | Justice et al. |
| 2014/0313519 A1 | 10/2014 | Shpunt et al. |
| 2014/0320843 A1 | 10/2014 | Streuber et al. |
| 2014/0375977 A1 | 12/2014 | Ludwig et al. |
| 2014/0376092 A1 | 12/2014 | Mor |
| 2015/0002636 A1 | 1/2015 | Brown et al. |
| 2015/0055117 A1 | 2/2015 | Pennecot et al. |
| 2015/0131080 A1 | 5/2015 | Retterath et al. |
| 2015/0184999 A1 | 7/2015 | Stettner |
| 2015/0192677 A1 | 7/2015 | Yu et al. |
| 2015/0260830 A1 | 9/2015 | Ghosh et al. |
| 2015/0292948 A1 | 10/2015 | Goldring et al. |
| 2015/0293224 A1 | 10/2015 | Eldada et al. |
| 2015/0316473 A1 | 11/2015 | Kester et al. |
| 2015/0355470 A1 | 12/2015 | Herschbach |
| 2015/0358601 A1 | 12/2015 | Oggier |
| 2015/0378241 A1 | 12/2015 | Eldada |
| 2015/0379371 A1 | 12/2015 | Yoon et al. |
| 2016/0003946 A1 | 1/2016 | Gilliland et al. |
| 2016/0047895 A1 | 2/2016 | Dussan |
| 2016/0047896 A1 | 2/2016 | Dussan |
| 2016/0047897 A1 | 2/2016 | Dussan |
| 2016/0047898 A1 | 2/2016 | Dussan |
| 2016/0047899 A1 | 2/2016 | Dussan |
| 2016/0047900 A1 | 2/2016 | Dussan |
| 2016/0047901 A1 | 2/2016 | Pacala et al. |
| 2016/0047903 A1 | 2/2016 | Dussan |
| 2016/0049765 A1 | 2/2016 | Eldada |
| 2016/0097858 A1 | 4/2016 | Mundhenk et al. |
| 2016/0150963 A1 | 6/2016 | Roukes et al. |
| 2016/0161600 A1 | 6/2016 | Eldada et al. |
| 2016/0218727 A1 | 7/2016 | Maki |
| 2016/0254312 A1 | 9/2016 | Lee et al. |
| 2016/0265902 A1 | 9/2016 | Nawasra et al. |
| 2016/0274221 A1 | 9/2016 | Wu et al. |
| 2016/0282453 A1 | 9/2016 | Pennecot et al. |
| 2016/0282468 A1 | 9/2016 | Gruver et al. |
| 2016/0291134 A1 | 10/2016 | Droz et al. |
| 2016/0306032 A1 | 10/2016 | Schwarz et al. |
| 2016/0327779 A1 | 11/2016 | Hillman |
| 2016/0328619 A1 | 11/2016 | Yi et al. |
| 2017/0078026 A1 | 3/2017 | Brilman et al. |
| 2017/0146640 A1 | 5/2017 | Hall et al. |
| 2017/0219426 A1 | 8/2017 | Pacala et al. |
| 2017/0219695 A1 | 8/2017 | Hall et al. |
| 2017/0269197 A1 | 9/2017 | Hall et al. |
| 2017/0269198 A1 | 9/2017 | Hall et al. |
| 2017/0269209 A1 | 9/2017 | Hall et al. |
| 2017/0269215 A1 | 9/2017 | Hall et al. |
| 2017/0289524 A1 | 10/2017 | Pacala et al. |
| 2017/0350983 A1 | 12/2017 | Hall et al. |
| 2018/0003823 A1 | 1/2018 | Yan |
| 2018/0059222 A1 | 3/2018 | Pacala |
| 2018/0106900 A1 | 4/2018 | Droz et al. |
| 2018/0109061 A1 | 4/2018 | Pardhan et al. |
| 2018/0118041 A1 | 5/2018 | Lenius et al. |
| 2018/0123412 A1 | 5/2018 | Karplus et al. |
| 2018/0136321 A1 | 5/2018 | Verghese et al. |
| 2018/0152691 A1 | 5/2018 | Pacala |
| 2018/0180720 A1 | 6/2018 | Pei et al. |
| 2018/0191967 A1* | 7/2018 | Kester .................. G01J 5/089 |
| 2018/0209841 A1 | 7/2018 | Pacala |
| 2018/0217236 A1 | 8/2018 | Pacala |
| 2018/0267148 A1 | 9/2018 | Buettner et al. |
| 2018/0284228 A1 | 10/2018 | LaChapelle |
| 2018/0286909 A1 | 10/2018 | Eichenholz et al. |
| 2018/0299554 A1 | 10/2018 | van Dyck |
| 2019/0041498 A1 | 2/2019 | Droz et al. |
| 2020/0060550 A1 | 2/2020 | Pesach et al. |

FOREIGN PATENT DOCUMENTS

| | | |
|---|---|---|
| CN | 102640037 | 8/2012 |
| DE | 102015217908 | 3/2017 |
| EP | 1193539 | 4/2002 |
| EP | 2110699 | 10/2009 |
| EP | 2124069 A1 | 11/2009 |
| EP | 3002548 | 4/2016 |
| EP | 3045935 A1 | 7/2016 |
| EP | 3002548 A1 | 9/2016 |
| EP | 3316000 A1 | 5/2018 |
| JP | H3-6407 | 1/1991 |
| JP | 07-049417 A | 2/2007 |
| KR | 20130111130 | 10/2013 |
| WO | 2015025497 | 2/2015 |
| WO | 2015052616 A1 | 4/2015 |
| WO | 2016116733 A1 | 7/2016 |
| WO | 2016125165 A1 | 8/2016 |
| WO | 2017132704 A1 | 8/2017 |
| WO | 2018065426 A1 | 4/2018 |
| WO | 2018065427 A1 | 4/2018 |
| WO | 2018065428 A3 | 4/2018 |
| WO | 2018065429 A1 | 4/2018 |
| WO | 2018122415 A1 | 7/2018 |
| WO | 2018197441 A1 | 11/2018 |

OTHER PUBLICATIONS

PCTUS2017039306 "International Search Report and Written Opinion" dated Nov. 7, 2017 21 pages.

PCTUS2017039306 "Invitation to Pay Add'l Fees and Partial Search Report" dated Aug. 31, 2017 2 pages.

PCTUS2017/048379 "International Search Report and Written Opinion" dated Nov. 2, 2017, 15 pages.

Velodyne Lidar, Inc., HDL-32E Data Sheet 2010, 2017.

Velodyne Lidar, Inc., HDL-32E, User's Manual 2010.; Aug. 2016.

Velodyne Lidar, Inc., HDL-32E, HDL-32E, webpage: http://www.velodynelidar.com/hdl-32e.html; retrieved Dec. 6, 2017.

Velodyne Lidar, Inc., HDL-64E Data Sheet, 2017.

(56) References Cited

OTHER PUBLICATIONS

Velodyne Lidar, Inc., HDL-64E S2 and S2.1; User's Manual and Programming Guide 2007; Firmware version 4; 2007, revision Nov. 2012.
Velodyne Lidar, Inc., Hdl-64E, S3; User's Manual and Programming Guide revision J; 2007.; Dec. 2017.
Velodyne Lidar, Inc., HDL-64E; webpage: http://www.velodynelidar.com/hdl-64e.html; retrieved Dec. 6, 2017.
Velodyne Lidar, Inc., VLP-16 data sheet, Puck, Real Time 3D Lidar Sensor, 2014.
Velodyne Lidar Inc., Velodyne Lidar Puck; User's Manual and Programming Guide; 2014.
Velodyne Lidar, Inc., VLP-16; retrieved via website: http://www.velodynelidar.com/vlp-16.html; Dec. 6, 2017.
Velodyne, Lidar, Inc.; Puck Hi-Res Data Sheet; Sep. 2016.
Velodyne Lidar, Inc.; Puck Hi-Res User Manual; Sep. 2016.
Velodyne Lidar, Inc.; Puck Hi-Res retrieved via website: htip://www.velodynelidar.com/vlp-16-hi-res.html; Dec. 13, 2017.
Velodyne Lidar, Inc.; Puck Lite Data Sheet; Feb. 2016.
Velodyne Lidar, Inc.; Puck Lite User Manual; Feb. 2016.
Velodyne Lidar, Inc.; Puck Lite, Our Lightest Sensor Ever, Apr. 2016; retrieved via website: http://www.velodynelidar.com/vlp-16-lite.html; Dec. 13, 2017.
Velodyne Lidar, Inc.,; Ultra Puck VLP-32C; Nov. 2017; retrieved via website: http://www.velodynelidar.com/vlp-32c.html; Dec. 13, 2017.
Bronzi, Danilo, "100 000 Frames/s 64×32 Single Photon Detector Array for 2-D Imaging and 3-D Ranging", IEEE Journal of Selected Topic in Quantum Electronics, vol. 20, No. 6, Nov./Dec. 2014; 10 pages.
Quanergy Systems EX, 1005, Review of Scientific Instruments; vol. 72, No. 4, Apr. 2001, 13 pages.
Itzler, Mark A. "Geiger-mode avalance photodiode focal plane arrays for three-dimensional imaging LADAR"; Princeton Llghtwave, Inc., Proc of SPIE vol. 7808 780890C-, 14 pages.
Cova, Sergio D.; Single-Photon Counting Detectors, IEEE Photonics Journal; vol. 3, No. 2, Apr. 2011, 5 pages.
Guerrieri, Fabrizio, Two-Dimensional SPAD Imaging Camera for Photon Counting, vol. 2, No. 5, Oct. 2010, 17 pages.
Charbon, Edoardo, et al. "SPAD-Based Sensors"; TOF Range-Imaging Cameras, Remondino, F.,; Stoppa D. (Eds.), 2013, V, 240 p. 138 Illus., 85 Illus. In color., Hardcover ISBN 978-3-642-27522-7, 2013.

PCT/US2018/032601 , "International Search Report and Written Opinion", dated Sep. 21, 2018, 16 pages.
PCT/US2018/032601 , "Invitation to Pay Additional Fees and, Where Applicable, Protest Fee", dated Jul. 26, 2018, 2 pages.
AU2018269000 , "First Examination Report", dated Jun. 22, 2020, 5 pages.
U.S. Appl. No. 15/979,235 , "Non-Final Office Action", dated Jul. 23, 2018, 5 pages.
U.S. Appl. No. 15/979,235 , "Notice of Allowance", dated Dec. 19, 2018, 5 pages.
U.S. Appl. No. 16/245,909 , "Non-Final Office Action", dated Sep. 18, 2019, 6 pages.
U.S. Appl. No. 16/245,909 , "Notice of Allowance", dated Jan. 14, 2020, 5 pages.
SG11201910605R , "Written Opinion", dated May 16, 2020, 6 pages.
U.S. Appl. No. 15/979,295 , "Non-Final Office Action", dated Aug. 4, 2020, 15 pages.
CN202010078057.9, "Office Action", dated Nov. 9, 2020, 9 pages.
EP18802192.7 , "Extended European Search Report", dated Nov. 12, 2020, 11 pages.
IN201947048756 , "First Examination Report", dated Dec. 2, 2020, 6 pages.
U.S. Appl. No. 15/979,277 , "Non-Final Office Action", dated Jan. 12, 2021,8 pages.
U.S. Appl. No. 16/028,178 , "Corrected Notice of Allowability", dated Apr. 7, 2021, 2 pages.
Application No. SG11201913642V , Written Opinion, dated Apr. 7, 2021, 9 pages.
U.S. Appl. No. 15/979,277 , Final Office Action, dated Mar. 30, 2021, 7 pages.
U.S. Appl. No. 15/979,266 , "Non-Final Office Action", dated Feb. 22, 2021, 16 pages.
U.S. Appl. No. 15/979,295 , "Notice of Allowance", dated Jan. 27, 2021, 5 pages.
U.S. Appl. No. 15/979,266 , Notice of Allowance, dated Jun. 15, 2021, 11 pages.
U.S. Appl. No. 15/979,266 , "Supplemental Notice of Allowability", dated Jul. 12, 2021, 3 pages.
U.S. Appl. No. 15/979,277 , Notice of Allowance, dated May 24, 2021, 7 pages.

* cited by examiner

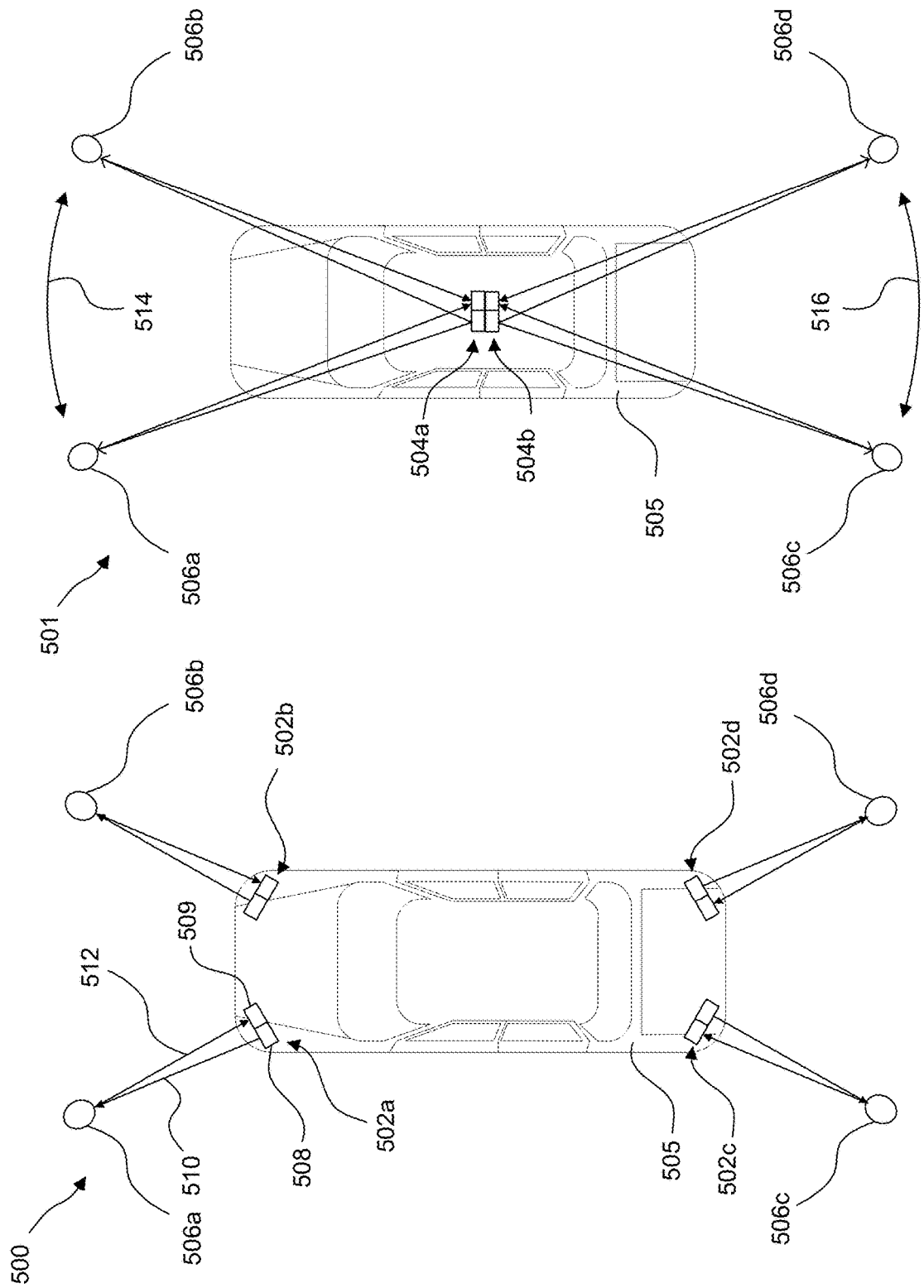

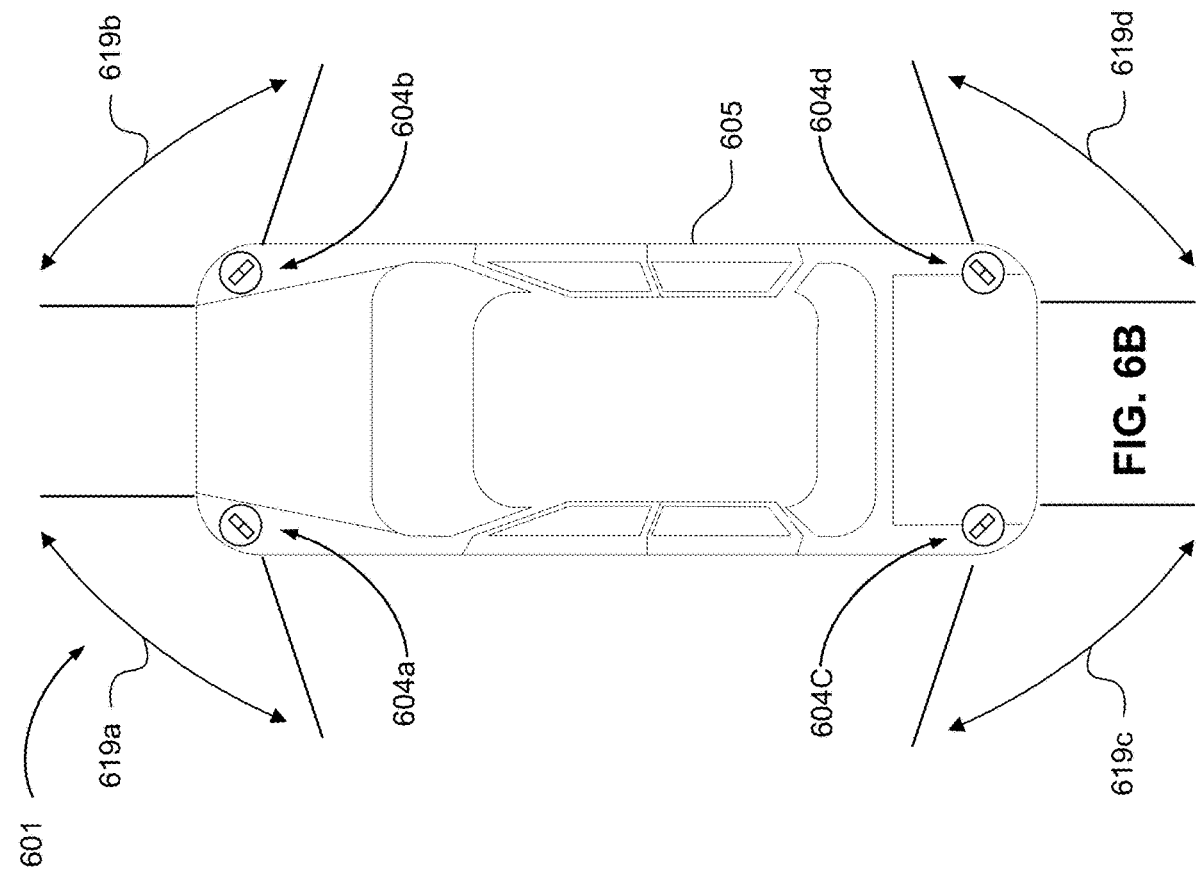
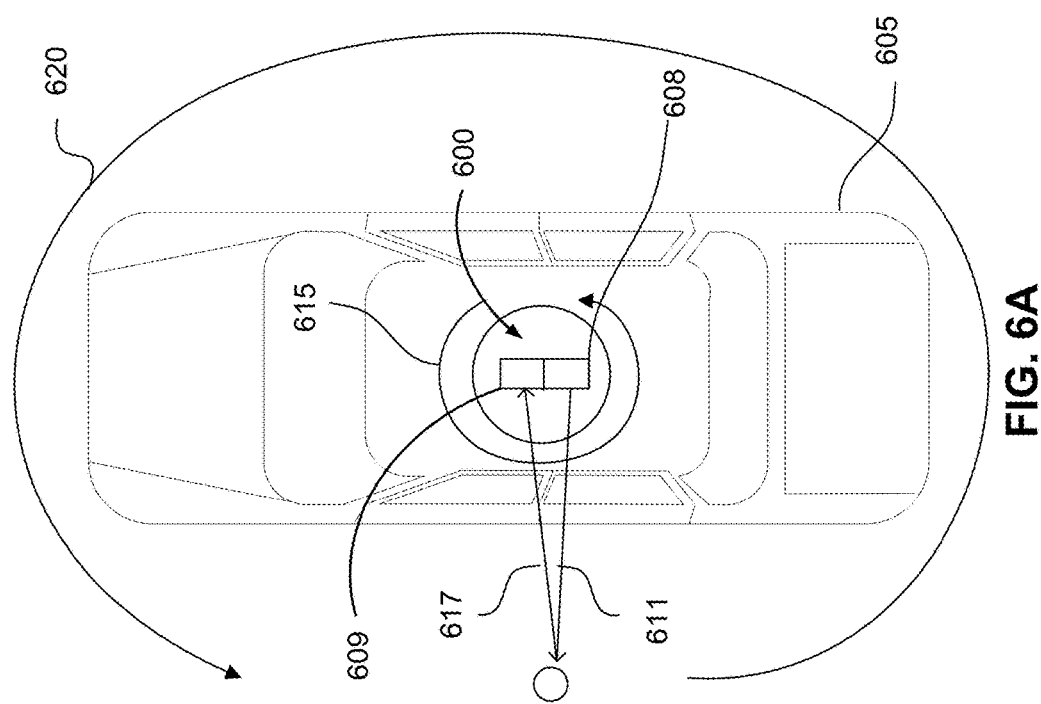
FIG. 6B
FIG. 6A

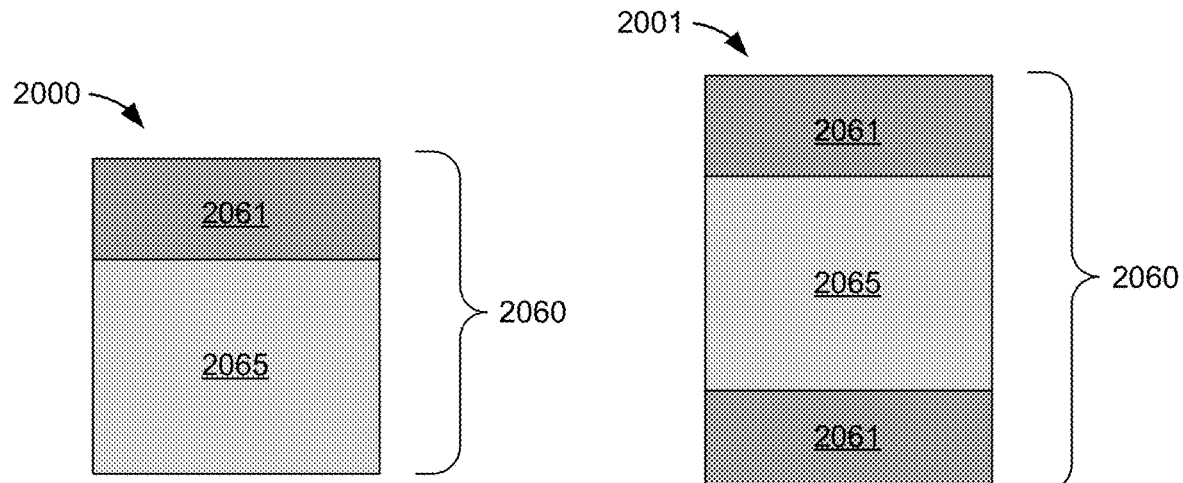
FIG. 20A  FIG. 20B
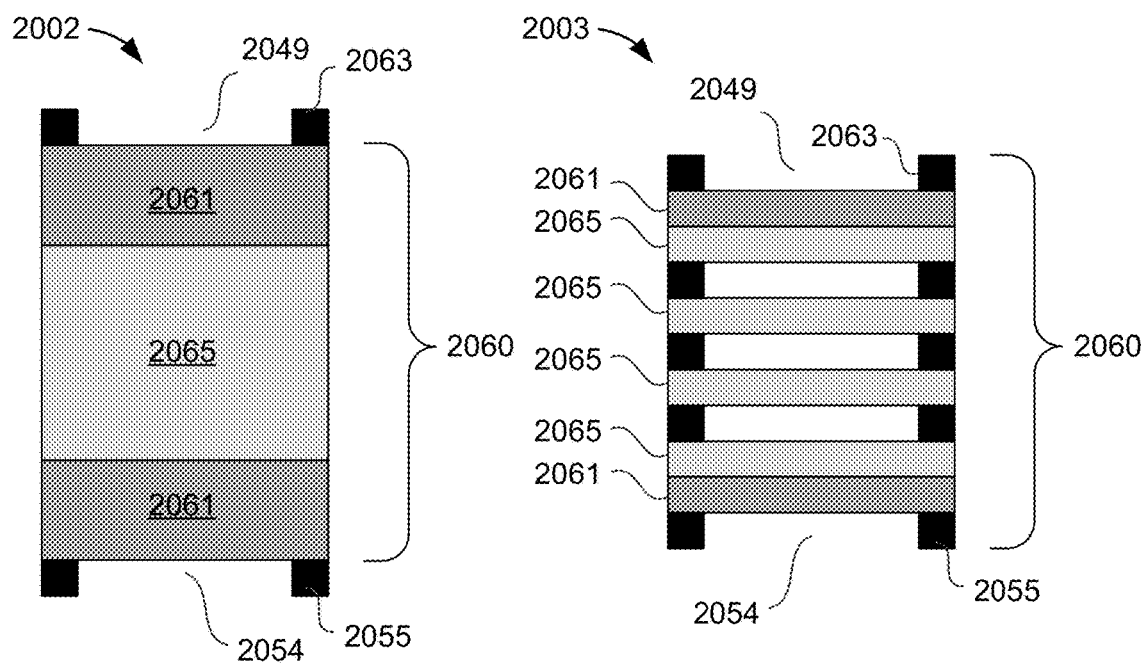
FIG. 20C  FIG. 20D

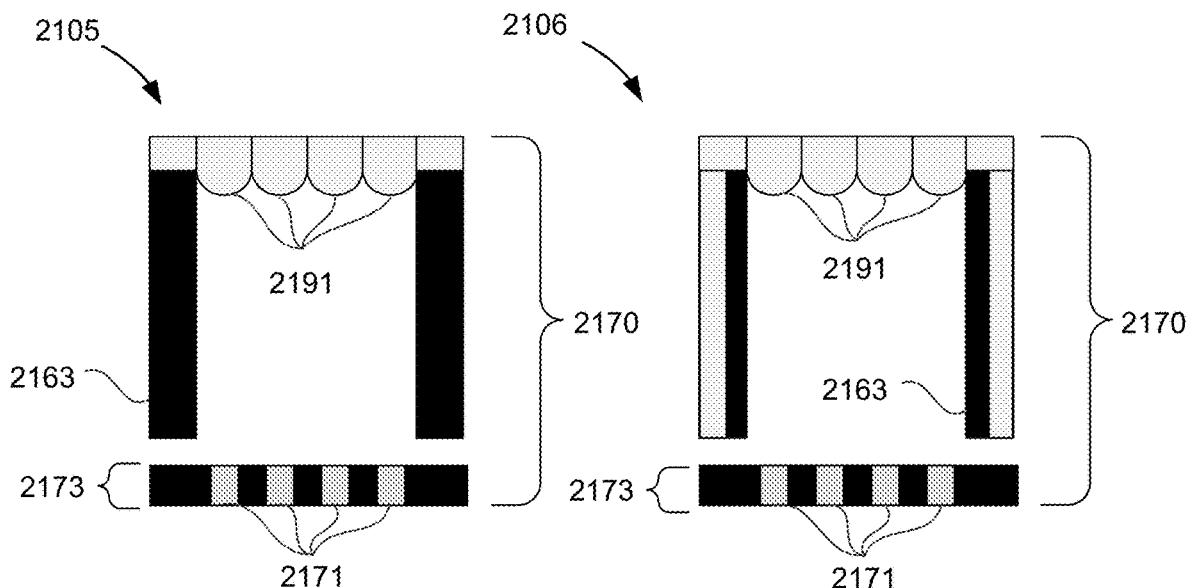
FIG. 21F  FIG. 21G
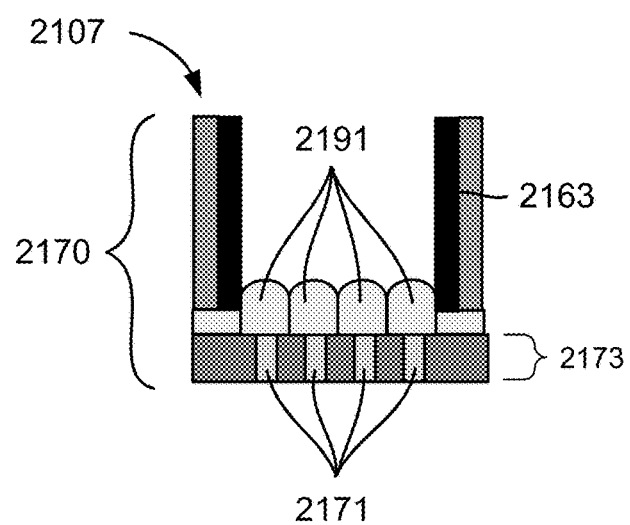
FIG. 21H

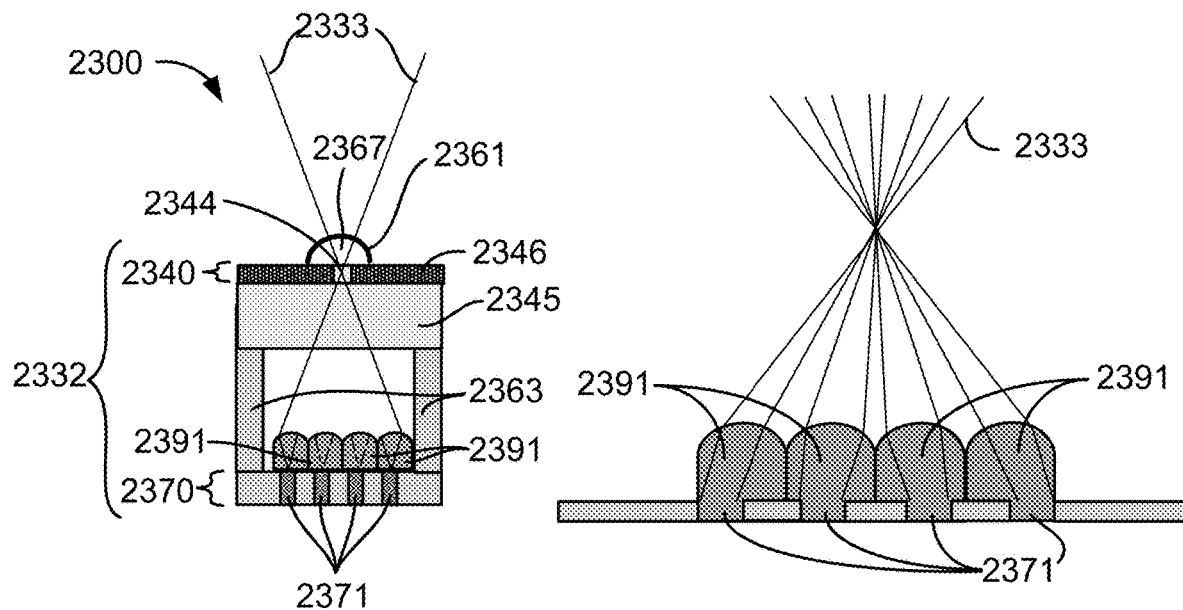
FIG. 23A  FIG. 23B
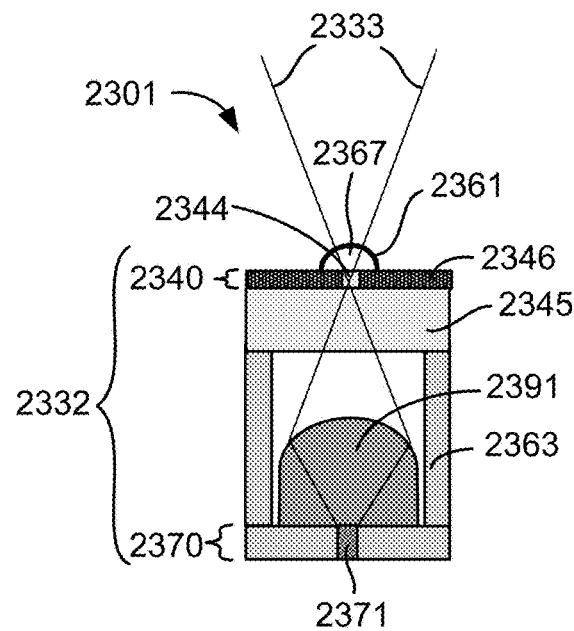
FIG. 23C

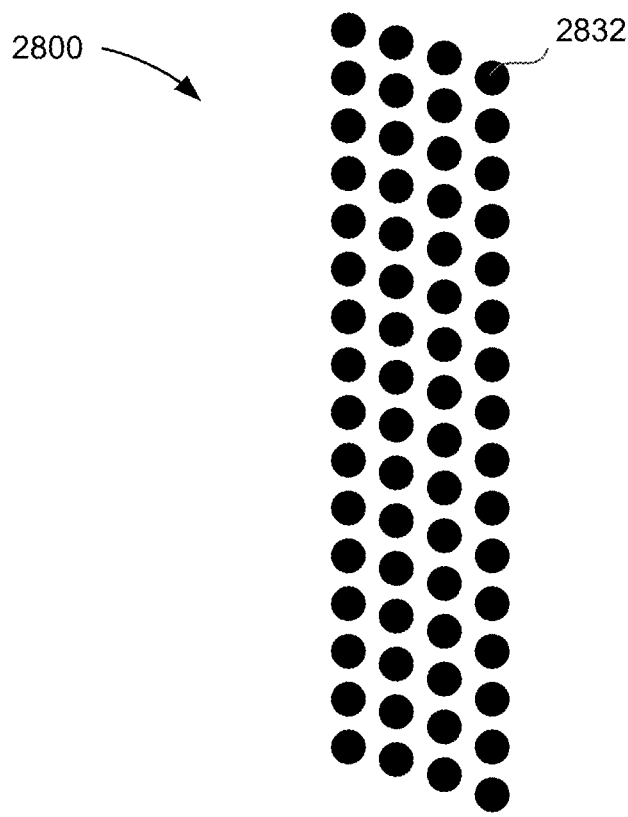
FIG. 28
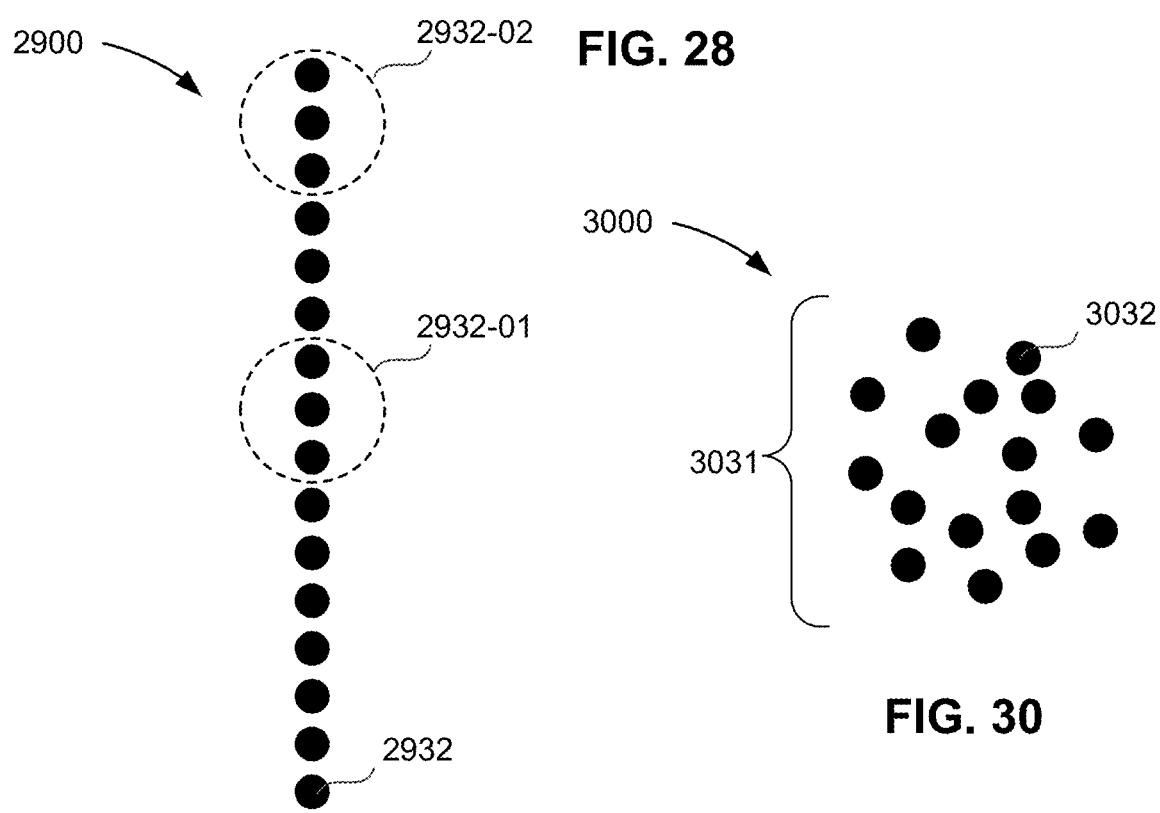
FIG. 29
FIG. 30

MICRO-OPTICS FOR OPTICAL IMAGER WITH NON-UNIFORM FILTER

CROSS REFERENCES TO RELATED APPLICATIONS

This application claims priority to U.S. Provisional Patent Application No. 62/506,449, filed on May 15, 2017, U.S. Provisional Patent Application No. 62/506,437, filed on May 15, 2017, U.S. Provisional Patent Application No. 62/506,445, filed on May 15, 2017, and U.S. Provisional Patent Application No. 62/515,291, filed Jun. 5, 2017, the disclosures of which are herein incorporated by reference in their entirety and for all purposes.

BACKGROUND

An imager detects light and creates a digital image of a scene based on that detected light. The image contains a fixed number of rows and columns of pixels where each pixel maps to a different field-of-view within the scene. Electronic imagers typically make use of photodetectors to convert light into electrical signals. Each photodetector is located at a different position on the focal plane and usually corresponds to a single pixel or a component of a pixel in the image. Electronic imagers can typically be classified as one of two types: a passive-illumination imager or an active-illumination imager. A passive-illumination imager collects ambient light such as sunlight reflected by objects in a scene, whereas an active-illumination imager illuminates the scene and collects reflected light generated by the active-illumination imager system itself.

A narrowband imager collects light within a limited wavelength range. This is in contrast to a traditional camera which detects light across the entire visible spectrum or into three different wide, RGB color bands, each of which may be 100 nm or wider. Narrowband imagers are harder to develop than traditional cameras due to the characteristics of the optical filters on which they rely. Optical filters serve to prevent some portion of the electromagnetic spectrum from reaching the photodetectors. Most narrowband filters rely on thin-film interference effects to selectively transmit or reflect light (such filters are often referred to as dielectric mirrors or Bragg mirrors). The spectral transmissivity of the narrowband filter depends on the number, thicknesses, ordering, and indices of refraction of the constituent layers forming the filter. The spectral transmissivity of the filter also depends upon the angle of incidence of the light upon the narrowband filter.

Current narrowband imagers have either a small field-of-view or are limited in their ability to filter wavelength bands narrower than around 50 nm. Optical filters are sensitive to the angle of incident light making it difficult to achieve a narrow range of wavelengths. For example, an optical filter may accept perpendicular light with wavelength at 940-945 nm and slightly oblique light at a wavelength of 930-935 nm. Since most photodetectors in a traditional camera have a large range of angles of light incident upon them, simply placing an optical filter in front of them would not actually achieve narrowband filtering. Constricting the angle of light incident upon the photodetector usually requires using a lens with a longer focal length, which constricts the field-of-view of the camera.

Imagers with a wide field-of-view have difficulty in generating uniformly clear visual images and in making uniform measurements across a scene. For example, the pixels at the center of the image may appear brighter or represent a different wavelength of light compared to the pixels at the scene extremities. A wide field-of-view is desirable for some applications because it provides better situational awareness. For example, a camera-based automotive safety system meant to detect pedestrians around a vehicle might require monitoring in a 360 degree field-of-view around the vehicle. Fewer wide field-of-view sensors are required to do the same job (i.e., generate images of the full 360 degree field-of-view) as many narrow field of view sensors, thereby decreasing the system cost.

Narrowband imagers have many applications including geographic mapping, astronomy and in LIDAR (Light Detection and Ranging). Narrowband imagers can detect characteristic light wavelengths such as those generated by plants with chlorophyll or by elements within stars. Narrowband imagers can be used, for example, to determine vegetation health or to discover oil deposits. Optical receiver systems, such as LIDAR, can be used for object detection and ranging. LIDAR systems measure the distance to a target or objects in a landscape, by irradiating a target or landscape with light, using pulses from a laser, and measuring the time it takes photons to travel to the target or landscape and return after reflection to a narrowband imager. Other LIDAR techniques, such as photo-demodulation, coherent LIDAR, and range-gated LIDAR, also rely on the transmission and reflection of photons, though they may not directly measure the time-of-flight of pulses of laser light. For many LIDAR applications, it is beneficial for physical sizes of transmitters and receivers to small and compact, and at the same time relatively low in cost. For applications where objects must be sensed with accuracy at long distances, it is beneficial to increase or maximize the number of photons emitted by the transmitter and reflected back toward the receiver while keeping laser energy emissions within mandated safety limits.

Micro-optical systems are systems that include miniaturized, optical components that are typically between a few micrometers and a millimeter in size. Micro-optical receivers arrayed adjacent to each other are susceptible to crosstalk. Stray light caused by roughness of optical surfaces, imperfections in transparent media, back reflections, etc., may be generated at various features within the receiver channel or external to receiver channel. When multiple receiver channels are arrayed adjacent to one another, this stray light in one receiver channel may be absorbed by a photosensor in another channel, thereby contaminating the timing, phase, or other information inherent to photons. Minimizing crosstalk is especially important in active-illumination systems. Light reflected from a nearby retro-reflector (e.g. a license plate) may be thousands or millions of time more intense than light reflected from a distant, dark, lambertian surface (e.g. black cotton clothing). Thus, the stray light photons from a retro-reflector could vastly outnumber photons reflected from other surfaces in nearby photosensors if crosstalk is not minimized. This can result in the inability of a LIDAR system to detect dark objects that occupy fields of view near the field of view occupied by a retro-reflector.

SUMMARY

Embodiments of the disclosure provide optical imager systems that achieve wide field-of-view, narrowband imaging with micro-optic receiver channel arrays that minimize crosstalk and allow tight spectral selectivity that is uniform across the receiver channel array. Some optical imager systems according to the disclosure can include a light transmission module that provides enhanced spot illumination such that a power level of light returning to a light sensing module is increased, while at the same time improving the spatial resolution of the measured image.

In some embodiments, an optical system for performing distance measurements includes a bulk transmitter optic, an illumination source, and a micro-optic channel array disposed between the illumination source and the bulk transmitter optic. The illumination source includes a plurality of light emitters aligned to project discrete beams of light through the bulk transmitter optic into a field ahead of the optical system. The micro-optic channel array defines a plurality of micro-optic channels where each micro-optic channel includes a micro-optic lens spaced apart from a light emitter from the plurality of light emitters with the micro-optic lens being configured to receive a light cone from the light emitter and generate a reduced-size spot image of the emitter at a focal point displaced from the emitter at a location between the emitter and the bulk transmitter optic. The micro-optic lens for each channel can be configured to receive a light cone from a light emitter and generate a reduced-size real spot image of the emitter at a focal point between the micro-optic lens and the bulk transmitter optic. A divergence of the light cone from the light emitter can be less than a divergence of a light cone from the second optical surface of the micro-optic lens for generating the reduced-size real spot image In some additional embodiments, an optical system for performing distance measurements includes a light emission system and a light detection system. The light emission system includes a bulk transmitter optic, an illumination source comprising a plurality of light emitters aligned to project discrete beams of light through the bulk transmitter optic into a field ahead of the optical system, and a micro-optic channel array disposed between the illumination source and the bulk transmitter optic. The micro-optic channel array defines a plurality of micro-optic channels where each micro-optic channel includes a micro-optic lens spaced apart from a light emitter from the plurality of light emitters with the micro-optic lens being configured to receive a light cone from the light emitter and generate a reduced-size spot image of the emitter at a focal point displaced from the emitter at a location between the emitter and the bulk transmitter optic. The light detection system includes a bulk receiver optic configured to receive the discrete beams of light from the field, and an optical assembly having a plurality of micro-optic receiver channels defining a plurality of discrete, non-overlapping fields of view in the field. The optical assembly includes: an aperture layer having a plurality of discrete apertures arranged along a focal plane of the bulk receiver optic; an array of photosensors disposed behind the aperture layer; and a plurality of lenses positioned between the aperture layer and the array of photosensors.

In certain embodiments, an optical system for performing distance measurements includes a stationary housing having an optically transparent window, and a light ranging device disposed within the housing. The light ranging device includes an optical transmitter coupled to a platform. The optical transmitter includes a bulk transmitter optic, an illumination source, and a micro-optic channel array disposed between the illumination source and the bulk transmitter optic. The illumination source including a plurality of light emitters aligned to project discrete beams of light through the bulk transmitter optic into a field ahead of the optical system. The micro-optic channel array can be disposed between the illumination source and the bulk transmitter optic, and the micro-optic channel array can define a plurality of micro-optic channels where each micro-optic channel can include a micro-optic lens spaced apart from a light emitter from the plurality of light emitters with the micro-optic lens being configured to receive a light cone from the light emitter and generate a reduced-size spot image of the emitter at a focal point displaced from the emitter at a location between the emitter and the bulk transmitter optic.

In some embodiments, an optical system includes a bulk receiver optic configured to receive light rays originating from a field external to the optical system, and an optical assembly having a plurality of micro-optic receiver channels defining a plurality of discrete, non-overlapping fields of view in the field. The optical assembly includes an aperture layer having a plurality of discrete apertures arranged along a focal plane of the bulk receiver optic, an array of photosensors disposed behind the aperture layer, and a non-uniform optical filter layer configured to allow different micro-optic channels to measure different ranges of wavelengths. The non-uniform optical filter can include a graduated optical filter that gradually increases in thickness in one dimension, or increases in thickness in a step-wise fashion in one direction such that each channel has a constant optical filter layer thickness, but where the thicknesses for different micro-optic channels are different.

In some additional embodiments, an optical system includes a bulk receiver optic configured to receive light from a field external to the optical system, an aperture layer disposed behind the bulk optic and including a plurality of apertures located at a focal plane of the bulk optic, a lens layer including a plurality of collimating lenses having a focal length, the lens layer disposed behind the aperture layer and separated from the aperture layer by the focal length, a non-uniform optical filter layer behind the lens layer, and a photosensor layer including a plurality of photosensors. The aperture layer, lens layer, non-uniform optical filter layer and photosensor layer are arranged to form a plurality of micro-optic channels defining a plurality of discrete, non-overlapping fields of view in the field with each micro-optic channel in the plurality of micro-optic channels including an aperture from the plurality of apertures, a lens from the plurality of lenses, a filter from the filter layer, and a photosensor from the plurality of photosensors and being configured to communicate light incident from the bulk receiver optic to the photosensor of the micro-optic channel. The non-uniform optical filter layer is configured to allow different micro-optic channels to measure different ranges of wavelengths.

In certain embodiments, an optical system includes a bulk receiver optic configured to receive light rays originating from a field external to the optical system, and an optical assembly having a plurality of micro-optic receiver channels defining a plurality of discrete, non-overlapping fields of view in the field. The optical assembly includes a monolithic ASIC including a processor, a memory, and a plurality of photosensors fabricated in the ASIC, an aperture layer having a plurality of discrete apertures arranged along a focal plane of the bulk receiver optic, the array of photosensors disposed behind the aperture layer; a plurality of lenses positioned between the aperture layer and the array of photosensors; and a non-uniform optical filter layer having different center wavelengths across its structure to allow at least two different micro-optic receiver channels to measure different ranges of wavelengths of light, wherein the aperture layer, plurality of lenses, and non-uniform optical filter layer are formed on the ASIC such that they form part of the monolithic structure of the ASIC.

In some embodiments, an optical system for performing distance measurements includes a stationary housing having an optically transparent window, a spinning light ranging device disposed within the housing, a motor disposed within the housing and operatively coupled to spin the light ranging device including the platform, optical transmitter, and optical receiver within the housing, and a system controller disposed within the housing, the system controller configured to control the motor and to start and stop light detection operations of the light ranging device. The light ranging device includes a platform, an optical transmitter coupled to the platform, and an optical receiver coupled to the platform. The optical transmitter includes a bulk transmitter optic and a plurality of transmitter channels, each transmitter channel including a light emitter configured to generate and transmit a narrowband light through the bulk transmitter optic into a field external to the optical system. The optical receiver includes a bulk receiver optic and a plurality of micro-optic receiver channels, each micro-optic channel including an aperture coincident with a focal plane of the bulk receiver optic, an optical filter positioned along a path of light from the bulk receiver optic and axially aligned with the aperture, and a photosensor responsive to incident photons passed through the aperture and the optical filter.

In some additional embodiments, an optical system for performing distance measurements includes a stationary housing having a base, a top and an optically transparent window disposed between the base and the top, a spinning light ranging device disposed within the housing and aligned with the optically transparent window, a motor disposed within the housing and operatively coupled to spin the light ranging device including the platform, optical transmitter and optical receiver within the housing, and a system controller disposed within the housing, the system controller configured to control the motor and to start and stop light detection operations of the light ranging device. The light ranging device including a platform, an optical transmitter coupled to the platform, and an optical receiver coupled to the platform. The optical transmitter including an image-space telecentric bulk transmitter optic and a plurality of transmitter channels, each channel including a light emitter configured to generate and transmit a narrowband light through the bulk transmitter optic into a field external to the optical system. The optical receiver including an image-space telecentric bulk receiver optic and a plurality of micro-optic receiver channels, each micro-optic channel including an aperture coincident with a focal plane of the bulk receiver optic, a collimating lens behind the aperture, an optical filter behind the collimating lens and a photosensor responsive to incident photons passed through the aperture into the collimating lens and through the filter.

In certain embodiments, an optical system for performing distance measurements includes a stationary housing having a base, a top and an optically transparent window disposed between the base and the top, a light ranging device disposed within the housing and aligned with the optically transparent window, a motor disposed within the housing and operatively coupled to spin the light ranging device within the housing; and a system controller disposed within the housing, the system controller configured to control the motor and to start and stop light detection operations of the light ranging device. The light ranging device includes a platform, a plurality of vertical-cavity surface emitting lasers (VCSELs) arranged in an array, and an optical receiver coupled to the platform. Each VCSEL in the plurality of VCSELs are configured to generate and transmit discrete pulses of light into a field external to the optical system. The optical receiver including a bulk receiver optic, a plurality of photosensors, each photosensor comprising a plurality of single-photon avalanche diodes (SPADs) responsive to incident photons, and an optical filter disposed between the bulk receiver optic and the plurality of photosensors and configured to allow a band of light to pass through the filter to the plurality of photosensors while blocking light outside the band from reaching the plurality of photosensors.

In some embodiments, an optical system for performing distance measurements includes a rotatable platform, an optical transmitter coupled to the rotatable platform and comprising a bulk transmitter optic and a plurality of transmitter channels, an optical receiver coupled to the rotatable platform and comprising a bulk receiver optic and a plurality of micro-optic receiver channels, a motor disposed within the housing and operatively coupled to spin the platform, optical transmitter, and optical receiver, a system controller mounted to a stationary component of the optical system; and an optical communication link operatively coupled between the system controller and the optical receiver to enable the system controller to communicate with the optical receiver. Each transmitter channel includes a light emitter configured to generate and transmit a narrowband light through the bulk transmitter optic into a field external to the optical system. Each micro-optic channel includes an aperture coincident with a focal plane of the bulk receiver optic, an optical filter positioned along a path of light from the bulk receiver optic and axially aligned with the aperture, and a photosensor responsive to incident photons passed through the aperture and through the filter. The optical communication link can extend between the stationary component of the optical system and the rotatable platform to operatively couple the system controller with the optical receiver. The optical receiver can further include a collimating lens behind the aperture and directly coupled to the optical filter, the optical filter positioned behind the collimating lens.

In some additional embodiments, an optical system for performing distance measurements including a rotatable platform, an optical transmitter coupled to the rotatable platform and comprising an image-space telecentric bulk transmitter optic and a plurality of transmitter channels, an optical receiver coupled to the rotatable platform and comprising an image-space telecentric bulk receiver optic and a plurality of micro-optic receiver channels, a motor disposed within the housing and operatively coupled to spin the platform, optical transmitter and optical receiver, a system controller mounted to a stationary component of the optical system, and an optical communication link operatively coupled between the system controller and the optical receiver to enable the system controller to communicate with the optical receiver. Each transmitter channel includes a light emitter configured to generate and transmit a narrowband light through the bulk transmitter optic into a field external to the optical system. Each micro-optic channel includes an aperture coincident with a focal plane of the bulk receiver optic, a collimating lens behind the aperture, an optical filter behind the collimating lens and a photosensor responsive to incident photons passed through the aperture into the collimating lens and through the filter.

In certain embodiments, An optical system for performing distance measurements includes a rotatable platform, a plurality of vertical-cavity surface emitting lasers (VCSELs) arranged in an array and coupled to the rotatable platform, an optical receiver coupled to the rotatable platform, a motor disposed within the housing and operatively coupled to spin the platform, the plurality of VCSELs and the optical receiver; a system controller mounted to a stationary component of the optical system, and an optical communication link operatively coupled between the system controller and the optical receiver to enable the system controller to communicate with the optical receiver. Each VCSEL in the plurality of VCSELs are configured to generate and transmit discrete pulses of light into a field external to the optical system. The optical receiver including a bulk receiver optic and a plurality of photosensors, each photosensor comprising a plurality of single-photon avalanche diodes (SPADs) responsive to incident photons.

In some embodiments, an optical system for performing distance measurements includes a bulk receiver optic, an aperture layer including a plurality of apertures, a first lens layer including a first plurality of lenses, an optical filter layer configured to receive light after it passes through the bulk receiver optic and pass a band of radiation while blocking radiation outside the band, and a photosensor layer including a plurality of photosensors, Each photosensor includes a plurality of photodetectors configured to detect photons, and a second plurality of lenses configured to focus incident photons received at the photosensor on the plurality of photodetectors. The optical system includes a plurality of receiver channels with each receiver channel in the plurality of receiver channels including an aperture from the plurality of apertures, a lens from the plurality of first lenses, an optical filter from the optical filter layer, and a photosensor from the plurality of photosensors, with the aperture for each channel defining a discrete, non-overlapping field of view for its respective channel. For each receiver channel in the plurality of receiver channels, there can be a one-to-one correspondence between the plurality of photodetectors and the second plurality of lenses in the photosensor for that channel, where each of the lenses in the second plurality of lenses can be configured to focus photons on its corresponding lens in the second plurality of lenses In some additional embodiments, an optical system for performing distance measurements includes a light emission system and a light detection system. The light emission system including a bulk transmitter optic and an illumination source. The illumination source including a plurality of light emitters aligned to project discrete beams of light through the bulk transmitter optic into a field ahead of the optical system. The light detection system including a bulk receiver optic, an aperture layer including a plurality of apertures, a first lens layer including a first plurality of lenses, an optical filter layer configured to receive light after it passes through the bulk receiver optic and pass a band of radiation while blocking radiation outside the band, and a photosensor layer including a plurality of photosensors. Each photosensor includes a plurality of photodetectors configured to detect photons, and a second plurality of lenses configured to focus incident photons received at the photosensor on the plurality of photodetectors. The optical system includes a plurality of receiver channels with each receiver channel in the plurality of receiver channels including an aperture from the plurality of apertures, a lens from the plurality of first lenses, an optical filter from the optical filter layer, and a photosensor from the plurality of photosensors, with the aperture for each channel defining a discrete, non-overlapping field of view for its respective channel.

In certain embodiments, an optical system for performing distance measurements including a stationary housing having an optically transparent window, a light ranging device disposed within the housing and aligned with the optically transparent window, a motor disposed within the housing and operatively coupled to spin the light ranging device including the platform, optical transmitter, and optical receiver within the housing, and a system controller disposed within the housing. The system controller configured to control the motor and to start and stop light detection operations of the light ranging device. The light ranging device including a platform, an optical transmitter coupled to the platform, an optical receiver coupled to the platform. The optical transmitter including a bulk transmitter optic and a plurality of transmitter channels, each transmitter channel including a light emitter configured to generate and transmit a narrowband light through the bulk transmitter optic into a field external to the optical system. The optical receiver including a bulk receiver optic, an aperture layer including a plurality of apertures, a first lens layer including a first plurality of lenses, an optical filter layer configured to receive light after it passes through the bulk receiver optic and pass a band of radiation while blocking radiation outside the band, and a photosensor layer including a plurality of photosensors. Each photosensor includes a plurality of photodetectors configured to detect photons, and a second plurality of lenses configured to focus incident photons received at the photosensor on the plurality of photodetectors. The optical system includes a plurality of receiver channels with each receiver channel in the plurality of receiver channels including an aperture from the plurality of apertures, a lens from the plurality of first lenses, an optical filter from the optical filter layer, and a photosensor from the plurality of photosensors, with the aperture for each channel defining a discrete, non-overlapping field of view for its respective channel.

A better understanding of the nature and advantages of embodiments of the present disclosure may be gained with reference to the following detailed description and the accompanying drawings.

BRIEF DESCRIPTION OF THE DRAWINGS

FIGS. 5A-5B are simple illustrations of exemplary implementations of solid state LIDAR systems, according to some embodiments of the present disclosure.

FIG. 6A-6B are simple illustrations of exemplary implementations of scanning LIDAR systems, according to some embodiments of the present disclosure.

FIGS. 20A-20G are simplified cross-sectional view diagrams of various optical filter layers for a receiver channel, according to some embodiments of the present disclosure.

FIGS. 21A-21K are simplified cross-sectional view diagrams of various photosensor layers with diffusers for a receiver channel, according to some embodiments of the present disclosure.

FIGS. 23A-23E are simplified cross-sectional view diagrams of various bottom micro lens layers for a receiver channel, according to some embodiments of the present disclosure.

FIGS. 26-30 are simplified top view diagrams of exemplary micro-optical receiver arrays, according to some embodiments of the present disclosure.

DETAILED DESCRIPTION

Figure 1:
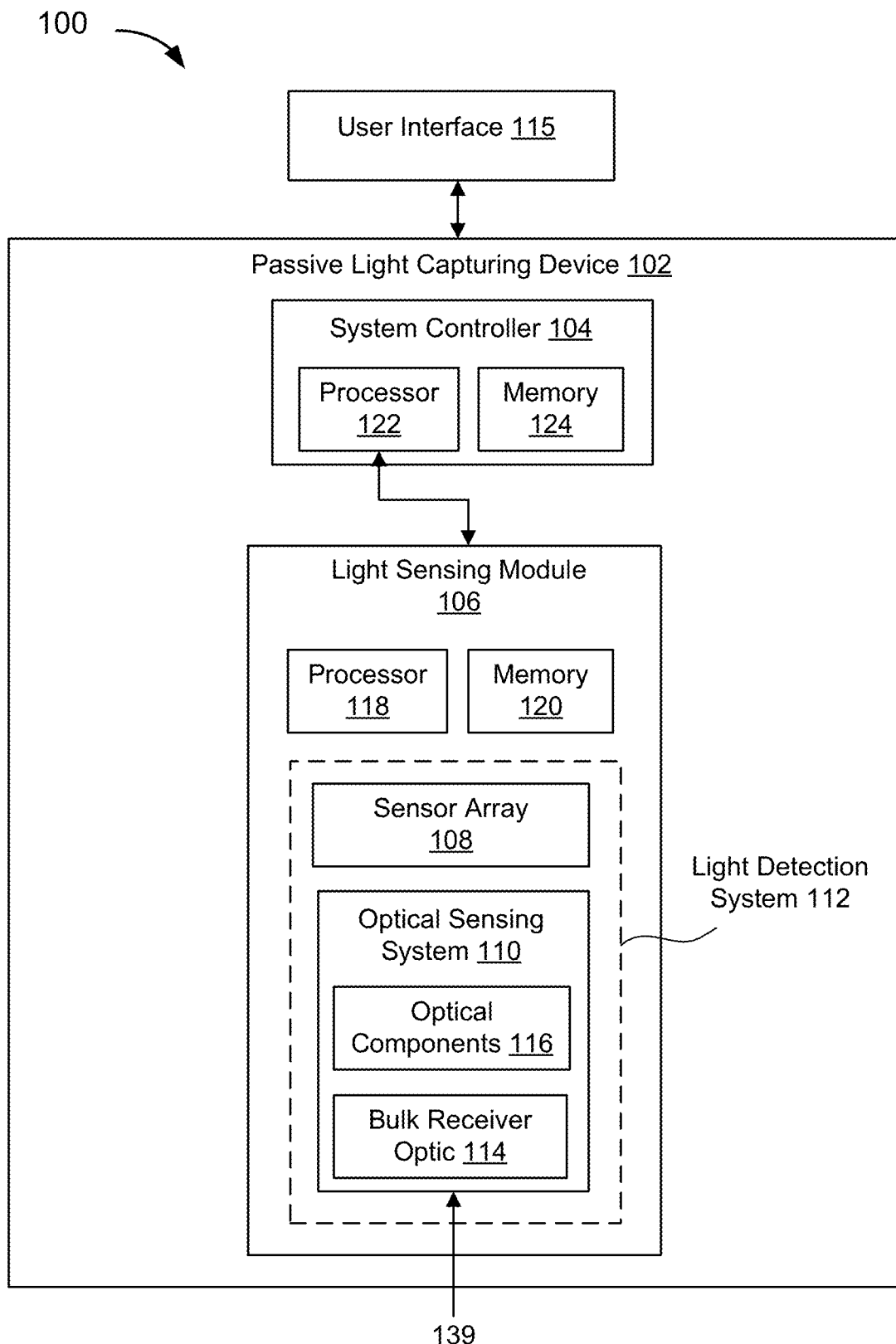
FIG. 1 is a block diagram of an exemplary passive optical imager system, according to some embodiments of the present disclosure.

Some embodiments of the disclosure pertain to optical imager systems that can generate an image from ambient light in a field and/or light emitted from an optical transmitter that has reflected off of an object in the field. For instance, in some embodiments an optical imager system can be a passive system that does not actively illuminate a scene or given area and instead detects ambient light in the scene or area reflected off of one or more objects in the scene or area. A passive optical imager system can include a light sensing module for receiving ambient light in the field. The light sensing module can be a wide field-of-view, narrowband optical imaging system (WFNBI) that collects imaging information. The light sensing module can include one or more bulk receiver optics, a micro-optic receiver system, and a system controller for operating the light sensing module. According to some embodiments of the present disclosure, the micro-optic receiver system can include one or more micro-optic receiver layers and one or more photosensors, each photosensor can include one or more photodetectors that can measured received light.

A bulk imaging optic as defined herein can be one or more optical surfaces, possibly including multiple lens elements, that have clear apertures greater than one millimeter and that is positioned to receive light projected from, or focus received light on, a micro-optic transmitter/receiver layer. A bulk imaging optic that projects light received from an optical emitter, such as a micro-optic transmitter layer, is sometimes referred to herein as a bulk transmitter optic or as an output bulk imaging optic. A bulk optic layer that focuses light received from a field onto an optical detector, such as a micro-optic receiver layer, is sometimes referred to herein as a bulk receiver optic or as an input bulk imaging optic. An input, image-space telecentric bulk imaging optic allows the system to measure narrowband light uniformly over a wide field-of-view (FOV). The micro-optic receiver layer can include a one- or two-dimensional array of micro-optic receiver channels where each micro-optic receiver channel has multiple components including one or more of an aperture, a collimating micro-lens, an optical filter, and a photosensor. In some instances, the micro-optical receiver channel structure has a columnar arrangement with enclosures having absorbent and/or reflective side walls and/or focusing funnels. The micro-optic receiver channel maximizes the collection of incoming rays through its aperture, collimates the light to make it perpendicular to the optical filter, and minimizes crosstalk with adjacent micro-optic receiver channels due to mixing of inputs from neighboring apertures, as will be discussed in detail below. In various instances, bulk imaging optics according to the present disclosure modify light or other radiation for an entire array of emitters or photosensors. Micro-optic structures can be included as part of the array and can modify light differently for different emitters and/or photosensors in the array. In some embodiments, there is one or more micro-optic elements for each individual array element (photosensor and/or emitter).

In some embodiments, the optical imager system can be an active system that can emit light into a field and then detect the emitted light after it has reflected off surfaces of an object in the field. An active optical imager system can include a light transmission module in addition to a light sensing module, and be configured as a light ranging device. The light transmission module can include a transmitter layer that is composed of an array of individual emitters where each emitter can be paired with a corresponding micro-optic receiver channel in the light sensing module, or it can be a uniform illuminator that spreads light evenly across the scene with no specific pairing between individual emitters and receiver channels. In some instances, the light transmission module can include a micro-optic transmitter channel array to enhance light outputted from the array of emitters. During operation, light outputted by the array of emitters (e.g., laser pulses) passes through the micro-optic transmitter channel array and enters a bulk transmitter optic having a large numerical aperture to better capture light from the micro-optic transmitter channel array. The light then exits the bulk transmitter optic and illuminates a plurality of spots at a distant field. The micro-optic transmitter channel array can improve the brightness of beams emanating from the bulk transmitter optic to provide enhanced spot illumination, while at the same time improving the spatial resolution of the measured image, as will be discussed in detail further herein.

According to some embodiments of the present disclosure, the imager system is a wide field-of-view, narrowband optical system. Thus, the imager can capture images and detect light across a FOV of at least 10 degrees. In certain embodiments, the imager can capture images and detect light across a FOV of at least 20, and across a FOV of at least 30 degrees in some embodiments. Furthermore, the imager can detect light at a wavelength of approximately 10 nm or less. In some particular embodiments, the light sensing module can detect light at a wavelength of approximately 5 nm or less. In some embodiments, the imager system can capture detect light at a wavelength of less than 5 nm across a FOV of approximately 32 degrees. The FOV can be in the vertical or horizontal direction, or any other angle in between.

To better understand the function and configuration of passive and active optical imager systems according to embodiments of the disclosure, each will be discussed in detail herein.

I. Passive Optical Imager Systems

A passive optical imager system receives ambient light to generate an image. FIG. 1 is a block diagram of an exemplary passive optical imager system 100, according to some embodiments of the present disclosure. Passive optical imager system 100 includes a passive light capturing device 102 for capturing light existing within a field. Passive light capturing device 102 can include a system controller 104 and a light sensing module 106. Imaging data can be generated by passive light capturing device 102 by receiving light existing in a field in which passive optical imager system 100 is positioned. The received light can be light that exists naturally in the field, i.e., ambient light, as opposed to light emitted from a transmitter within system 100.

Light sensing module 106 can include a sensor array 108, which can be, e.g., a one-dimensional or two-dimensional array of photosensors. Each photosensor (also just called a "sensor" or sometimes referred to by one skilled in the art as a "pixel") can include a collection of photodetectors, e.g., SPADs or the like, or a sensor can be a single photon detector (e.g., an APD). Light sensing module 106 includes an optical sensing system 110, which when taken together with sensor array 108 can form a light detection system 112. In some embodiments, optical sensing system 110 can include a bulk receiver optic 114 and optical components 116, such as an aperture layer, a collimating lens layer and an optical filter, that can be combined with sensor array 108 to form an array of micro-optic receiver channels where each micro-optic receiver channel measures light that corresponds to an image pixel in a distinct field of view of the surrounding field in which system 100 is positioned. Further details of various embodiments of micro-optic receiver channels according to the present disclosure are discussed in detail in conjunction with FIGS. 17-30 below.

In some embodiments, sensor array 108 of light sensing module 106 is fabricated as part of a monolithic device on a single substrate (using, e.g., CMOS technology) that includes both an array of photosensors, a processor 118, and a memory 120 for signal processing the measured light from the individual photosensors (or groups of photosensors) in the array. The monolithic structure including sensor array 108, processor 118, and memory 120 can be fabricated as a dedicated ASIC. In some embodiments, optical components 116 can also be a part of the monolithic structure in which sensor array 108, processor 118, and memory 120 are a part.

In such instances, optical components 116 can be formed, e.g., bonded (non-reversibly) with epoxy, on the ASIC so that it becomes part of the monolithic structure, as will be discussed further below. As mentioned above, processor 118 (e.g., a digital signal processor (DSP), microcontroller, field programmable gate array (FPGA), and the like) and memory 120 (e.g., SRAM) can perform the signal processing. As an example of signal processing, for each photosensor or grouping of photosensors, memory 120 of light sensing module 106 can accumulate detected photons over time, and these detected photons can be used to recreate an image of the field.

In some embodiments, the output from processor 118 is sent to system controller 104 for further processing, e.g., the data can be encoded by one or more encoders of the system controller 104 and then sent as data packets to user interface 115. System controller 104 can be realized in multiple ways including, e.g., by using a programmable logic device such an FPGA, as an ASIC or part of an ASIC, using a processor 122 with memory 124, and some combination of the above. System controller 104 can cooperate with a stationary base controller or operate independently of the base controller (via pre-programmed instructions) to control light sensing module 106 by sending commands that include start and stop light detection and adjust photodetector parameters. In some embodiments, system controller 104 has one or more wired interfaces or connectors for exchanging data with light sensing module 106. In other embodiments, system controller 104 communicates with light sensing module 106 over a wireless interconnect such as an optical communication link.

Passive optical imager system 100 can interact with a user interface 115, which can be any suitable user interface for enabling a user to interact with a computer system, e.g., a display, touch-screen, keyboard, mouse, and/or track pad for interfacing with a laptop, tablet, and/or handheld device computer system containing a CPU and memory. User interface 115 may be local to the object upon which passive optical imager system 100 is mounted but can also be a remotely operated system. For example, commands and data to/from passive optical imager system 100 can be routed through a cellular network (LTE, etc.), a personal area network (Bluetooth, Zigbee, etc.), a local area network (WiFi, IR, etc.), or a wide area network such as the Internet.

User interface 115 of hardware and software can present the imager data from the device to the user but can also allow a user to control passive optical imager system 100 with one or more commands. Example commands can include commands that activate or deactivate the imager system, specify photodetector exposure level, bias, sampling duration and other operational parameters (e.g., emitted pulse patterns and signal processing), specify light emitters parameters such as brightness. In addition, commands can allow the user to select the method for displaying results. The user interface can display imager system results which can include, e.g., a single frame snapshot image, a constantly updated video image, and/or a display of other light measurements for some or all pixels.

As mentioned herein, one or more components of optical sensing system 110 can be part of a monolithic structure with sensor array 108, processor 118, and memory 120. For example, an aperture layer, collimating lens layer, and an optical filter layer of optical components 116 can be stacked over and bonded with epoxy to a semiconductor substrate having multiple ASICs fabricated thereon at the wafer level before or after dicing. For instance, the optical filter layer can be a thin wafer that is placed against the photosensor layer and then bonded to the photosensor layer to bond the optical filter layer with the photosensor layer to have the optical layer form part of the monolithic structure; the collimating lens layer can be injection molded onto the optical filter layer; and, the aperture layer can be formed by layering a non-transparent substrate on top of a transparent substrate or by coating a transparent substrate with an opaque film. Alternatively, the photosensor layer can be fabricated and diced, and the optical filter layer, collimating lens layer, and the aperture layer can be fabricated and diced. Each diced photosensor layer and optical layers can then be bonded together to form a monolithic structure where each monolithic structure includes the photosensor layer, optical filter layer, collimating lens layer, and the aperture layer. By bonding the layers to the ASIC, the ASIC and the bonded layers can form a monolithic structure. The wafer can then be diced into devices, where each device can be paired with a respective bulk receiver optic 114 to form light sensing module 106. In yet other embodiments, one or more components of light sensing module 106 can be external to the monolithic structure. For example, the aperture layer may be implemented as a separate metal sheet with pin-holes. A more detailed view of an optical sensing system and a sensor array according to an embodiment of the disclosure is discussed herein with respect to FIG. 2.

Figure 2:
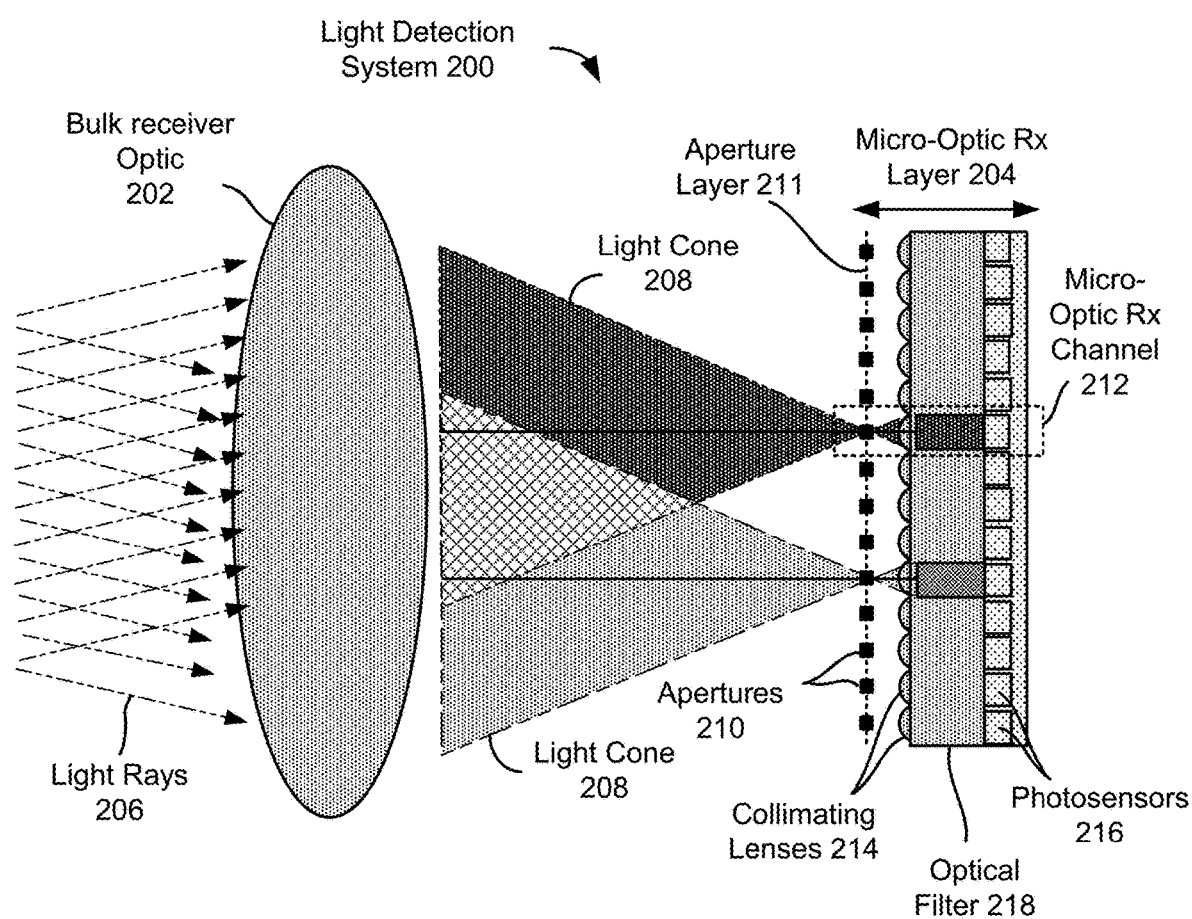
FIG. 2 is a simplified diagram of an exemplary light detection system for a passive optical imager system, according to some embodiments of the present disclosure.

FIG. 2 is a simplified diagram of an exemplary light detection system 200 according to some embodiments of the present disclosure. Light detection system 200 can be representative of light detection system 112 discussed above with respect to FIG. 1. Light detection system 200 can include an optical sensing system and a sensor array. The optical sensing system can include bulk receiver optics, an aperture layer, a collimating lens layer, and an optical filter layer; and the sensor array can include an array of photosensors, where each photosensor can include one or more photodetectors for measuring light. According to some embodiments, these components operate together to receive light from a field. For instance, light detection system 200 can include a bulk receiver optic 202 and a micro-optic receiver (Rx) layer 204. During operation, light rays 206 enter bulk receiver optic 202 from multiple directions and gets focused by bulk receiver optic 202 to form light cones 208. Micro-optic receiver layer 204 is positioned so that apertures 210 coincide with the focal plane of bulk receiver optic 202. In some embodiments, micro-optic receiver layer 204 can be a one-dimensional or two-dimensional array of micro-optic receiver channels 212, where each micro-optic receiver channel 212 is formed of a respective aperture 210, collimating lens 214, and photosensor 216 positioned along the same axis in the direction of light flow, e.g., horizontal from left to right as shown in FIG. 2. Furthermore, each micro-optic receiver channel 212 can be configured various ways to mitigate interference from stray light between photosensors, as will be discussed further herein. During operation, each micro-optic receiver channel 212 measures light information for a different pixel (i.e., position in the field).

At the focal point of bulk receiver optic 202, light rays 206 focus and pass through apertures 210 in an aperture layer 211 and into respective collimating lenses 214. Each collimating lens 214 collimates the received light so that the light rays all enter the optical filter at approximately the same angle, e.g., parallel to one another. The aperture and focal length of bulk receiver optic 202 determine the cone angle of respective light rays that come to a focus at aperture 210. The aperture size and the focal length of collimating lenses 214 determine how well-collimated the admitted rays can be, which determines how narrow of a bandpass can be implemented in optical filter 218. Apertures 210 can serve various functions during the operation of light detection system 200. For instance, apertures 210 can (1) constrain the pixel FOV so it has tight spatial selectivity despite a large pitch at the photosensor plane, (2) provide a small point-like source at the collimating lens's focal plane to achieve tight collimation of rays before passing through the filter, where better collimation results in a tighter band that can pass through the filter, and (3) reject stray light.

Optical filter 218 blocks unwanted wavelengths of light. Interference-based filters tend to exhibit strong angle dependence in their performance. For example, a 1 nm wide bandpass filter with a center wavelength (CWL) of 900 nm at a zero-degree angle of incidence might have a CWL of 898 nm at a fifteen-degree angle of incidence. Imaging systems typically use filters several tens of nanometers wide to accommodate this effect, so that the shift in CWL is much smaller than the bandpass width. However, the use of micro-optic layer 204 allows all rays to enter optical filter 218 at approximately the same angle of incidence, thus minimizing the shift in CWL and allowing very tight filters (e.g. less than 10 nm wide) to be used. Photosensor 216 generates electrical currents or voltages in response to incident photons. In some embodiments, optical filter 218 is uniform across the entire array of micro-optic receiver channels 212 so that each individual micro-optic receiver channel 212 in the array receives the same range of wavelengths of light.

In some embodiments, photosensors 216 are positioned on a side opposite of collimating lenses 214 so that light rays 206 first pass through collimating lenses 214 and optical filter 218 before exposing on photosensors 216. Each photosensor 216 can be a plurality of photodetectors, such as a mini-array of multiple single-photon avalanche detectors (SPADs). An array of mini-arrays of SPADs can be fabricated on a single monolithic chip, thereby simplifying fabrication. In some alternative embodiments, each photosensor 216 can be a single photodetector, e.g., a standard photodiode, an avalanche photodiode, a resonant cavity photodiode, or another type of photodetector.

In some other embodiments, optical filter 218 is non-uniform. For example, a graduated filter allows different micro-optic channels to measure a different range of wavelengths. In other words, a graduated filter allows different micro-optic channels in an array of micro-optic channels to have different center wavelengths (CWL). A graduated filter typically gradually changes the range of allowed wavelengths in either one or two dimensions. However, a graduated filter could also encompass a filter where the range of allowed wavelengths changes rapidly (e.g., step-wise) in one or both dimensions. The different CWLs for the channels can be created in various ways. For instance, the thickness of the filter can change or the index of refraction can change. The index of refraction can be changed by modifying the filter layer, such as by altering its chemical composition, e.g., by modifying it to have a non-uniform doping concentration. As a result, each channel (or row/column of channels) can have an optical filter layer that has a different doping concentration, thereby resulting in a different CWL for each channel (or row/column of channels) without having a modified thickness. Rotating a one-dimensional array of micro-optic channels with a graduated optical filter allows the system to measure light at different wavelengths for each photosensor. Scanning a two-dimensional array of micro optic channels where the graduated filter is changing along the direction of the scan allows the passive optic imager system to measure light at multiple wavelengths for each position in space, but uses multiple photodetectors in the photosensor to do so. Such optical systems using graduated filters require synchronization of the photosensor sampling so that different wavelength measurements are taken for the same photosensor with the same field-of-view. Imaging systems that differentiate between many different wavelengths are sometimes referred to as hyperspectral imagers. A hyperspectral imager often requires that light from the wavelengths of interest all be focused in approximately the same plane. This can be achieved by using an achromatic, apochromatic, superachromatic, or similar lens that is designed to limit the effects of chromatic aberration.

Hyperspectral imagers collect information from multiple wavelength bands across the electromagnetic spectrum. The absolute or relative intensities of the wavelength bands can provide information about chemical concentrations. For example, chlorophyll content of certain crops can be estimated using only a few wavelength bands. Similar techniques can be used to find valuable minerals or identify toxins. Spectral information can also be used to assist in the classification of pedestrians, automobiles, and other objects similarly encountered in an automotive environment.

A graduated neutral-density filter has a transmission that varies spatially across the filter, but the transmission is largely independent of wavelength (e.g. just as transmissive to red light as to blue light) at any given location. In a scanning imaging system, a graduated neutral-density filter can be used to image the same point in space with varying degrees of attenuation, thereby enabling a composite measurement with higher dynamic range than would achievable with a non-graduated filter. A better understanding of a micro-optic receiver layer with graduated filter can be achieved with reference to FIGS. 3A and 3B.

Figure 3A:
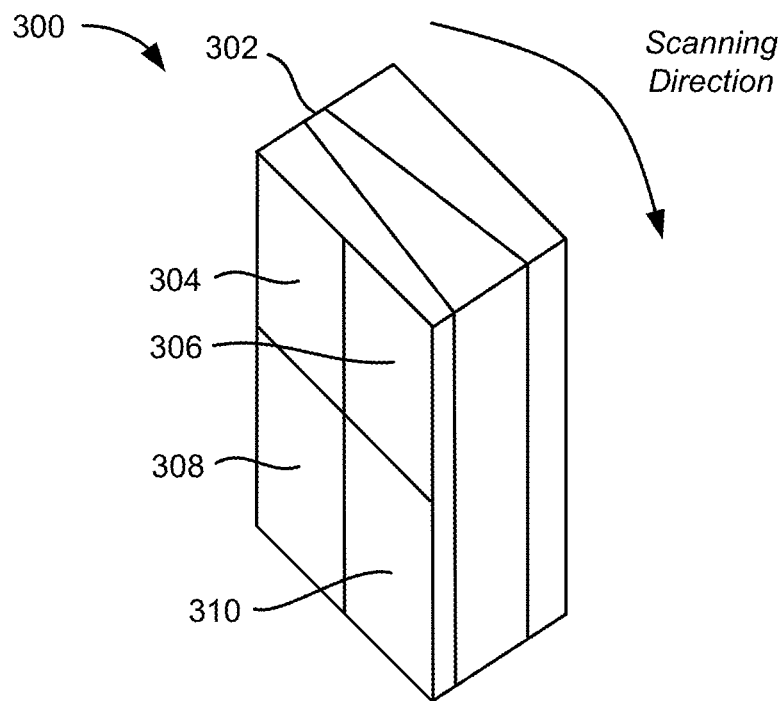
FIGS. 3A and 3B are perspective views of a simplified diagram of different embodiments of micro-optic receiver layers with graduated filter layers, according to some embodiments of the present disclosure.
Figure 3B:
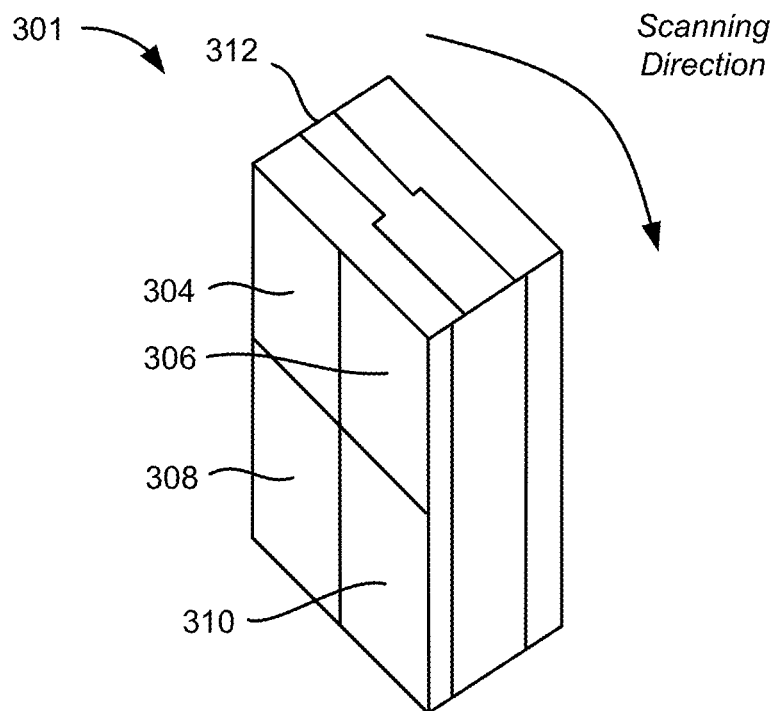

FIGS. 3A and 3B are perspective views of a simplified diagram of different embodiments of micro-optic receiver layers with graduated filter layers, according to some embodiments of the present disclosure. Specifically, FIG. 3A is a perspective view of a simplified diagram of a micro-optic receiver layer 300 with a graduated filter layer 302, and FIG. 3B is a perspective view of a simplified diagram of a micro-optic receiver layer 301 with a graduated filter layer 312. As illustrated in FIGS. 3A and 3B, micro-optic receiver layer 300 and 301 each includes four micro-optic receiver channels 304, 306, 308 and 310 arranged in two dimensions as a 2×2 array. Although FIGS. 3A and 3B illustrate embodiments having only 2×2 arrays, one skilled in the art understands that such embodiments are not limiting and that other embodiments can be configured to have any number of micro-optic receiver channels. It is to be appreciated that in these diagrams, the thicknesses of filter layers 302 and 312 and the thicknesses of the surrounding layers, which are not drawn to scale, should be interpreted as the thicknesses of layers of refractive material in an interference filter. As these thicknesses change, the characteristics (e.g. passband CWL) of the interference filter change. These embodiments can be used in a hyperspectral passive optic imager system.

As shown in FIGS. 3A and 3B, graduated filter layer 302 has gradually increasing thickness in one dimension across multiple columns of micro-optic receiver channels, and graduated filter layer 312 has a step-wise-increasing thickness in one dimension that has a constant thickness for each micro-optic receiver channel. Micro-optic receiver channels 304 and 308 have the same filter thickness and detect the same wavelength of light. Micro-optic receiver channels 306 and 310 have the same filter thickness and detect the same wavelength of light. Micro-optic receiver channels 304 and 308 can have a different filter thickness than micro-optic receiver channels 306 and 310 and thus detect a different wavelength of light. During a first-time interval, the micro-optic receiver channels 304 and 308 measure the intensity of a first wavelength of light for two pixels respectively. In some embodiments, the hyperspectral passive optic imager system moves or rotates the micro-optic receiver layer so that during a second-time interval, micro-optic receiver channels 306 and 310 measure the intensity of a second wavelength of light for the same two pixels respectively. In other embodiments, a hyperspectral passive optic imager system according to the disclosure can include a stationary micro-optic receiver layer and scan a moving target.

II. Active Optical Imager Systems

As discussed herein, optical imager systems can also be configured as active optical imager systems. Active optical imager systems can differ from passive optical imager systems in that active optical imager systems emit their own light into a field and detect the emitted light after it has reflected off surface(s) of an object in the field. In some embodiments, active optical imager systems can be utilized as LIDAR devices where emitted and received, reflected light can be correlated to determine a distance to the object from which the emitted light was reflected. A better understanding of an active optical imager system can be ascertained with reference to FIG. 4.

Figure 4:
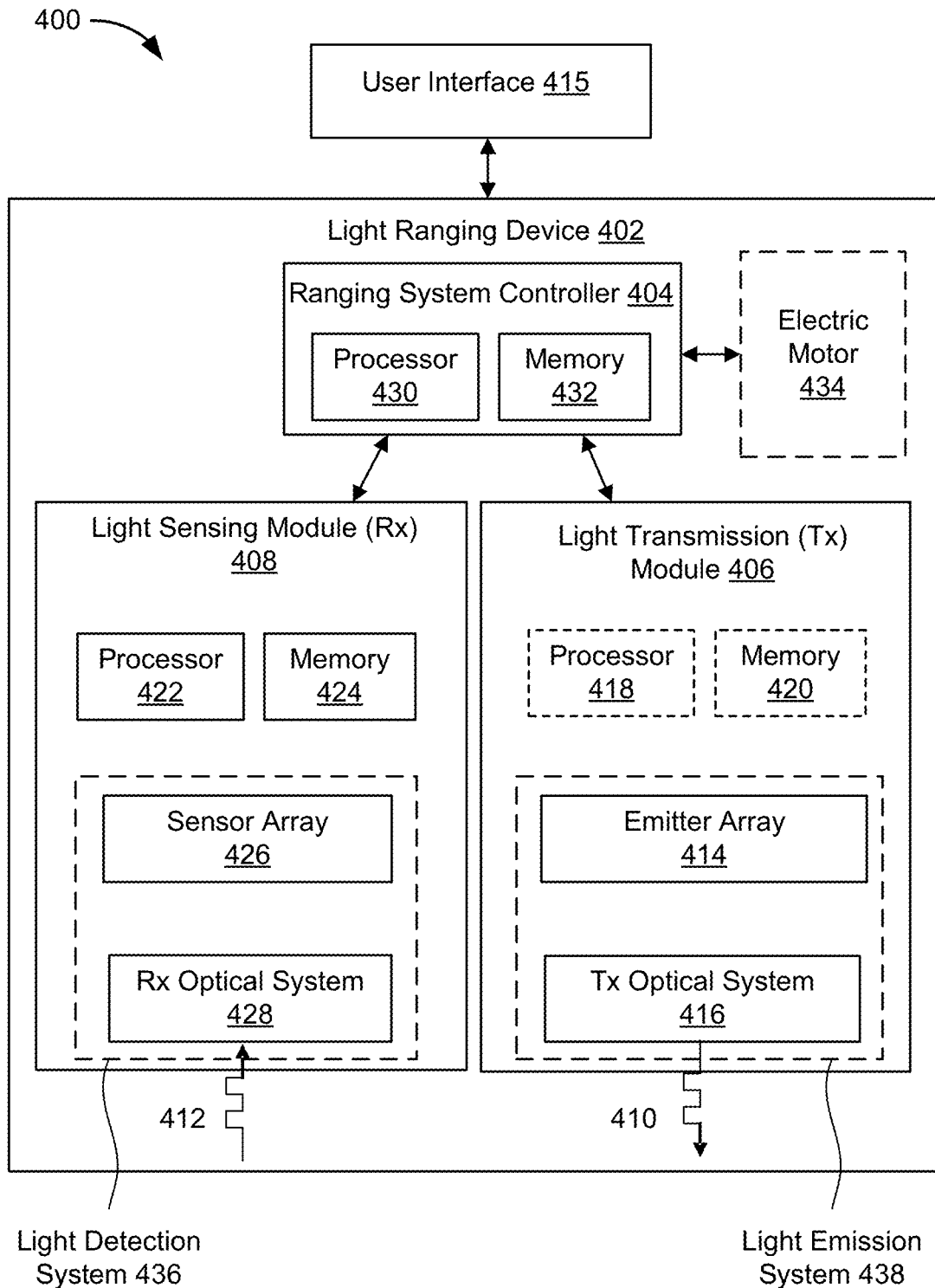
FIG. 4 is a block diagram of a rotating LIDAR system, according to some embodiments of the present disclosure.

FIG. 4 illustrates a block diagram of a LIDAR system 400 according to some embodiments of the present disclosure. LIDAR system 400 can include a light ranging device 402 and a user interface 415. Light ranging device 402 can include a ranging system controller 404, a light transmission (Tx) module 406 and a light sensing (Rx) module 408. Ranging data can be generated by light ranging device 402 by transmitting one or more light pulses 410 from the light transmission module 406 to objects in a field of view surrounding light ranging device 402. Reflected portions 412 of the transmitted light are then detected by light sensing module 408 after some delay time. Based on the delay time, the distance to the reflecting surface can be determined. Other ranging methods can be employed as well, e.g. continuous wave, Doppler, and the like.

Tx module 406 includes an emitter array 414, which can be a one-dimensional or two-dimensional array of emitters, and a Tx optical system 416, which when taken together with emitter array 414 can form a light emission system 438. Tx optical system 416 can include a bulk transmitter optic that is image-space telecentric. In some embodiments, Tx optical system 416 can further include one or more micro-optic structures that increase the brightness of beams emanating from the bulk transmitter optic as discussed herein with respect to FIGS. 11-14 and/or for beam shaping, beam steering or the like. Emitter array 414 or the individual emitters can be laser sources. Tx module 406 can further include an optional processor 418 and memory 420, although in some embodiments these computing resources can be incorporated into ranging system controller 404. In some embodiments, a pulse coding technique can be used, e.g., Barker codes and the like. In such cases, memory 420 can store pulse-codes that indicate when light should be transmitted. In some embodiments, the pulse-codes are stored as a sequence of integers stored in memory.

Light sensing module 408 can be substantially similar in construction to light sensing module 106 discussed herein with respect to FIG. 1. Thus, details of processor 422, memory 424, sensor array 426, and Rx optical system 428 (when taken together with sensor array 426 can form a light detection system 436) can be referenced herein with respect to FIG. 1, and only differences with respect to those components are discussed herein for brevity. For LIDAR system 400, each photosensor sensor (e.g., a collection of SPADs) of sensor array 426 can correspond to a particular emitter of emitter array 414, e.g., as a result of a geometrical configuration of light sensing module 408 and Tx module 406. For example, in some embodiments, emitter array 414 can be arranged along the focal plane of the bulk transmitter optic such that each illuminating beam projected from the bulk transmitter optic into the field ahead of the system is substantially the same size and geometry as the field of view of a corresponding receiver channel at any distance from the system beyond an initial threshold distance.

In some embodiments, processor 418 can perform signal processing of the raw histograms from the individual photon detectors (or groups of detectors) in the array. As an example of signal processing, for each photon detector or grouping of photon detectors, memory 424 (e.g., SRAM) can accumulate counts of detected photons over successive time bins, and these time bins taken together can be used to recreate a time series of the reflected light pulse (i.e., a count of photons vs. time). This time-series of aggregated photon counts is referred to herein as an intensity histogram (or just histogram). Processor 418 can implement matched filters and peak detection processing to identify return signals in time. In addition, Processor 418 can accomplish certain signal processing techniques (e.g., by processor 422), such as multi-profile matched filtering to help recover a photon time series that is less susceptible to pulse shape distortion that can occur due to SPAD saturation and quenching. In some embodiments, all or parts of such filtering can be performed by processor 458, which may be embodied in an FPGA.

In some embodiments, the photon time series output from processor 418 are sent to ranging system controller 404 for further processing, e.g., the data can be encoded by one or more encoders of ranging system controller 404 and then sent as data packets to user interface 415. Ranging system controller 404 can be realized in multiple ways including, e.g., by using a programmable logic device such an FPGA, as an ASIC or part of an ASIC, using a processor 430 with memory 432, and some combination of the above. Ranging system controller 404 can cooperate with a stationary base controller or operate independently of the base controller (via pre-programmed instructions) to control light sensing module 408 by sending commands that include start and stop light detection and adjust photodetector parameters. Similarly, ranging system controller 404 can control light transmission module 406 by sending commands, or relaying commands from the base controller, that include start and stop light emission controls and controls that can adjust other light-emitter parameters (e.g., pulse codes). In some embodiments, ranging system controller 404 has one or more wired interfaces or connectors for exchanging data with light sensing module 408 and with light transmission module 406. In other embodiments, ranging system controller 404 communicates with light sensing module 408 and light transmission module 406 over a wireless interconnect such as an optical communication link.

Light ranging device 402 can be used in both stationary and a scanning architectures. Electric motor 434 is an optional component in LIDAR system 400 that can be used to rotate system components, e.g., the Tx module 406 and Rx module 408, as part of a scanning LIDAR architecture. The system controller 404 can control the electric motor 434 and can start rotation, stop rotation and vary the rotation speed as needed to implement a scanning LIDAR system. Exemplary stationary LIDAR devices are discussed below with respect to FIGS. 5A and 5B, while exemplary scanning LIDAR devices are discussed further herein with respect to FIGS. 6A, 6B, and 7.

LIDAR system 400 can interact with one or more instantiations of a user interface 415. The different instantiations can vary and can include, but not be limited to, a computer system with a monitor, keyboard, mouse, CPU and memory; a touch-screen in an automobile or other vehicle; a handheld device with a touch-screen; or any other appropriate user interface. User interface 415 can be local to the object upon which LIDAR system 400 is mounted but can also be a remotely operated system. For example, commands and data to/from LIDAR system 400 can be routed through a cellular network (LTE, etc.), a personal area network (Bluetooth, Zigbee, etc.), a local area network (WiFi, IR, etc.), or a wide area network such as the Internet.

User interface 415 of hardware and software can present the LIDAR data from the device to the user or to a vehicle control unit (not shown) but can also allow a user to control LIDAR system 400 with one or more commands. Example commands can include commands that activate or deactivate the LIDAR system, specify photodetector exposure level, bias, sampling duration and other operational parameters (e.g., emitted pulse patterns and signal processing), specify light emitters parameters such as brightness. In addition, commands can allow the user to select the method for displaying results. The user interface can display LIDAR system results which can include, e.g., a single frame snapshot image, a constantly updated video image, and/or a display of other light measurements for some or all pixels. In some embodiments, user interface 415 can track distances (proximity) of objects from the vehicle, and potentially provide alerts to a driver or provide such tracking information for analytics of a driver's performance.

In some embodiments, for example where LIDAR system 400 is used for vehicle navigation, user interface 415 can be a part of a vehicle control unit that receives output from, and otherwise communicates with light ranging device 402 and/or user interface 415 through a network, such as one of the wired or wireless networks described above. One or more parameters associated with control of a vehicle can be modified by the vehicle control unit based on the received LIDAR data. For example, in a fully autonomous vehicle, LIDAR system 400 can provide a real time 3D image of the environment surrounding the car to aid in navigation in conjunction with GPS and other data. In other cases, LIDAR system 400 can be employed as part of an advanced driver-assistance system (ADAS) or as part of a safety system that, e.g., can provide 3D image data to any number of different systems, e.g., adaptive cruise control, automatic parking, driver drowsiness monitoring, blind spot monitoring, collision avoidance systems, etc. When user interface 415 is implemented as part of a vehicle control unit, alerts can be provided to a driver or tracking of a proximity of an object can be tracked.

A. Solid State Architecture

LIDAR systems, according to some embodiments of the present disclosure, can be configured as a solid state LIDAR system that has a stationary architecture. Such LIDAR systems do not rotate, and thus do not need a separate motor, e.g., electric motor 434 in FIG. 4, to rotate the sensor and transmitter modules. Example solid state LIDAR systems are shown in FIGS. 5A and 5B.

FIGS. 5A and 5B are simple illustrations of exemplary implementations of solid state LIDAR systems. Specifically, FIG. 5A illustrates an implementation 500 where solid state LIDAR systems 502*a*-*d* are implemented at the outer regions of a road vehicle 505, such as an automobile, according to some embodiments of the present disclosure; and FIG. 5B illustrates an implementation 501 where solid state LIDAR systems 504a-b are implemented on top of road vehicle 505, according to some embodiments of the present disclosure. In each implementation, the number of LIDAR systems, the placement of the LIDAR systems, and the fields of view of each LIDAR system can be chosen to obtain a majority of, if not the entirety of, a 360 degree field of view of the environment surrounding the vehicle. Automotive implementations for the LIDAR systems are chosen herein merely for the sake of illustration and the sensors described herein may be employed in other types of vehicles, e.g., boats, aircraft, trains, etc., as well as in a variety of other applications where 3D depth images are useful, such as medical imaging, mobile phones, augmented reality, geodesy, geomatics, archaeology, geography, geology, geomorphology, seismology, forestry, atmospheric physics, laser guidance, airborne laser swath mapping (ALSM), and laser altimetry.

With reference to FIG. 5A, solid state LIDAR systems 502a-d can be mounted at the outer regions of a vehicle, near the front and back fenders. LIDAR systems 502a-d can each be positioned at a respective corner of vehicle 505 so that they are positioned near the outermost corners of vehicle 505. That way, LIDAR systems 502a-d can better measure the distance of vehicle 505 from objects in the field at areas 506a-d. Each solid state LIDAR system can face a different direction (possibly with partially and/or non-overlapping fields of views between units) so as to capture a composite field of view that is larger than each unit is capable of capturing on its own. Objects within the scene can reflect portions of light pulses 510 that are emitted from LIDAR Tx module 508. One or more reflected portions 512 of light pulses 510 then travel back to LIDAR system 502a and can be received by Rx module 509. Rx module 509 can be disposed in the same housing as Tx module 508.

Although FIG. 5A illustrates four solid state LIDAR systems mounted at the four corners of a vehicle, embodiments are not limited to such configurations. Other embodiments can have fewer or more solid state LIDAR systems mounted on other regions of a vehicle. For instance, LIDAR systems can be mounted on a roof of a vehicle 505, as shown in FIG. 5B. In such embodiments, LIDAR systems can have a higher vantage point to better observe areas 506a-d around vehicle 505.

B. Scanning Architecture

In some embodiments, LIDAR systems according to the present disclosure can employ a scanning architecture in which the LIDAR system oscillates between an angle that is less than 360 degrees. For instance, LIDAR systems 504a-b in implementation 501 of FIG. 5B can each employ a scanning architecture to scan the entire scene in front of, and/or behind, vehicle 505, e.g., in area 514 between field of view 506a and 506b and in area 516 between field of view 506c and 506d. The output beam(s) of one or more light sources (not shown, but can be a variety of different suitable sources for emitting radiation including, but not limited to lasers, in any wavelength spectrum suitable for LIDAR systems, such as in the infrared, near-infrared, ultraviolet, visible, e.g., green laser wavelength spectrum, and the like) located in the scanning LIDAR systems, can be outputted as pulses of light and scanned, e.g., rotated between an angle that is less than 360 degrees, to illuminate a scene around the vehicle. In some embodiments, the scanning, represented by rotation arrows 514 and 516, can be implemented by mechanical means, e.g., by mounting the light emitters to a rotating column or platform or through the use of other mechanical means, such as galvanometers. Chip-based beam steering techniques can also be employed, e.g., by using microchips that employ one or more MEMS based reflectors, e.g., such as a digital micromirror (DMD) device, a digital light processing (DLP) device, and the like. In some embodiments, the scanning can be effectuated through non-mechanical means, e.g., by using electronic signals to steer one or more optical phased arrays.

Other embodiments can implement a scanning architecture that scans through the entire 360 degrees of the environment surrounding a vehicle. Such scanning LIDAR systems can repetitively rotate continuously through 360 degrees in a clockwise or counter-clockwise direction, and thus may utilize a separate motor, e.g., electric motor 434 in FIG. 4, to rotate the sensor and transmitter modules. Exemplary rotating LIDAR systems are shown in FIGS. 6A and 6B.

FIG. 6A is a top-down view of a simplified diagram of an exemplary scanning LIDAR system 600 implemented for a vehicle 605, such as a car, and capable of continuous 360 degree scanning, according to some embodiments of the present disclosure. The output beam(s) of one or more light sources (such as infrared or near-infrared pulsed IR lasers, not shown) located in LIDAR system 600, can be scanned, e.g., rotated, to illuminate a continuous scene 620 around the vehicle. In some embodiments, the scanning, represented by rotation arrow 615, can be implemented by any suitable mechanical means discussed herein with respect to FIG. 5B, e.g., by mounting the light emitters to a rotating column or platform, or any other mechanical means, such as through the use of galvanometers or chip-based steering techniques. During operation, objects around vehicle 605 in any direction and within the view of LIDAR system 600 can reflect portions of light pulses 611 that are emitted from a transmitting module 608 in LIDAR system 600. One or more reflected portions 617 of light pulses 611 then travel back to LIDAR system 600 and can be detected by its sensing module 609. In some instances, sensing module 609 can be disposed in the same housing as transmitting module 608.

Although FIG. 6A illustrates solid state LIDAR systems mounted on a roof of a vehicle 605, embodiments are not limited to such configurations. Other embodiments can have solid state LIDAR systems mounted on other regions of a vehicle. For instance, LIDAR systems can be mounted at the corners of a vehicle, as shown in FIG. 6B. FIG. 6B illustrates an implementation 601 where solid state LIDAR systems 604a-d are implemented at the outer regions of a road vehicle, such as a car, according to some embodiments of the present disclosure. In this implementation, each LIDAR system 604a-d can be a spinning LIDAR system that can measure distances around the full 360 degrees. However, since at least some of those measurements will be measured with respect to vehicle 605, those measurements can be ignored. Thus, each LIDAR system 605a-d can only utilize a subset of the measurements from 360 degree scanning, e.g., only the angles covering regions 619a-d that do not capture vehicle 605 are utilized.

Figure 7:
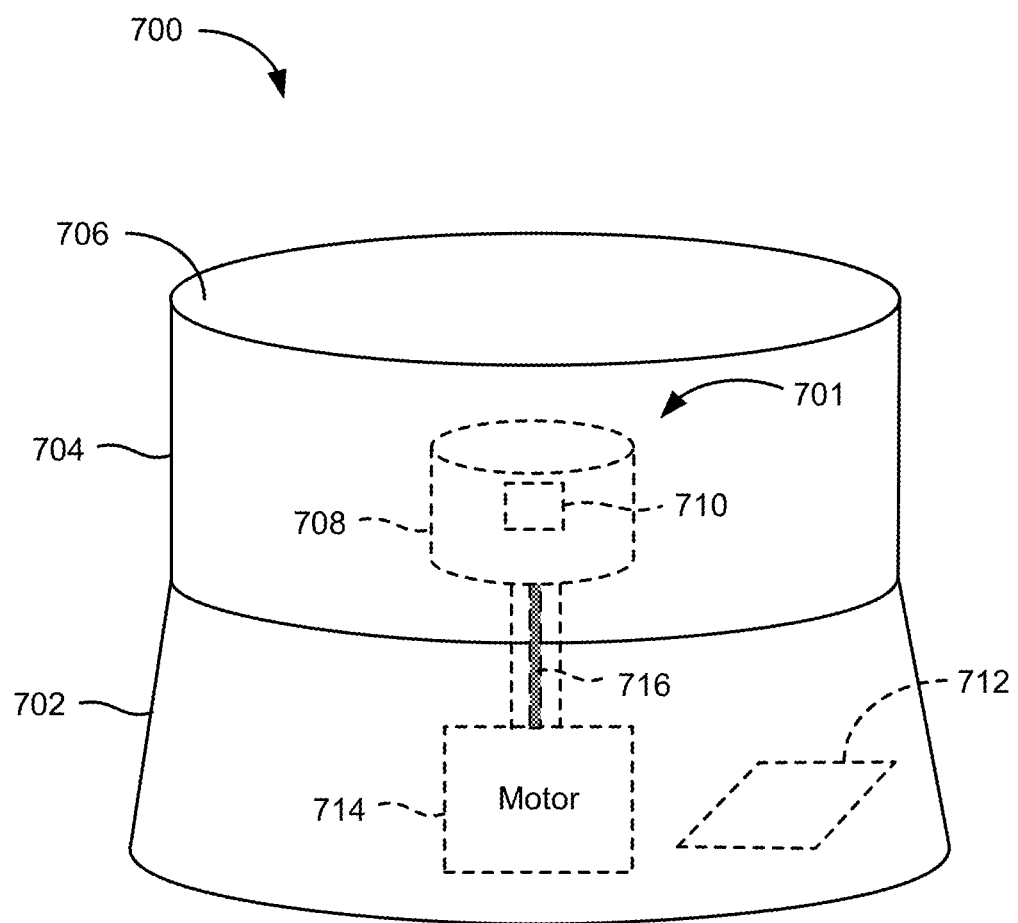
FIG. 7 is an exemplary perspective view diagram showing an embodiment of a LIDAR system employing a 360 scanning architecture, according to some embodiments of the present disclosure.

FIG. 7 is a simplified exemplary perspective view of a LIDAR system 700 that employs a 360 scanning architecture, according to some embodiments of the present disclosure. In some embodiments, LIDAR system 700 can include a light ranging device 701 that spins in a clockwise or counter-clockwise direction to observe the surrounding field around a vehicle. System 700 can include a stationary housing 702, an optically transparent window 704, and a stationary lid 706 for providing protection for the internal components of LIDAR system 700. Window 704 can extend fully around a periphery of stationary housing 702, which can be configured to have a cylindrical shape. The internal components of system 700 can include light ranging device 701, which can include a rotating platform 708 and sensing and transmitting modules 710 mounted on rotating platform 708. In some embodiments, light ranging device 701 is aligned with window 704 such that modules 710 are positioned to emit and receive light through window 704, and that emitted light is not emitted onto stationary housing 702 or stationary lid 706. For instance, in the aligned positioned, the horizontal center of light ranging device 701 coincides with the horizontal center of window 704. Sensing and transmitting modules 710 can be, for example, light sensing module 408 and light transmission module 406, and can optionally include a heat sink (not shown) to cool the micro-optic layers. LIDAR system 700 can also include a system controller 712 (e.g., controller 404) and electric motor 714 (e.g., motor 434) that reside within stationary housing 702. Electric motor 714 rotates platform 708, thereby rotating sensing and transmitting modules 710 in a spinning manner, e.g., continuously through 360 degrees in a clockwise or counter-clockwise direction. System controller 712 can communicate with sensing and transmitting modules 710 using an optical communication link 716. Optical communication link 716 allows sensing and transmitting modules 710 to communicate with stationary system controller 712, which is mechanically coupled to stationary housing 702 and does not rotate with platform 708, through optical communication link 716 without mechanical wear and tear. In some embodiments, system controller 712 can control the motor and to start and stop light detection operations of LIDAR system 700. System controller 712 can include two or more stacked planar circuit boards arranged in a parallel relationship, which is discussed in more detail in commonly-owned and concurrently-filed U.S. Patent Application No. 16/209,867, filed Dec. 4, 2018, now U.S. Patent No. 10,481,269, issued Nov. 19,2019, which is herein incorporated by reference in its entirety for all purposes. which is herein incorporated by reference in its entirety for all purposes.

III. Operation of Active Imager Systems

Figure 8:
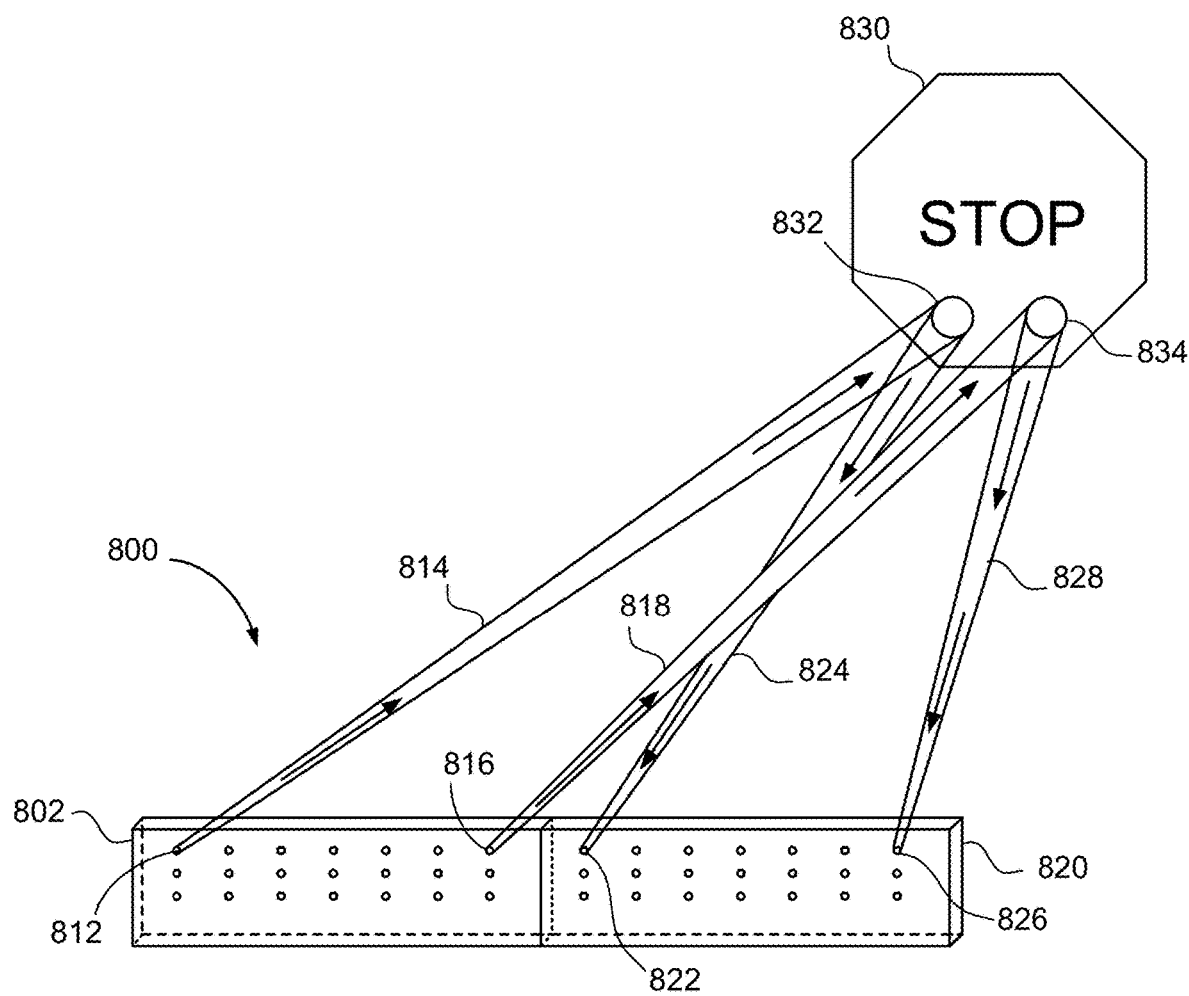
FIG. 8 is an illustrative example of the light transmission and detection operation for a light ranging system, according to some embodiments of the present disclosure.

FIG. 8 is an illustrative example of the light transmission and detection operation for a light ranging system according to some embodiments. FIG. 8 shows a light ranging system 800 (e.g., solid state or and/or scanning system) collecting three-dimensional distance data of a volume or scene that surrounds the system. FIG. 8 is an idealized drawing to highlight relationships between emitters and sensors, and thus other components are not shown.

Light ranging system 800 includes a light emitter array 810 and a light sensor array 820. The light emitter array 810 includes an array of light emitters, e.g., an array of vertical-cavity surface-emitting lasers (VCSELs) and the like, such as emitter 812 and emitter 816. Light sensor array 820 includes an array of photosensors, e.g., sensors 822 and 826. The photosensors can be pixelated light sensors that employ, for each photosensor, a set of discrete photodetectors such as single photon avalanche diodes (SPADs) and the like. However, various embodiments can deploy other types of photon sensors.

Each emitter can be slightly offset from its neighbor and can be configured to transmit light pulses into a different field of view from its neighboring emitters, thereby illuminating a respective field of view associated with only that emitter. For example, emitter 812 emits an illuminating beam 814 (formed from one or more light pulses) into the circular field of view 832 (the size of which is exaggerated for the sake of clarity). Likewise, emitter 816 emits an illuminating beam 818 (also called an emitter channel) into the circular field of view 834. While not shown in FIG. 8 to avoid complication, each emitter emits a corresponding illuminating beam into its corresponding field of view resulting in a 2D array of fields of view being illuminated (21 distinct fields of view in this example).

Each field of view that is illuminated by an emitter can be thought of as a pixel or spot in the corresponding 3D image that is produced from the ranging data. Each emitter channel can be distinct to each emitter and be non-overlapping with other emitter channels, i.e., there is a one-to-one mapping between the set of emitters and the set of non-overlapping fields or view. Thus, in the example of FIG. 8, the system can sample 21 distinct points in the 3D space. A denser sampling of points can be achieved by having a denser array of emitters or by scanning angular position of the emitter beams over time such that one emitter can sample several points in space. As described above, scanning can be accomplished by rotating the entire emitter/sensor assembly.

Each sensor can be slightly offset from its neighbor and, like the emitters described above, each sensor can see a different field of view of the scene in front of the sensor. Furthermore, each sensor's field of view substantially coincides with, e.g., overlaps with and is the same size as a respective emitter channel's field of view.

In FIG. 8, the distance between corresponding emitter-receiver channels is exaggerated relative to the distance to objects in the field of view. In practice, the distance to the objects in the field of few is much greater than the distance between corresponding emitter-receiver channels and thus the path of light from the emitter to the object is approximately parallel to the path of the reflected light back from the object to the sensor (i.e., it is almost "back reflected"). Accordingly, there is a range of distances in front of the system 800 over which the fields of view of individual sensors and emitters are overlapped.

Because the fields of view of the emitters are overlapped with the fields of view of their respective sensors, each receiver channel ideally can detect the reflected illumination beam that originates from its respective emitter channel with ideally no cross-talk, i.e., no reflected light from other illuminating beams is detected. Thus, each photosensor can correspond to a respective light source. For example, emitter 812 emits an illuminating beam 814 into the circular field of view 832 and some of the illuminating beam reflects from the object 830. Ideally, a reflected beam 824 is detected by sensor 822 only. Thus, emitter 812 and sensor 822 share the same field of view, e.g., field of view 832, and form an emitter-sensor pair. Likewise, emitter 816 and sensor 826 form an emitter-sensor pair, sharing field of view 834. While the emitter-sensor pairs are shown in FIG. 8 as being in the same relative locations in their respective array, any emitter can be paired with any sensor depending on the design of the optics used in the system.

During a ranging measurement, the reflected light from the different fields of view distributed around the volume surrounding the LIDAR system is collected by the various sensors and processed, resulting in range information for any objects in each respective field of view. As described above, a time-of-flight technique can be used in which the light emitters emit precisely timed pulses, and the reflections of the pulses are detected by the respective sensors after some elapsed time. The elapsed time between emission and detection and the known speed of light is then used to compute the distance to the reflecting surface. In some embodiments, additional information can be obtained by the sensor to determine other properties of the reflecting surface in addition to the range. For example, the Doppler shift of a pulse can be measured by the sensor and used to compute the relative velocity between the sensor and the reflecting surface. The pulse strength can be used to estimate the target reflectivity, and the pulse shape can be used to determine if the target is a hard or diffuse material.

In some embodiments, the LIDAR system can be composed of a relatively large 2D array of emitter and receiver channels and operate as a solid state LIDAR, i.e., it can obtain frames of range data without the need to scan the orientation of the emitters and/or sensors. In other embodiments, the emitters and sensors can be scanned, e.g., rotated about an axis, to ensure that the fields of view of the sets of emitters and sensors sample a full 360 degree region (or some useful fraction of the 360 degree region) of the surrounding volume. The range data collected from the scanning system, e.g., over some predefined time period, can then be post-processed into one or more frames of data that can then be further processed into one or more depth images or 3D point clouds. The depth images and/or 3D point clouds can be further processed into map tiles for use in 3D mapping and navigation applications.

According to some embodiments, a light ranging system (also called a coded-pulse optical receiver system) can transmit multiple pulses of light. In some embodiments, each coded-pulse has an embedded positive-valued pulse-code formed by the light intensity. The system can determine the temporal position and/or amplitude of optical pulses in the presence of background light by creating an intensity histogram of detected, reflected light at different time bins. For each time bin, the system adds a weighted value to the intensity histogram that depends on the intensity of detected light. The weighted values can be positive or negative and have varying magnitudes.

By selecting different combinations of positive-valued pulse-codes and applying different weights, the system can detect positive-valued and negative-valued codes suitable for standard digital signal processing algorithms. This approach gives a high signal-to-noise ratio while maintaining a low uncertainty in the measured temporal position of the reflected light pulses.

Figure 9:
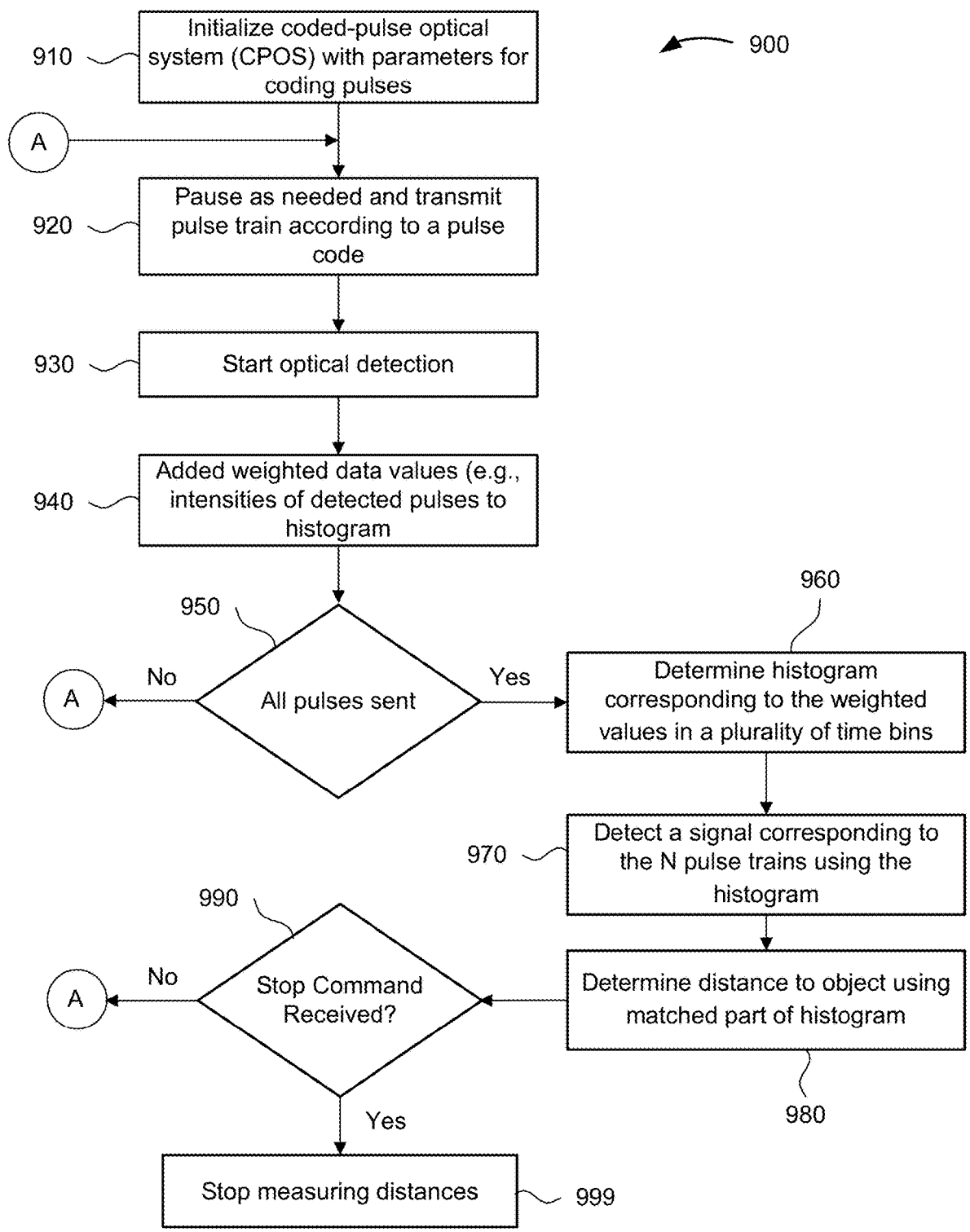
FIG. 9 is a flowchart illustrating a method of using coded pulses in an optical measurement system, according to embodiments of the present disclosure.

FIG. 9 is a flowchart illustrating a method 900 of using coded pulses in an optical measurement system according to embodiments of the present disclosure. The optical measurement system may be a light ranging system. Method 900 can detect the temporal position of a reflected pulse from a target using multiple coded-pulses. In a real-time three-dimensional application, method 900 can constantly detect distances to objects in the surrounding environment. Method 900 may be implemented by any of the optical measurement systems described herein.

At 910, a coded-pulse optical system (CPOS) performs an initialization. For example, the CPOS can respond to user interface commands for starting, stopping, and changing parameters. The CPOS can initialize an optical transmitter to indicate parameters, e.g., pulse-codes, light power level, and various time intervals (e.g., for a detection interval, an interval for pausing between detection intervals, and an overall measurement time interval). The CPOS can initialize a light sensing module to indicate parameters such as pulse-time-interval and light-sampling-interval. The CPOS can also clear histogram values.

At 920, a pulse train is transmitted from a light source (e.g., a laser) as part of an optical measurement. The pulse train can be transmitted as part of N pulse trains transmitted for the measurement. The N pulse trains can reflect from an object, thereby allowing a ranging measurement to the object. Each of the N pulse trains can include one or more pulses from the light source (e.g., VCSELs) and correspond to a different time interval that is triggered by a start signal.

In some embodiments, the CPOS can wait for a specified time to allow a previous pulse train (coded-pulse transmission) to dissipate. The CPOS can then transmit a next pulse train of the N pulse trains of a measurement, where the N pulse trains form a code. Once a measurement is complete, e.g., a last of the N pulse train has dissipated (e.g., after a predetermined time expected for any reflections), the CPOS can then start the first/next coded-pulse transmission using the appropriate pulse-code. N can be an integer greater than one, e.g., 2, 3, 4, 5, or higher.

At 930, optical detection can be started, e.g., in response to the start signal that triggers the pulse train to be transmitted. Thus, the CPOS can start light detection at the same time that it started coded-pulse transmission. As part of the optical detection, a pulse train can be detected by a photosensor (e.g., corresponding to a pixel) of the optical measurement system, thereby generating data values at a plurality of time points. In some embodiments, the photosensor is a collection of photodetectors (e.g., SPADs). The data values may be of various forms, e.g., counts of a number of SPADs that triggered at a time point (e.g., within a time bin of a histogram). As other examples, the data values can be a digitized value from an ADC that follows an analog photosensor (e.g., an APD). Both examples can correspond to an intensity. In total, N pulse trains can be detected. Further, the process can be performed separately for each photosensor of the optical measurement device.

At 940, a weight is assigned to the data values at time points within the time interval corresponding to the pulse train, thereby obtaining weighted values. A weight can be assigned for each of the N pulse trains. Some of such weights for different pulse trains can be the same as other pulse trains. In some embodiments, at least two of the N pulse trains are assigned different weights and have a different pulse pattern. Two pulse trains can have some similarity (e.g., portions of pulses can overlap), but there is at least some times where one pulse train is ON and the other pulse train is OFF. Such different pulse patterns can have a similar shape but have a different delay, e.g., {1, 0, 1, 1, 0} has a similar shape of non-zero values to {0, 1, 0, 1, 1}, but they are different pulse patterns due to an offset as may be achieved by a delay in the second signal relative to the first signal.

Accordingly, the CPOS can detect light and create a digitized intensity value for each light-sampling-interval. For each light-sampling-interval, the CPOS can apply a pulse-weight to the digitized intensity value and add the result to the appropriate time-bin of the intensity histogram.

At 950, the CPOS tests if it has sent the required number of coded-pulses. If the CPOS has sent the required number of coded-pulses it continues at block 960, otherwise it loops back to block 920.

At 960, a histogram corresponding to the weighted values in a plurality of time bins is determined. As described above, a counter of the histogram at a particular time bin can be determined by accumulating the weighted values at time points within the particular time bin across a plurality of time intervals.

At 970, the histogram is used to detect a signal corresponding to the N pulse trains. For example, the CPOS can determine whether the histogram has a sequence of values that match the match-code (filter). The CPOS can report whether the match-code was found and the amplitude of the match. The match may allow detection of the desired signal relative to noise or interference from other light sources.

As an example, a filter can include a set of values to be applied to a window of time bins of a histogram. The filter can be slid over the histogram to calculate a filtered histogram having counters corresponding to different sliding positions of the profile filter relative to the histogram. Each of the counters of the filtered histogram can correspond to an overlap of the profile filter and the histogram at a particular sliding position. A maximum value of the counters of the filtered histogram can be identified, thereby allowing detection, e.g., when the maximum value is above a threshold. The particular sliding position for the maximum value of the counters can correspond to the received time, which may be used for ranging measurements.

In some embodiments, the signal may be a reflected signal caused by the N pulse trains reflecting from an object, e.g., when the optical measurement system is configured to perform ranging measurements. In other embodiments, the signal may be a communication signal, e.g., when the light source is at one location and the photosensors are at a different location. Such a configuration can be used for communication purposes. For example, a microwave transmission tower can transmit data to a receiving tower. The transmitted data can include coded pulses, which may help to reduce errors in data reception as may be caused by noise or interference from other sources. The receiving tower can identify pulse trains and create a histogram by selecting an arbitrary time between two pulse trains as a start time for a first time bin. A match filter can then be applied (e.g., by sliding over the histogram); and if a sufficient match is found, then that communication signal can be detected. A sufficient match can be measured by the maximum value obtained the filtered histogram. As a further embodiment, the system can detect an interference signal from another CPOS in a similar manner used to detect the communication signal. If interference is measured, some implementations can change the transmitted code, e.g., of the interference code is similar to the code currently being used.

At 980, a distance to the object can be determined. For example, a received time corresponding to the N pulse trains relative to the start signal can be determined. A distance to the object can be determined using the received time. The received time may be offset from the transmission times of the pulse trains, but such an offset can be taken into account. Accordingly, the CPOS can report the time at which it was detected. The distance can corresponds to a round trip time between the received time and a start time of the start signal, and thus the distance may be expressed in time.

The detected signal can be used for other purposes than ranging. For example, the quality of the detected signal can be used to measure the reflectivity of an object. For example, if the detected signal has a strong intensity, then the system can determine that the object has a high reflectivity. Implementations for communications and interference measurements are discussed above. For detection of interference from another light source, the detected signal would be from another set of pulse trains transmitted by the interfering light source.

As a generalization, embodiments can transmit N+1 unique codes with N+1 unique weights to generate an N dimensional vector space histogram. For example, instead of a bin holding a signed number, the bin can hold a 1-D vector (e.g., equivalent to a signed number), by transmitting at least two unique codes: one positive and one negative. To store a 2-D vector (e.g., in polar or Cartesian coordinates), the system can transmit at least three unique codes, which could be weighted with three different polar angles and sum to a single 2-D vector. An N-D vector (defined with N separate numbers all held within a single "bin") would require N+1 different codes, each weighted at a different angle (in other worlds having a component to its weight that is orthogonal to all other weights) when doing the vector summation. By increasing the dimensionality, more advanced coding techniques like quadrature phase coding or code division multiple access (CDMA) that are used in RF communications may be used. An N-dimensional matched filter can be used in this context.

As a LIDAR system implements method 900 during its operation, the LIDAR system can continuously measure distances to objects in the field. Accordingly, once the distance to an object is determined, method 900 can loop back to block 920 to begin another series of emitting pulse trains and detecting the emitted pulse trains to determine a histogram for determining a distance to an object in the field. Distances may need to be constantly measured by method 900 because the LIDAR system may need to be constantly measuring distances to objects in the field, such as when the LIDAR system is used for navigational purposes and the LIDAR system is moving within the field.

In some embodiments, after determining the distance to the object at block 980, method 900 can determine whether an exit command has been received by CPOS at block 990. If an exit command has been received, then method 900 can stop measuring distances at block 999, otherwise method 900 can continue measuring distances to objects by looping back to block 920.

As mentioned above, method 900 can be used to reduce interference among channels. For example, method 900 can be repeated for a plurality of channels of light sources and photosensors as part of a plurality of optical measurements. The plurality of optical measurements can overlap in time, e.g., performed substantially simultaneously. Thus, each channel can perform a measurement at the same time. To reduce interference, the codes can be different for at least some of the channels. For example, the pulse patterns of the N pulse trains of at least two channels of the plurality of channels can be different, thereby causing different histogram patterns for different channels. In addition or instead, the weights assigned to the N pulse trains of at least two channels of the plurality of channels can be different, thereby causing different histogram patterns for different channels.

IV. Construction of Active Imager Systems

Figure 10:
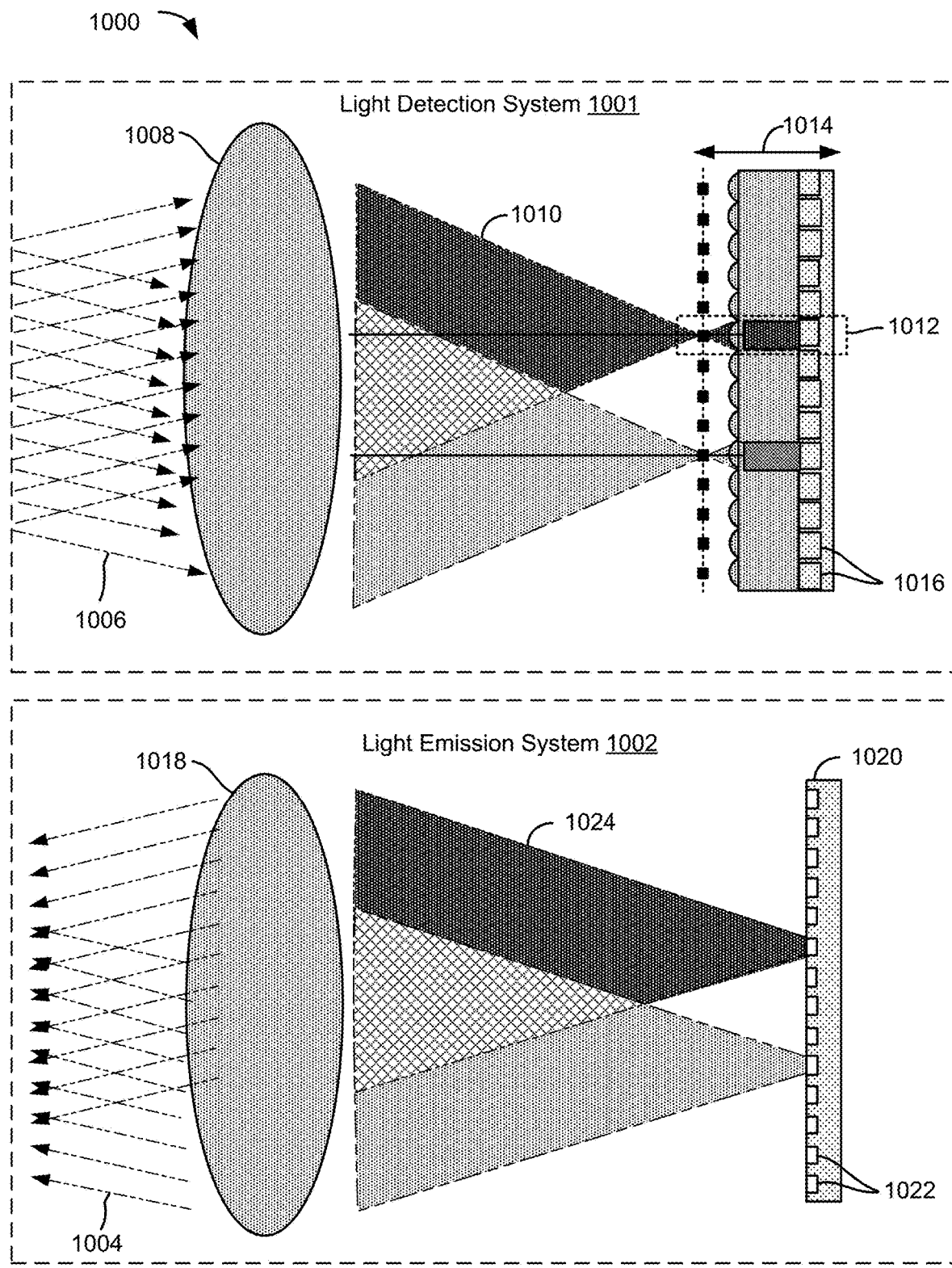
FIG. 10 is a simplified diagram illustrating a detailed view of an exemplary active optical imager system having a wide field-of-view and capable of narrowband imaging, according to some embodiments of the present disclosure.

FIG. 10 is a simplified diagram illustrating a detailed view of an exemplary active optical imager system 1000 having a wide field-of-view and capable of narrowband imaging, according to some embodiments of the present disclosure. Active optical imager system 1000 can employ solid state or scanning architectures as aforementioned herein. In some embodiments, active optical imager system 1000 can include a light detection system 1001 and a light emission system 1002, which is unlike passive optical imager systems. Light emission system 1002 provides active illumination of at least a portion of a field in which system 1000 is positioned with narrowband light rays 1004. Light detection system 1001 detects the narrowband light emitted from the light emission system 1002 after it has been reflected by objects in the field as reflected light rays 1006. Light detection system 1001 can be substantially similar to light detection system 200 discussed herein with respect to FIG. 2. Thus, details of bulk receiver optic 1008, light cone 1010, micro-optic receiver channel 1012 in micro-optic receiver layer 1014, and photodetectors 1016 can be referenced herein with respect to FIG. 2, and are not discussed herein for brevity.

In some embodiments, light emission system 1002 includes a bulk transmitter optic 1018 and a light emitting layer 1020 formed of a one- or two-dimensional array of light emitters 1022. Each light emitter 1022 can be configured to generate discrete beams of narrowband light. In some embodiments, light emitting layer 1020 is configured to selectively project the discrete beams of light through bulk transmitter optic 1018 according to an illumination pattern that matches, in size and geometry across a range of distances from light emission system 1002, the fields of view of the receiver channels in micro-optic receiver channel array 1014. Light emitters 1022 can be any suitable light emitting device, such as a vertical-cavity surface-emitting lasers (VCSELS) integrated on one or more monolithic chip, or any other type of laser diode. Light emitters 1022 can produce cones of narrowband light 1024 that are directed to bulk transmitter optic 1018, which can collimate cones of light 1024 and then output the collimated light to distant targets in the field as emitted light rays 1004. In some embodiments, bulk transmitter optic 1018 is image-space telecentric.

In additional and alternative embodiments, light rays 1004 from light cones 1024 are focused on an intermediate plane in space by a micro-optic transmitter layer (not shown) before being directed to distant targets by the bulk transmitter optic 1018 to enhance the brightness and intensity of light emitted from light emission system 1002. In such embodiments, embodiments, light emission system 1002 and light detection system 1001 are configured such that each micro-optic transmitter channel (not shown) is paired with a corresponding micro-optic receiver channel 1012 and the centers of their fields-of-view are aligned to be overlapping at a certain distance from the sensor or their chief rays are made parallel. In further additional and alternative embodiments, the far-field beams of light emitted by light emission system 1002 are of similar size and divergence angle to the far-field fields-of-view of each micro-optic receiver channel 1012. Details of light emission systems 1002 having the micro-optic transmitter layer for enhancing brightness and intensity of outputted light will be discussed in detail below.

As is evident from the illustration of parallel light rays 1004 and 1006 in FIG. 10, each micro-optic receiver channel 1012 has a non-overlapping field of view beyond a threshold distance. As shown in FIG. 10, each micro-optic receiver channel 1012 includes an aperture from the plurality of apertures, a lens from the plurality of lenses, and a photodetector from the plurality of photodetectors, where the aperture of each channel defines a discrete field of view for the pixel in the channel that is non-overlapping beyond a threshold distance within the fields of view of the other micro-optic receiver channels. That way, each micro-optic receiver channel receives reflected light corresponding to a discrete position in the field that is not measured by any other micro-optic receiver channel in micro-optic receiver channel layer 1014.

A. Enhancing Brightness and Intensity of Transmitters in Active Imager Systems

Embodiments of the present disclosure pertain to a LIDAR sensor that can, among other uses, be used for obstacle detection and avoidance in autonomous vehicles. Some specific embodiments pertain to LIDAR sensors that include design features that enable the sensors to be manufactured cheaply enough and with sufficient reliability and to have a small enough footprint to be adopted for use in mass-market automobiles, trucks and other vehicles. For example, some embodiments include a set of vertical-cavity surface-emitting lasers (VCSELs) as illumination sources that emit radiation into a field and include arrays of single-photon avalanche diode (SPAD) detectors as a set of photosensors (detectors) that detect radiation reflected back from a surface in the field. Using VCSELs as the emitters and SPADs as the detectors enables multiple measurements to be taken at the same time (i.e., the VCSEL emitters can be fired simultaneously) and also enables the set of emitters and the set of photosensors to each be fabricated using standard CMOS processes on a single chip, greatly simplifying the manufacturing and assembly process.

Using VCSELs and SPADs in certain embodiments presents challenges, however, that various embodiments of the present disclosure overcome. For example, VCSELs are much less powerful than typical lasers used in existing LIDAR architectures and SPADs are much less efficient than the typical detectors used in the existing LIDAR architectures. To address these challenges, as well as challenges presented by firing multiple emitters simultaneously, certain embodiments of the disclosure include various optical components (e.g., lenses, filters, and an aperture layer), which may work in concert with multiple arrays of SPADs, each array corresponding to a different pixel (e.g., position in the field), as described herein. For example, as discussed herein with respect to FIG. 2, a light detection system 200 can include a micro-optic receiver layer 204 for enhancing the light detected by photosensors 216, e.g., SPADs.

Because VCSELs are less powerful than typical lasers in existing LIDAR architectures, in some embodiments, light emission system 1002 can be configured to improve the ability of imager system 1000 to perform light ranging functionality. That is, the quality of light emitted by light emission system 1002 can be enhanced to improve light ranging accuracy and efficiency. The quality of transmitted light for light ranging and imaging purposes can be defined in terms of brightness and intensity. The brightness and intensity of light rays 1004 emitted from bulk transmitter optic 1018 can be enhanced by modifying and/or implementing one or more optic transmitter layers, as will be discussed further herein.

Brightness of a transmitting light can be defined by the optical power (in watts) per solid angle. Thus, light sources that output light with tight collimation, i.e., low divergence, produce light that are high in brightness. Conversely, light sources that output light with high divergence produce light that are low in brightness. Intensity of light can be defined by the optical power per area, meaning light emitted with a certain power will have higher intensity if it tightly compacted in a small area. Accordingly, light sources that output light in a tightly compacted ray will have higher intensity than light sources that output light in a less compacted ray, even if both light sources output light that has low divergence. As will be appreciated herein, transmitter components for LIDAR systems in embodiments of the present disclosure can be configured with micro-optical components that enable the transmitter to output light that has enhanced brightness and intensity as compared to a similar transmitter without the micro-optical components.

Figure 11:
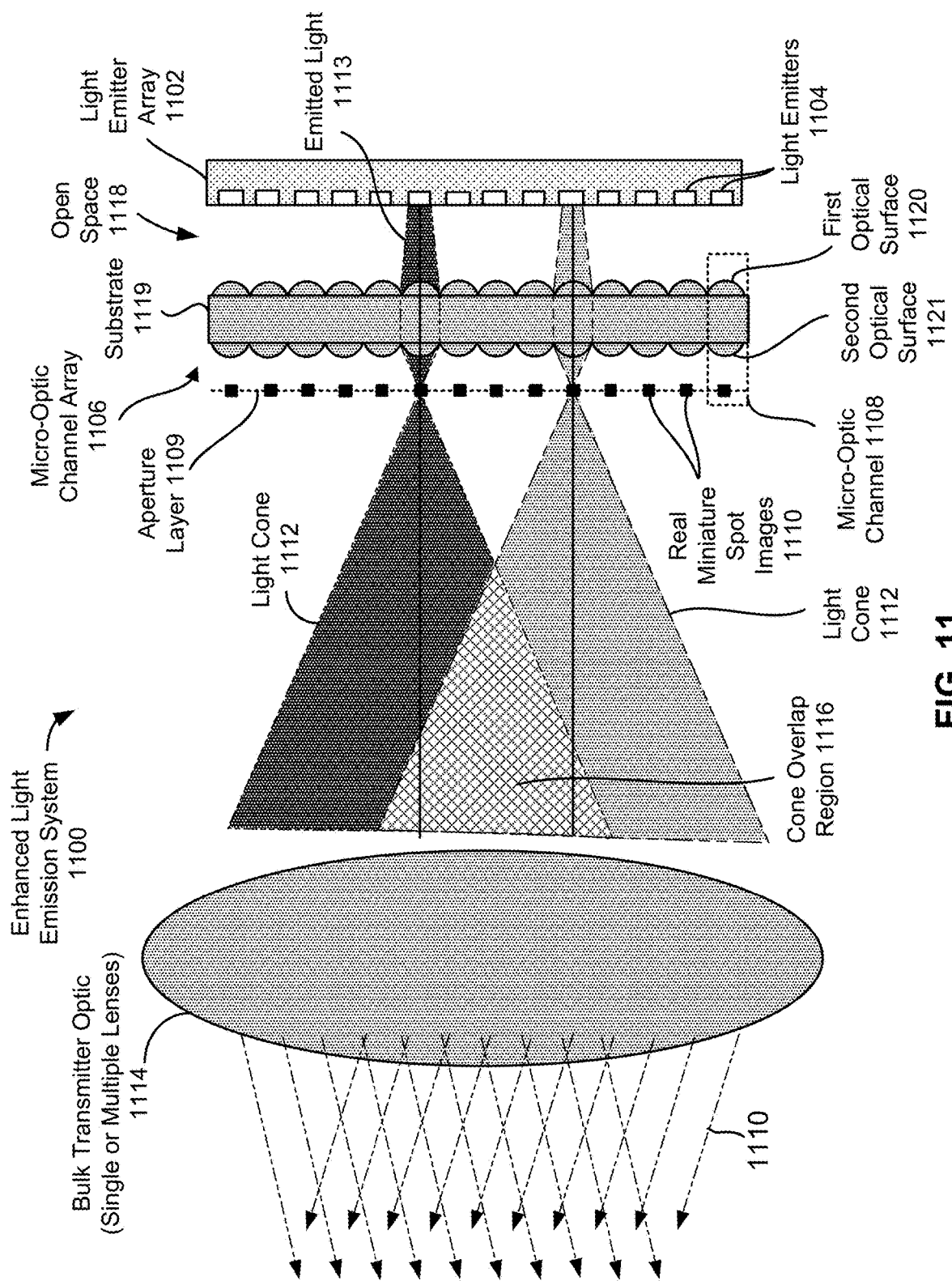
FIGS. 11-14 are simplified cross-sectional view diagrams of various exemplary enhanced light emission systems, according to some embodiments of the present disclosure.

FIG. 11 is a simplified cross-sectional view diagram of a first exemplary enhanced light emission system 1100, according to some embodiments of the present disclosure. Light emission system 1100 can include a light emitter array 1102 having light emitters 1104 that for example may comprise without limitation any of LEDs, laser diodes, VCSELs, or the like for emitting light 1113. A VCSEL is a type of semiconductor laser diode with laser beam emission perpendicular from the top surface. Note that the linear array shown in FIG. 11 can be any geometric form of emitter array, including and without limitation circular, rectangular, linear, or any other geometric shape.

Enhanced light emission system 1100 can include a micro-optic transmitter channel array 1106 separated from light emitter array 1102 by an open space 1118. Each micro-optic transmitter channel 1108 is paired with a corresponding receiver channel (e.g., receiver channel 1012 in FIG. 10) and the centers of their fields-of-view are aligned to be overlapping at a certain distance from the optical imager system. Micro-optic transmitter channel array 1106 can be formed of a substrate 1119 sandwiched between a first optical surface 1120 positioned on a side facing light emitter array 1102 and a second optical surface 1121 positioned on an opposite side facing away from light emitter array 1102. Both first and second optical surfaces 1120 and 1121 can each be configured as an array of convex, micro-optic lenses where each convex lens of first optical surface 1120 is configured to be optically aligned with a respective convex lenses of second optical surface 1120 so that light transmitting through first optical surface 1120 can subsequently be transmitted through second optical surface 1121. The corresponding convex lenses from first and second optical surfaces 1120 and 1121 can face away from one another as shown in FIG. 11. In certain embodiments, convex lenses of first optical surface 1120 have a first optical power and convex lenses of second optical surface 1121 have a second optical power different from the first optical power. For instance, the second optical power can be greater than the first optical power such that the focal length of the second optical power is shorter than the focal length of the first optical power. Substrate 1119 can be formed of any suitable material that is transmissive in the wavelength range of the light emitters 1104 such silicon, silicon dioxide, borosilicate glass, polymer, and the like. First and second optical surfaces 1120 and 1121 can be formed of a transparent polymer that is imprinted on respective opposite surfaces of substrate 1119.

In some embodiments, micro-optic transmitter channel array 1106 can be formed of a monolithic array of micro-optic transmitter channels 1108. Each micro-optic transmitter channel 1108 can include a first convex lens from first optical surface 1120, a corresponding second convex lens from second optical surface 1121, and a corresponding portion of substrate 1119 positioned between the two convex lenses. Each micro-optic transmitter channel 1108 can correspond with a respective light emitter 1104 so that light outputted from the light emitter 1104 first passes through the first convex lens, through the corresponding region of substrate 1119, and then through the second convex lens during operation.

Once light emits out of the second convex lens of second optical surface 1121, the light forms a miniature spot image 1110 that is a real image of the corresponding light emitter 1104 but a reduced-size of the corresponding light emitter 1104. In some embodiments, miniature spot images 1110 are positioned between micro-optic transmitter channel array 1106 and bulk transmitter optic 1114. For instance, miniature spot images 1110 can be formed within respective apertures of an aperture layer 1109. Each aperture can be a pin hole in a reflective or opaque layer in which emitted light focuses to form miniature spot images 1110. From there, continuing away from both the light emitter and micro optic channel, the light forms a light cone 1112 reaching out towards bulk transmitter optic 1114.

According to some embodiments of the present disclosure, the degree of divergence of emitted light 1113 can be smaller than the degree of divergence of light cone 1112. This discrepancy in divergence can be created by a micro-optic transmitter channel 1108, specifically by the optical power of second optical surface 1121. Because the divergence of light out of micro-optic transmitter channel 1108 is larger than the divergence of emitted light 1113 from light emitters 1104, miniature spot image 1110 can be a real image of light emitter 1104 but a multitude smaller than the size of light emitter 1104 and with the same number of photons as emitted light 1113. The resulting light cone 1112 formed after the real spot images are formed then gets projected into the field as discrete beams of light for each light emitter 1104 after passing through bulk transmitter optic 1114. The resulting light rays emanating out of light emission system 1100 are highly collimated beams of light that have a small cross-sectional area (smaller than the surface area of light emitter 1104), thereby resulting in a light emission system 1100 that can output light having enhanced brightness and intensity.

Note that bulk transmitter optic 1114 can include either a single lens or a cluster of lenses where two or more lenses function together to form bulk transmitter optic 1114. The use of multiple lenses within the bulk transmitter optic 1114 could increase the numerical aperture, reduce the RMS spot size, flatten the image plane, improve the telocentricity, or otherwise improve the performance of bulk transmitter optic 1114. Note also that for some embodiments, light cones 1112 may overlap forming cone overlap region 1116.

To better understand the operation and effectiveness of micro-optic transmitter channel array 1106, a more detailed explanation of the operation of light emission system 1100 is discussed. For enhanced light emission systems 1100 utilizing a light emitter array formed of VCSEL emitters, an exemplary initial radius for an emitter might be 12.5 um with light admitted in a 10° half angle cone. Such emitters would typically output 50 uW per square micron of active area. A diverging light cone from each emitter 1104 is accepted into a micro-optic transmitter channel 1108, and then a converging light cone is output by that same micro optic channel to produce a converging light cone with a half angle of for example 20°. Thus for some embodiments, the cone angle produced by an emitter 1104 is smaller than the cone angle produced by a corresponding micro-optic transmitter channel 1108. The converging light cone emanated by micro-optic transmitter channel 1108 then produces a miniature spot image 1110 of the emitter. For the embodiment according to FIG. 11, miniature spot image 1110 is a real image and has a size that is smaller than the size of a corresponding light emitter 1104. Note that all rays from a given emitter may not all be focused into an arbitrarily small spot. The miniature spot image size is typically controlled by an "optical invariant":

$$\Theta\_s * r\_s >= \Theta\_e * r\_e$$

where $\Theta\_s$ is the marginal ray half angle of the focused spot, $r\_s$ is the radius of the focused spot, $\Theta\_e$ is the marginal ray half angle of the original emitter, and $r\_e$ is the radius of the original emitter. So, in this example, the smallest miniature spot image radius that could be formed (while still capturing all the rays from the emitter) is:

$$10/20 * 12.5 \text{ um} = 6.25 \text{ um}$$

Note that this smaller spot will have one fourth the area of the original emitter, and thus has a power density of 200 uW per square micron of spot area. Each micro-optic transmitter channel 1108 typically has one or more optical surfaces, having characteristics that may for example and without limitation include a focal length of 50 um, and a lens diameter of 80 um. For some embodiments, the distance between light emitter 1104 and a corresponding micro-optic transmitter channel 1108 may be for example and without limitation 150 um. Open space 1118 between emitter array 1102 and micro-optic transmitter channel array 1106 as shown in FIG. 11 may be, for example and without limitation an air gap such as that produced by methods typically used to manufacture MEMS devices. The distance between emitter array 1102 and micro-optic transmitter channel array 1106 for example may be 150 um.

Bulk transmitter optic 1114 is positioned in front of the micro-optic and emitting layers such that the focal plane of the bulk imaging optic coincides with miniaturized spot images 1110. Bulk transmitter optic 1114 accepts divergent light cone(s) 1112 and outputs a collimated beam. Its numeric aperture can be at least large enough to capture the full range of angles in the divergent ray cone(s), so for example and without limitation the Numerical Aperture (NA)=0.34 in this example. Also, bulk transmitter optic 1114 can be image-space telecentric, since light cone(s) 1112 exiting the micro-optic layer may all be parallel (rather than having their center axes aimed towards the center of the bulk optic). In one embodiment, light can exit bulk transmitter optic 1114 approximately collimated. Note that the quality of beam collimation relates to the size of the "emitting object" (miniature spot images 1110) at the focal plane. Since this "emitting object" size has been reduced by using a micro-optic stack, a better collimation angle is obtained than if the emitter object was simply imaged directly.

Although FIG. 11 shows an enhanced light emission system having a micro-optic channel array formed of a substrate sandwiched between first and second optical surfaces, and positioned a distance away from a light emitter array by an open space to improve the brightness and intensity of light outputted by the light emission system, embodiments are not limited to such configurations. Rather, other embodiments may not necessarily implement an open space or two optical surfaces, as discussed further herein with respect to FIG. 12.

Figure 12:
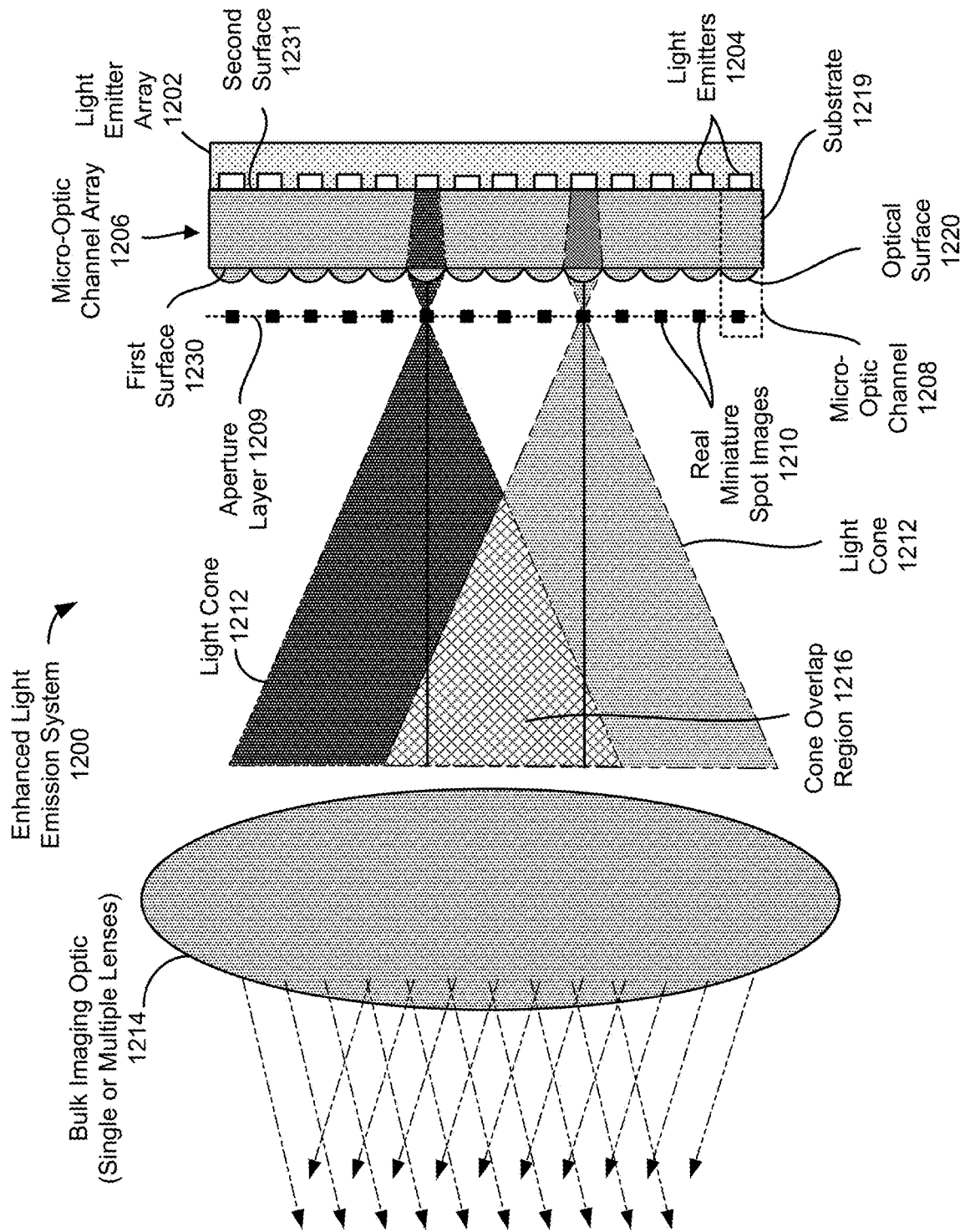

FIG. 12 is a simplified cross-sectional view diagram of a second exemplary enhanced light emission system 1200, according to some embodiments of the present disclosure. Similar to first exemplary enhanced light emission system 1100, second exemplary enhanced light emission system 1200 can include bulk imaging optic 1214 and light emitter array 1202. However, unlike first exemplary light emission system 1100, second exemplary light emission system 1200 can include a micro-optic transmitter channel array 1206 that is positioned directly upon an emission surface of light emitter array 1202 instead of being separated by an open space/air gap, as shown in FIG. 12.

In such embodiments, micro-optic transmitter channel array 1206 can be formed of a substrate 1219 and an optical surface 1220. Optical surface 1220 can be positioned on a first surface 1230 of substrate 1219. Second surface 1231 of substrate 1219 can be located opposite of first surface 1230 and positioned against light emitter array 1202 so that light emitted from emitters 1204 can first pass through substrate 1219 before passing through optical surface 1220. Optical surface 1220 can be configured as an array of convex lenses where each convex lens of optical surface 1220 is configured to be optically aligned with a respective light emitter 1204 so that light outputted by the respective light emitter 1204 can transmit through the respective convex lens of optical surface 1220. Convex lenses from optical surface 1220 can face away from their respective light emitters 1204 as shown in FIG. 12 so that their focal points are positioned further from light emitter 1204. In certain embodiments, convex lenses of optical surface 1220 have an optical power suitable for converging the emitted light into real miniature spot images 1210 that are real images of corresponding light emitters 1204 but reduced-size images of the corresponding light emitters 1204 like the convex lenses of second optical surface 1121 in FIG. 11. Optical surface 1120 enables the emitted light to diverge into light cones 1212 before projecting through bulk imaging optic 1214. Substrate 1219 and optical surface 1220 can be formed of similar materials as substrate 1119 and optical surfaces 1120 and 1121 discussed herein with respect to FIG. 11. In some embodiments, light cones 1212 may overlap forming cone overlap region 1216.

Embodiments herein can also implement micro-optic channel arrays that do not include convex lenses and that do not generate real images of the light emitters. Rather, some embodiments may implement concave surfaces to generate virtual images of the light emitters, as discussed further herein with respect to FIG. 13.

Figure 13:
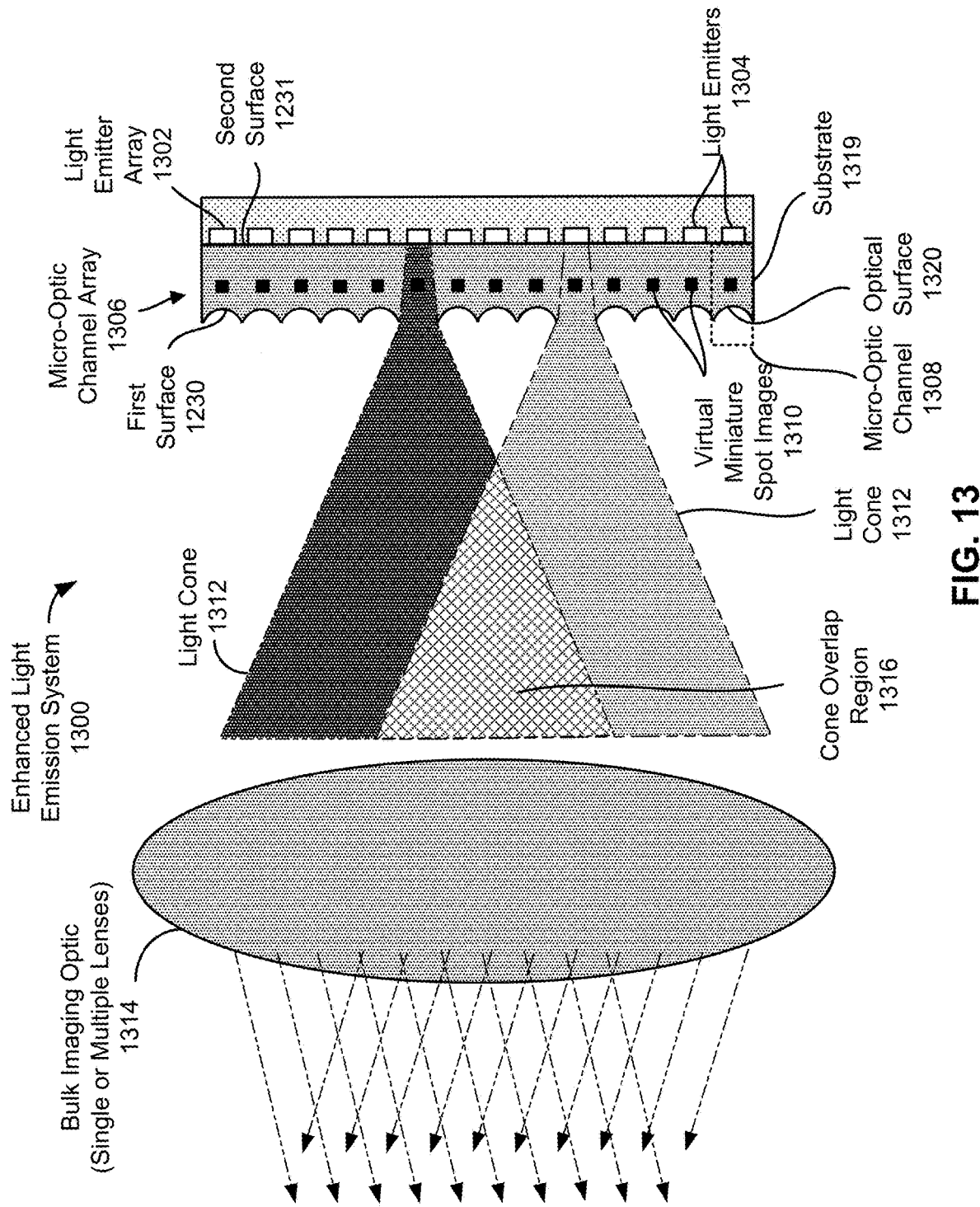

FIG. 13 is a simplified cross-sectional view diagram of a third exemplary enhanced light emission system 1300, according to some embodiments of the present disclosure. Similar to first and second exemplary enhanced light emission systems 1100 and 1200, third exemplary enhanced light emission system 1300 can include bulk imaging optic 1314 and light emitter array 1302. However, unlike first and second exemplary light emission systems 1100 and 1200, third exemplary light emission system 1300 can include a micro-optic transmitter channel array 1306 that includes an array of concave surfaces instead of an array of convex lenses, as shown in FIG. 13.

In such embodiments, micro-optic transmitter channel array 1306 can be formed of a substrate 1319 and an optical surface 1320. Optical surface 1320 can be a first surface 1330 of substrate 1319 positioned toward bulk imaging optic 1314 and away from light emitters 1304. Second surface 1331 of substrate 1319 can be located opposite of first surface 1330 and positioned against light emitter array 1302 so that light emitted from emitters 1304 can first pass through substrate 1319 before passing through optical surface 1320. Optical surface 1320 can each be configured as an array of concave surfaces where each concave surface of optical surface 1320 is configured to be optically aligned with a respective light emitter 1304 so that light outputted by the respective light emitter 1304 can transmit through the respective concave surface of optical surface 1320. In certain embodiments, the concave surfaces of optical surface 1320 have an optical power suitable for forming virtual miniature spot images 1310 that are virtual images of corresponding light emitters 1304 but reduced-size images of the corresponding light emitters 1304, and further enable the emitted light to diverge into light cones 1312 before projecting through bulk imaging optic 1314. In some embodiments, virtual miniature spot images 1310 are formed within substrate 1319 as shown in FIG. 13. In some embodiments, light cones 1312 may overlap forming cone overlap region 1316. Substrate 1319 can be formed of similar materials as substrate 1119 discussed herein with respect to FIG. 11.

Note that the lens configurations for the micro-optic channels for embodiments described in each of FIGS. 11, 12 and 13 differs with respect to how many surfaces have optical power and the shapes of those surfaces. The first embodiment shown in FIG. 11 benefits from the ability to use two optical power surfaces on opposite sides of a substrate, which could allow each surface to be shallower, spherical rather than aspherical, or otherwise more easily manufactured. This embodiment includes a spacer structure (not shown) to maintain an offset between the micro-optic channel array 1106 and the light emitter array 1102. An example of such a spacer structure would be a silicon wafer with channels formed via deep reactive ion etching. The second embodiment shown in FIG. 12 benefits from having only one optical power surface on a substrate that is attached to the light emitter array. This type of configuration simplifies fabrication while also achieving enhanced brightness and intensity. The third embodiment shown in FIG. 13 shares the benefits of the embodiment shown in FIG. 12 but has a single optical surface that is formed of concave surfaces rather than convex lenses; concave features can often be easier to fabricate at the micro-scale.

Figure 14:
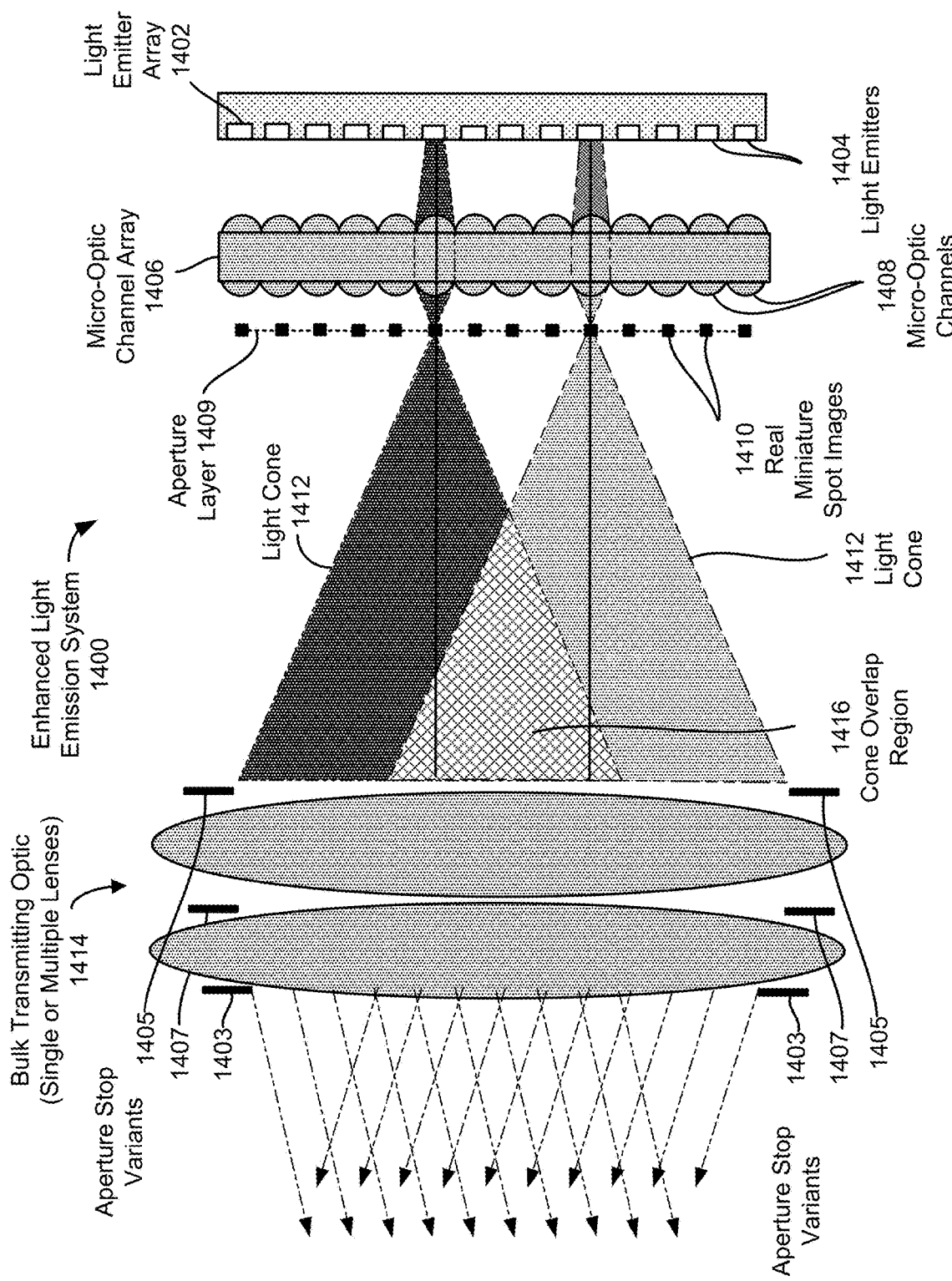

In some embodiments, bulk imaging optics for light emission systems can include one or more aperture stops to reduce stray light emitted by the system. For instance, FIG. 14 is a simplified cross-sectional view diagram of an exemplary enhanced light emission system 1400 configured with bulk optics that have aperture stops, according to some embodiments of the present disclosure. FIG. 14 is substantially similar to FIG. 1 with the addition of aperture stop variants 1403, 1405, and 1406 for bulk transmitter optic 1414. Aperture stop(s) shown in FIG. 14 can be used with any of FIGS. 11 through 13. In FIG. 14, aperture stops 1403, 1405, and 1407, can have circular or oval openings for light to pass through, although any opening shape may be utilized without deviating from the spirit and scope of the present disclosure.

In some embodiments, aperture stop 1403 can be located on a side of bulk transmitter optic 1414 facing away from light emitter array 1402 and micro-optic transmitter channel array 1406. In some additional and alternative embodiments, aperture stop 1405 can be located on a side of bulk transmitter optic 1414 facing toward light emitter array 1402 and micro-optic transmitter channel array 1406. In yet some additional and alternative embodiments where bulk receiver optic 114 includes a plurality of lenses working together, aperture stop 1407 can be formed of one or more aperture stops placed within the plurality of lenses that form bulk transmitter optic 1414.

The various configurations and locations of aperture stops 1403, 1405, and 1407 can dictate the way each aperture stop functions in the light emitting system. For example, if all the light cones 1412 are compressed to be substantially overlapping near the location of aperture stop 1407, then the size of the aperture stop 1407 would be able control both the initial diameter of the emitted collimated beams as well as reject the marginal rays emitted by light emitters 1404. Rejecting certain ray angles could effectively narrow the spectrum of light emitted out of the bulk optic, since the wavelength of light emitted by many types of lasers varies with angle. Alternatively, perhaps this best location for the aperture stop would occur at 1402 or 1403, depending upon the design of the bulk transmitter optic 1414. Multiple aperture stops may be used simultaneously—e.g. 1402, 1403, and 1404 all in one bulk transmitter optic 1414—to reduce stray light emitted by light emitting system 1400.

B. Optical Corrections for Astigmatism

As mentioned herein with respect to FIG. 7, light detection systems and light emission systems can be enclosed within the same protective structure, e.g., stationary housing 702, optically transparent window 704, and stationary lid 706 in FIG. 7. Light emitted from the light emission system, in some embodiments, exits out of transparent window 704, and light detected by light detection system may first enter into transparent window 704. The curvature of transparent window 704 can induce some optical aberrations, such as astigmatism. Because the transparent window can have a cylindrical structure and be well-controlled, it can be corrected with one or more additional optical structures. In some embodiments, light emission and/or detection systems can be configured with corrective optical structures to compensate for the astigmatism caused by the transparent window, as discussed further herein.

Figure 15A:
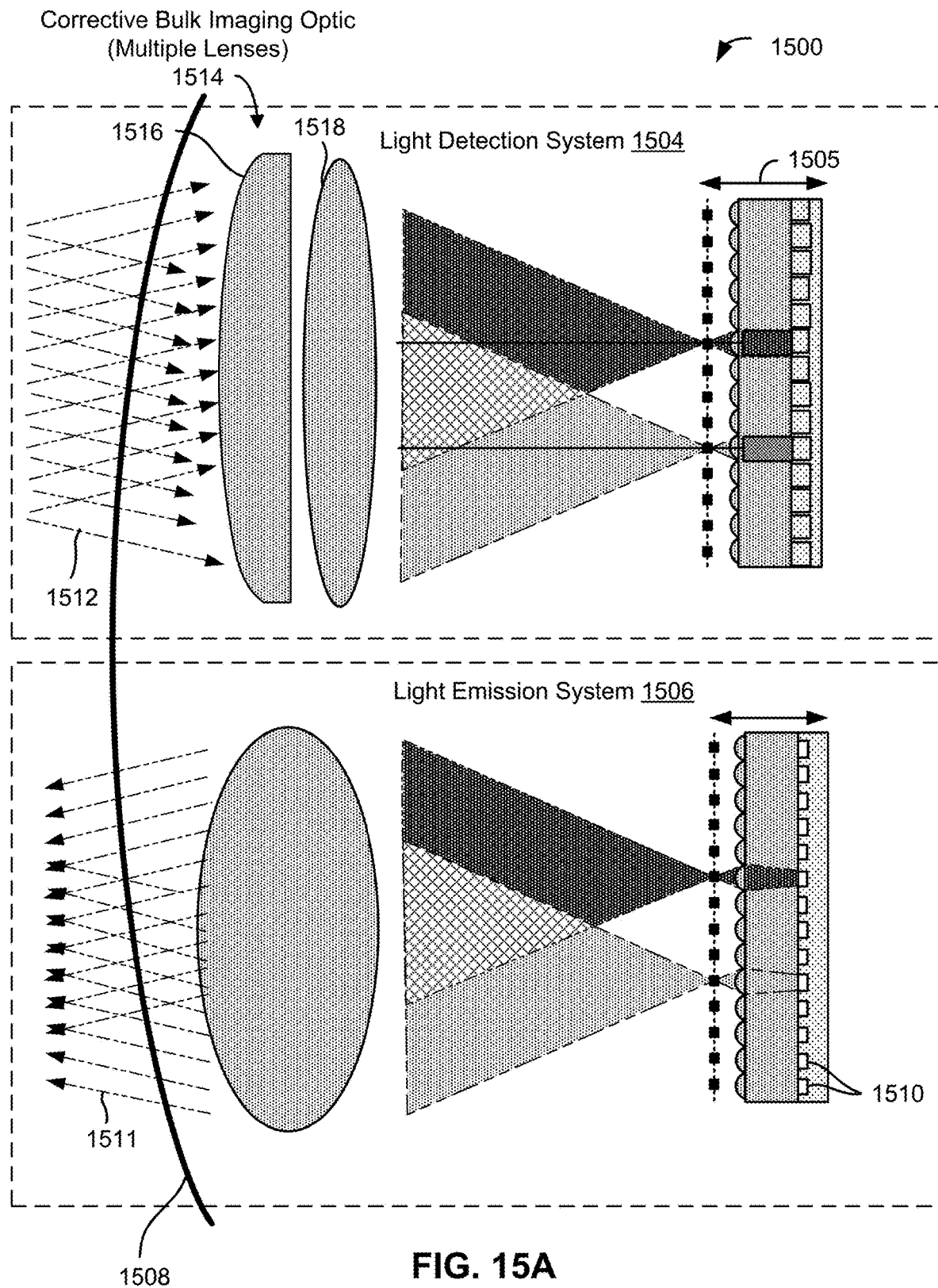
FIGS. 15A-15C are cross-sectional views of simplified diagrams of exemplary active imager systems having different implementations of corrective optical structures for astigmatism, according to some embodiments of the present disclosure.
Figure 15B:
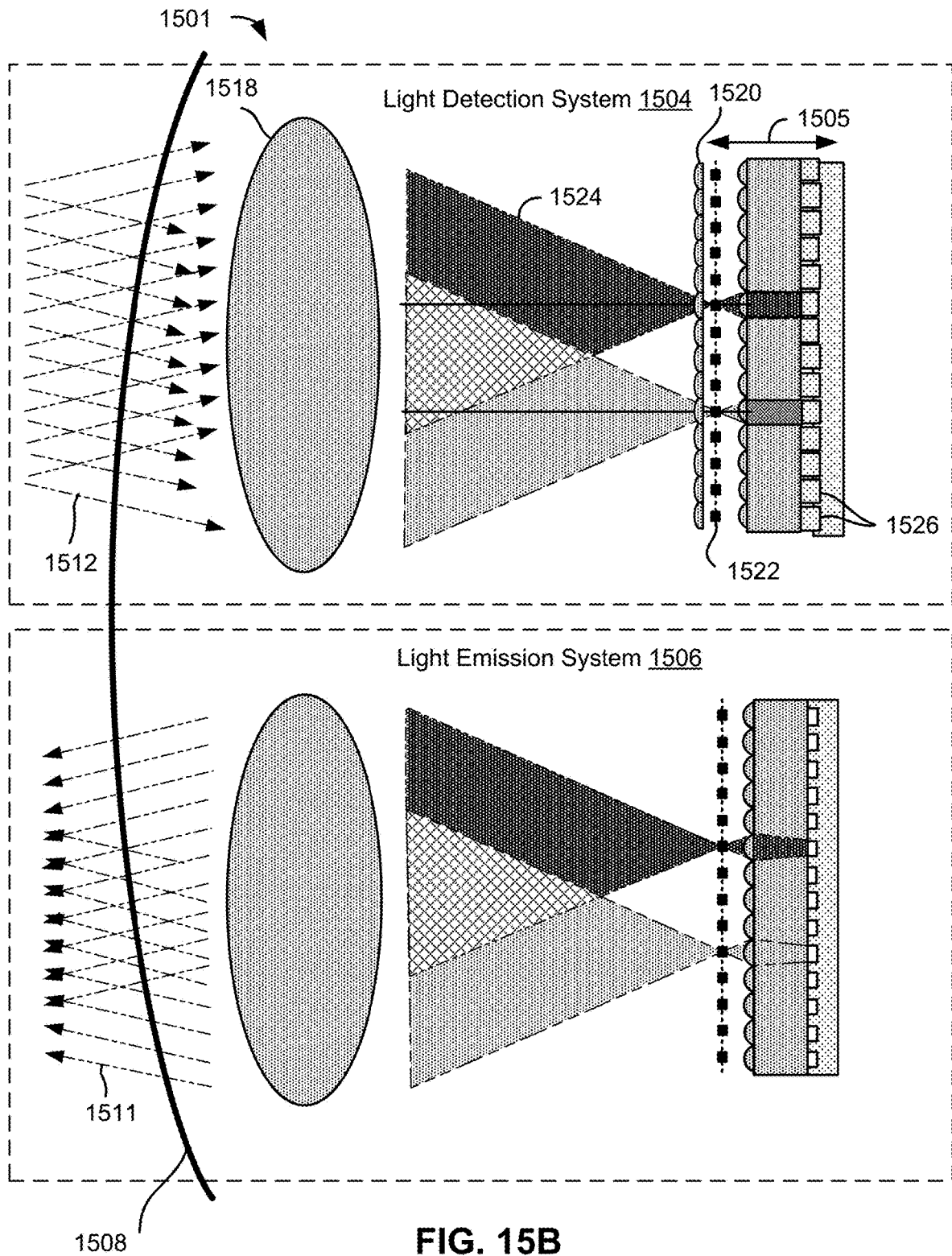
Figure 15C:
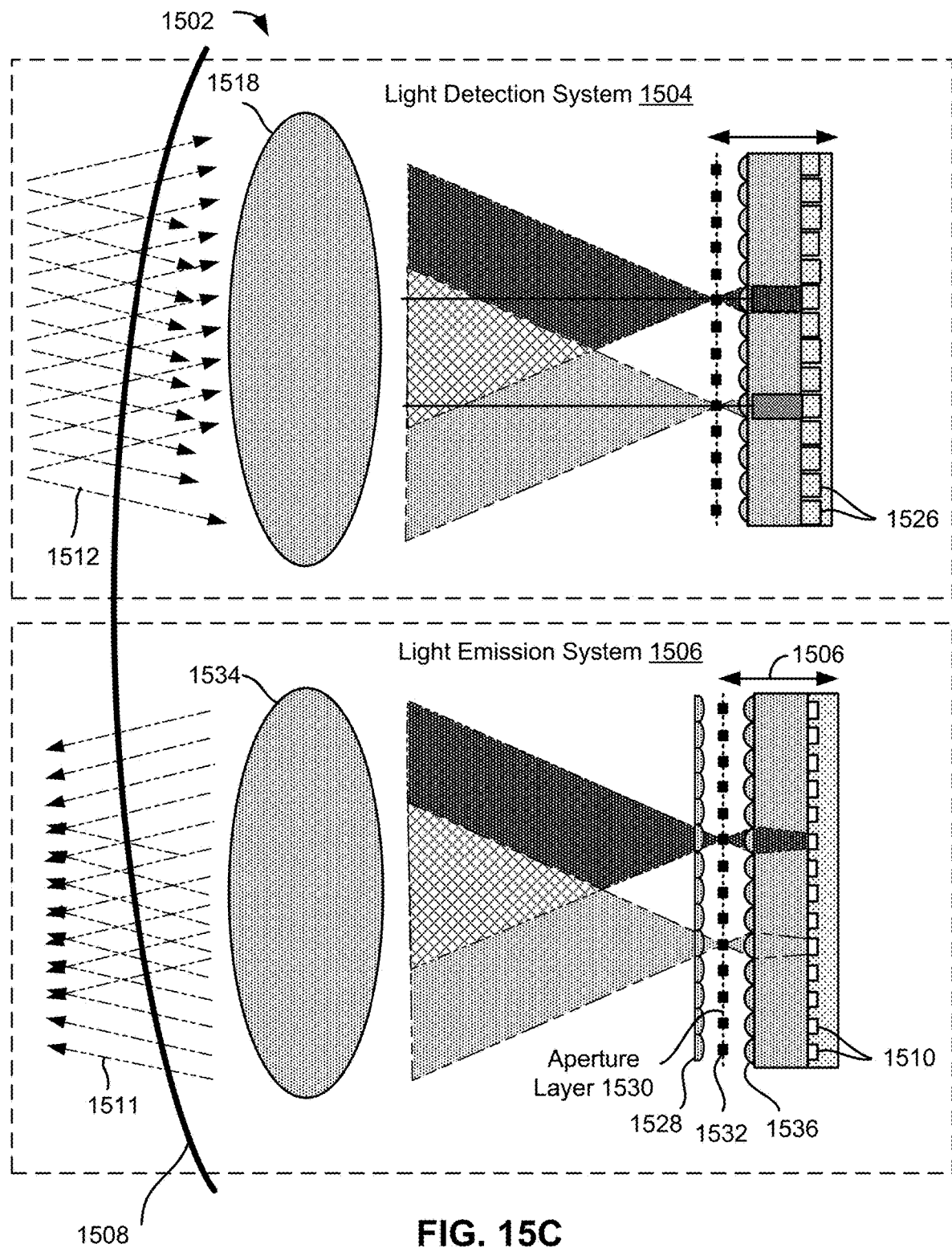

FIGS. 15A-15C are cross-sectional views of simplified diagrams of exemplary active imager systems having different implementations of corrective optical structures for astigmatism, according to some embodiments of the present disclosure. Specifically, FIG. 15A is a simplified cross-sectional view diagram of an active imager system 1500 having a corrective optical structure as part of the bulk imaging optic, FIG. 15B is a simplified cross-sectional view diagram of an active imager system 1501 having a corrective optical structure as part of the micro-optic receiver channel array, and FIG. 15C is a simplified cross-sectional view diagram of an active imager system 1502 having a corrective optical structure as part of the micro-optic transmitter channel array. Active imager systems 1500, 1501, and 1502 each include a light detection system 1504 and a light emission system 1506. Components of active imager systems 1500, 1501, and 1502 are substantially similar to active optical imager system 1000 in FIG. 10 with the addition of the corrective optical structures. Thus, the components that are shared with active optical imager system 1000 are not discussed for brevity.

As shown in FIG. 15A, active imager system 1500 can be housed within an enclosure containing a transparent window 1508. Transparent window 1508 is at least transparent to the wavelength of light at which emitters 1510 operate. The curved shape of transparent window 1508 can induce an optical aberration, such as an astigmatism, in light rays 1511 emitted from light emission system 1506 when light rays 1511 exit the enclosure through transparent window 1508. Light rays 1512 then enter back into the enclosure through transparent window 1508 after reflecting off of an object in the field, which can induce an additional optical aberration to the received light rays. To correct for these optical aberrations, light detection system 1504 can include corrective bulk imaging optic 1514 specifically designed to compensate for the expected astigmatism induced by transparent window 1508. For example, corrective bulk imaging optic 1514 can include a corrective lens 1516 in addition to bulk receiver optic 1518. Corrective lens 1516 can be any suitable lens capable of negating the astigmatism caused by transparent window 1508, such as a cylindrical lens. Corrective lens 1516 can be positioned between transparent window 1508 and bulk receiver optic 1518 in some embodiments, or between bulk receiver optic 1518 and micro-optical receiver channel array 1505 in some other embodiments. Similarly, a corrective bulk optic could be included in the bulk transmitter optic of the light emission system 1506.

Instead of incorporating the corrective optics into the bulk imaging optics, the corrective optics can be implemented into a micro-optical receiver channel array in some embodiments. For instance, with reference to FIG. 15B, light detection system 1504 can include a corrective lens array 1520 in front of apertures 1522, e.g., on the opposite side of apertures 1522 from where photosensors 1526 are positioned. That way, light cones 1524 can propagate through respective corrective lenses to compensate for astigmatism caused by transparent window 1508 before projecting on photosensors 1526. In some embodiments, corrective lens array 1520 is formed of an array of cylindrical lenses that can negate the astigmatism caused by transparent window 1508. Each corrective lens of corrective lens array 1520 can be positioned in alignment with a respective aperture 1522 so that corrective lens array 1520 can negate the astigmatism caused by transparent window 1508 for light received by each photosensor 1526.

Although FIGS. 15A and 15B illustrate ways in which a light detection system portion of a LIDAR system can be modified to correct for astigmatism caused by transparent window 1508, embodiments are not limited to such configurations and corrective optics can be implemented in light emission systems as well. For example, with reference to FIG. 15C, active imager system 1502 can include a corrective lens array 1528 in front of aperture layer 1530, e.g., on the opposite side of aperture layer 1530 from where light emitters 1510 are positioned. That way, light emitted from light emitters 1510 can propagate through respective corrective lenses 1528 before emitting to bulk transmitter optics 1534. In this case, respective corrective lenses 1528 can induce a corrective degree of astigmatism in the emitted light in anticipation of, and to compensate for, the astigmatism caused by transparent window 1508 as light is emitted out of light emission system 1506. In some embodiments, corrective lens array 1528 is formed of an array of biconical lenses that can induce an equal but opposite degree of astigmatism caused by transparent window 1508. Thus, the amount of astigmatism induced by corrective lens layer 1528 can be offset by the degree of astigmatism caused by transparent window 1508, thereby effectively achieving little to no net astigmatism during operation of active imager system 1502. Each corrective lens of corrective lens array 1528 can be positioned in alignment with a respective aperture 1532 so that corrective lens array 1528 can induce a corrective degree of astigmatism to negate the astigmatism caused by transparent window 1508 for light received by each photosensor 1526. In some embodiments, corrective lens array 1528 may not be needed. Instead, optical surface 1536 can be an array of biconical lenses instead of an array of cylindrical lenses. The biconical structure of the lenses can induce an amount of astigmatism to offset the degree of astigmatism caused by transparent window 1508. In these embodiments, corrective lens array 1528 may not be implemented in light emission system 1506. Furthermore, in some embodiments, instead of (or in conjunction with) a corrective micro-optic lens array, a corrective bulk cylindrical lens can be implemented with bulk receiver optic 1534 (similar to the embodiment shown in FIG. 15A for light detection system 1504). Thus, light emission system 1506 can include a corrective bulk imaging optic in front of its bulk receiver optic 1534 to negate the astigmatism caused by transparent window 1508.

V. Mitigating Receiver Channel Cross-Talk

As can be appreciated by disclosures herein, channels in the micro-optic receiver and are positioned very close to one another, often times within microns of one another. This small spacing between each channel can invite the opportunity for problems to arise. For instance, light propagating through bulk imaging optic can occasionally cause stray light to bleed into neighboring channels, thereby resulting in inaccurate readings of reflected light for each pixel in the field. Ideally, no stray light should be received by any channel, as shown in FIG. 16A.

Figure 16A:
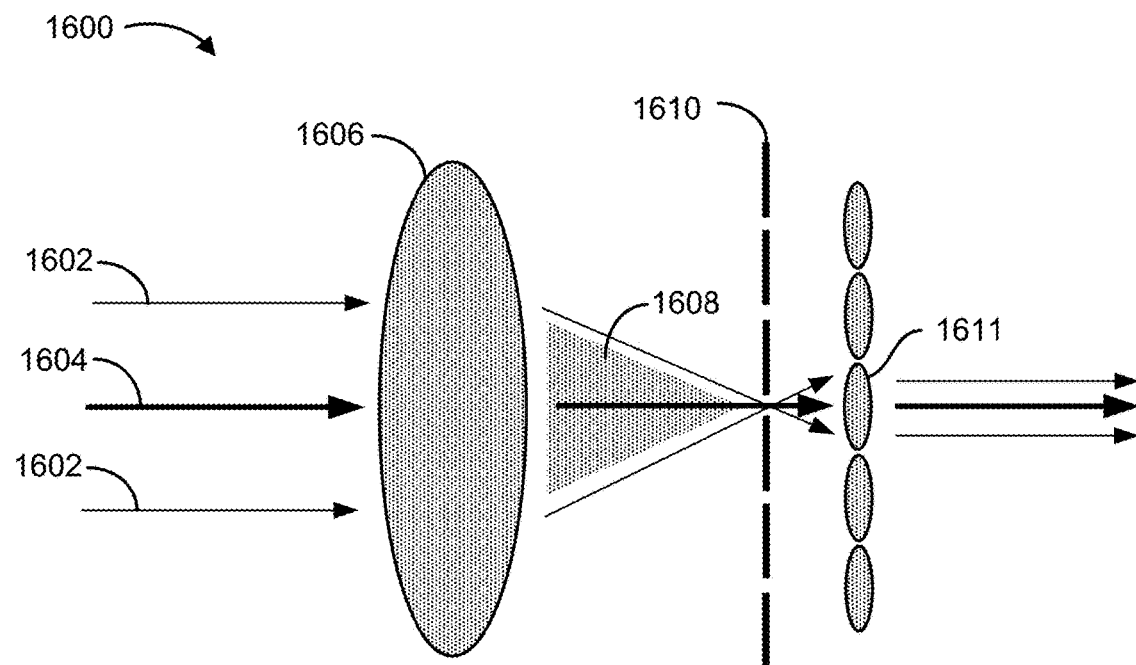
FIG. 16A is a simplified cross-sectional view diagram of part of a light detection system 1600 where there is no cross-talk between channels.

FIG. 16A is a simplified cross-sectional view diagram of part of a light detection system 1600 where there is no cross-talk between channels. During operation, perpendicular light rays 1602 and chief ray 1604 enter the bulk imaging optic 1606 and produce light cone 1608. Light rays 1602 and 1604 enter an aperture of aperture layer 1610 and enter collimating lens 1611. Collimating lens 1611 accepts a limited range of incident light angles. For example, collimating lens 1611 can accept light rays at incident angles between +25 to −25 degrees relative to the perpendicular. FIG. 16A shows light cone 1608 with incident angles between +25 to −25 degrees. The chief ray 1604 is the light ray that passes through the center of the aperture. In this example, the chief ray 1604 has an incident angle of 0 degrees on the collimating lens 1611.

Figure 16B:
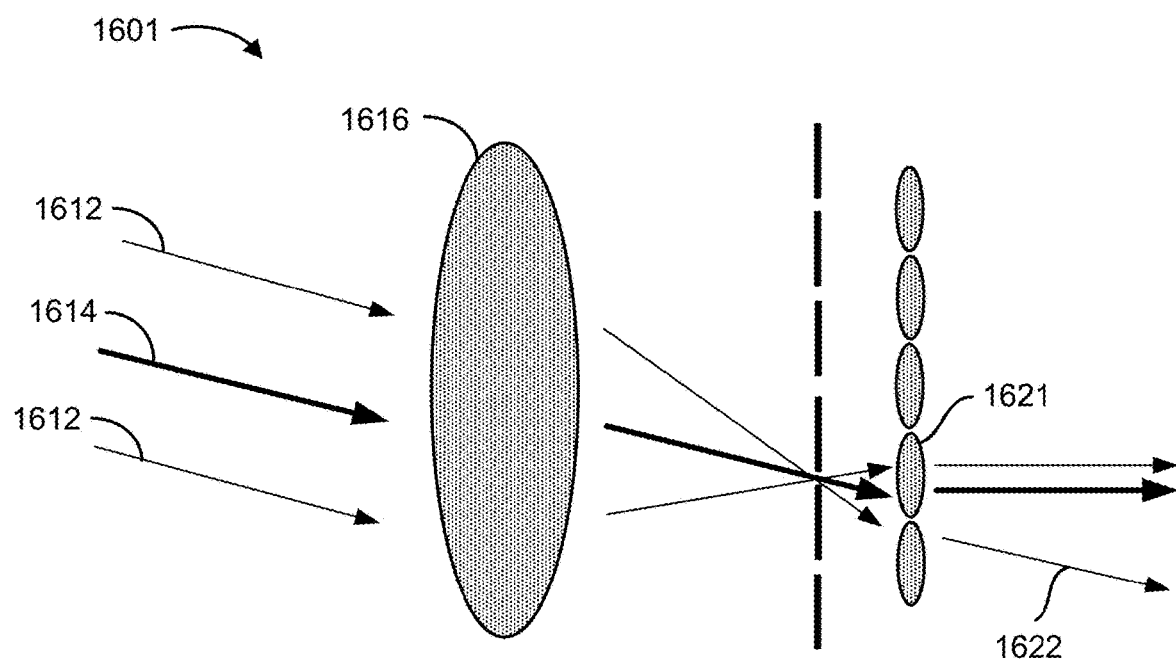
FIG. 16B is a simplified cross-sectional view diagram of part of a light detection system 1601 where there is cross-talk between channels.

FIG. 16B is a simplified cross-sectional view diagram of part of a light detection system 1601 where there is cross-talk between channels. In this case, during operation, oblique light rays 1612 and chief ray 1614 enter bulk receiver optic 1616 and later enter collimating lens 1621. In this example, collimating lens 1621 belongs to a micro-optic channel that corresponds to a photosensor further from the center of the image. In this example, chief ray 1614 has an incident angle of −12 degrees and the cone of focused light has incident angles between +12 degrees to −35 degrees. Collimating lens 1621 rejects some of the light rays because it only accepts light with incident angles between +25 to −25 degrees. Additionally, the rays that are outside of the collimating lens acceptance cone can travel to other optical surfaces and become stray light. Thus, a non-telecentric bulk imaging optic will deliver significantly fewer signal photons to the photodetector, while potentially polluting other channels with errant light rays 1622. A telecentric bulk imaging optic, on the other hand, will produce light cones with incident angles approximately between +25 to −25 degrees and chief rays with incident angles on the collimating lens of approximately 0 degrees, regardless of the angle of the oblique rays 1612 and chief ray 1614. A telecentric bulk imaging optic has similar benefits for the transmitter when the lasers are telecentric (their chief rays are all parallel) as is the case for VCSELS or a side emitter diode laser bar.

In some embodiments, the light detection system of a light sensing module uses an input image-space telecentric bulk imaging optic. In some other embodiments, for example where cost or increased field of view is more important than performance, the light detection system may use a more standard input bulk imaging optic such as a bi-convex lens. For any given input field into an image-space telecentric lens, the resulting chief rays are parallel to the optical axis, and the image-side ray cones all span approximately the same set of angles. This allows micro-optic channels far from the optical axis in the light detection system to achieve similar performance to the on-axis micro-optic channel. The light detection system does not need perfect image space telecentricity for this to work, but the closer to perfect telecentricity the better. For a micro-optic receiver optical layer lens that can only accept +/−25 degree light, the preference is that the input bulk imaging optic produce image-side rays that are no greater than 25 degrees in angle for every point on the focal plane.

In certain embodiments, specific light detection systems having wide field of view and narrowband imaging can have an input image-space telecentric bulk imaging optic with a numerical aperture (NA) equal to 0.34 and focal length of 20 mm. Similarly, some other embodiments could have a 1 nm wide bandpass filter, thereby enabling it to detect light of a very specific wavelength. The light detection system is capable of supporting FOVs greater than 30 degrees.

Figure 17:
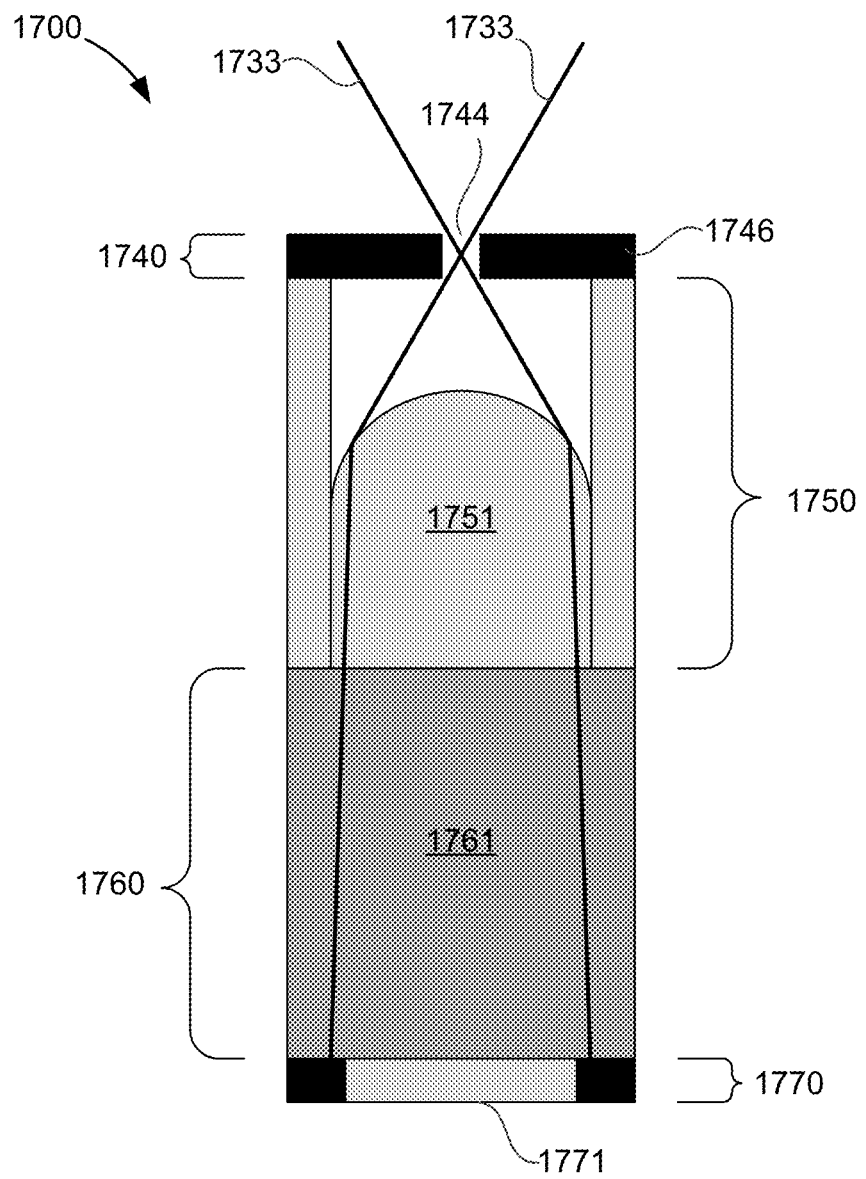
FIG. 17 is a simplified cross-sectional diagram of an exemplary micro-optic receiver channel structure, according to some embodiments of the present disclosure.

According to some embodiments of the present disclosure, the design of each channel of the micro-optic receiver channel array can be specifically configured to have features that minimize the intrusion of stray light onto a respective photodetector, thereby reducing or eliminating any detrimental effects caused by the occurrence of stray light. FIG. 17 is a simplified cross-sectional diagram of an exemplary micro-optic receiver channel structure 1700, also called a micro-optic receiver channel in discussions herein. Receiver channel 1700 can be representative of micro-optic receiver channels 232 and 1032, among others, shown in FIGS. 2 and 10, respectively, and serves to accept an input cone of light containing a wide range of wavelengths, filters out all but a narrow band of those wavelengths centered at the operating wavelength, and allows photosensor 1771 to detect only or substantially only photons within the aforementioned narrow band of wavelengths. According to some embodiments of the present disclosure, micro-optic receiver channel structures, such as receiver channel 1700, can include the following layers:

An input aperture layer 1740 including an optically transparent aperture 1744 and optically non-transparent stop region 1746 configured to define a narrow field of view when placed at the focal plane of an imaging optic such as bulk receiver optic 202 or 1008 (shown in FIGS. 2 and 10, respectively; not shown in FIG. 17). Aperture layer 1740 is configured to receive the input marginal ray lines 1733. The term "optically transparent" herein refers to as allowing most or all light to pass through. Light herein refers to spectrum of light in the near-ultraviolet, visible, and near-infrared range (e.g. 300 nm to 5000 nm). Optically non-transparent herein refers to as allowing little to no light to pass through, but rather absorbing or reflecting the light. Aperture layer 1740 can include optically transparent apertures separated from each other by optically non-transparent stop regions. The apertures and stop regions can be built upon a single monolithic piece such as an optically transparent substrate. Aperture layer 1740 can optionally include a one-dimensional or two-dimensional array of apertures 1744.

An optical lens layer 1750 including a collimating lens 1751 characterized by a focal length, offset from the plane of aperture 1744 and stop region 1746 by the focal length, aligned axially with aperture 1744, and configured to collimate photons passed by the aperture such that they are traveling approximately parallel to the axis of collimating lens 1751 which is aligned with the optical axis of receiver channel 1700. Optical lens layer 1750 may optionally include apertures, optically non-transparent regions and tube structures to reduce cross talk.

An optical filter layer 1760 including an optical filter 1761, typically a Bragg reflector type filter, adjacent to collimating lens 1751 and opposite of aperture 1744. Optical filter layer 1760 can be configured to pass normally incident photons at a specific operating wavelength and passband. Optical filter layer 1760 may contain any number of optical filters 1761. Optical filter layer 1760 may optionally include apertures, optically non-transparent regions and tube structures to reduce cross talk.

A photosensor layer 1770 including a photosensor 1771 adjacent to optical filter layer 1760 and configured to detect photons incident on photosensor 1771. Photosensor 1771 herein refers to a single photodetector capable of detecting photons, e.g., an avalanche photodiode, a SPAD (Single Photon Avalanche Detector), RCP (Resonant Cavity Photo-diodes), and the like, or several photodetectors, such as an array of SPADs, cooperating together to act as a single photosensor, often with higher dynamic range, lower dark count rate, or other beneficial properties as compared to a single large photon detection area. Each photodetector can be an active area that is capable of sensing photons, i.e., light. Photosensor layer 1770 refers to a layer made of photodetector(s) and contains optional structures to improve detection efficiency and reduce cross talk with neighboring receiver structures. Photosensor layer 1770 may optionally include diffusers, converging lenses, apertures, optically non-transparent tube spacer structures, optically non-transparent conical spacer structures, etc.

Stray light may be caused by roughness of optical surfaces, imperfections in transparent media, back reflections, and the like, and may be generated at many features within the receiver channel 1700 or external to receiver channel 1700. The stray light may be directed: through the filter region 1761 along a path non-parallel to the optical axis of collimating lens 1751; reflecting between aperture 1744 and collimating lens 1751; and generally taking any other path or trajectory possibly containing many reflections and refractions. If multiple receiver channels are arrayed adjacent to one another, this stray light in one receiver channel may be absorbed by a photosensor in another channel, thereby contaminating the timing, phase, or other information inherent to photons. Accordingly, receiver channel 1700 may feature several structures to reduce crosstalk between receiver channels.

As will be understood further herein, each layer of a micro-optic channel layer structure can be designed a specific way to mitigate the detrimental effects of stray light. Various different designs for each layer will now be discussed in further detail below.

A. Aperture Layer

In an embodiment having aperture layer 1740, as shown in FIG. 17, optically transparent aperture 1744 and optically non-transparent stop region 1746 can be formed from a single monolithic piece, such as a metal foil with a pinhole or from a single layer of a deposited opaque or reflective material having apertures etched therethrough.

Figure 18A:
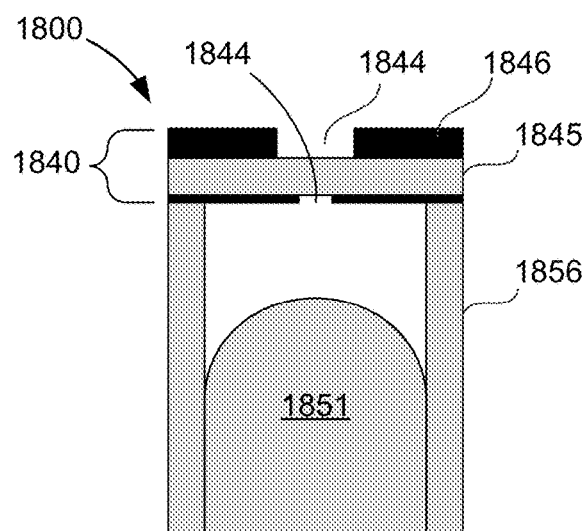
FIGS. 18A-18D are simplified cross-sectional view diagrams of various aperture layers for a receiver channel, according to some embodiments of the present disclosure.

FIG. 18A is a simplified cross-sectional view diagram of a different embodiment 1800 where aperture layer 1840 has two apertures 1844. Both the optically transparent apertures 1844 and corresponding optically non-transparent optical stop regions 1846 are supported on an optically transparent substrate 1845. Bottom aperture 1844 can be smaller and be positioned at the focal plane of the bulk optic. Aperture layer 1840 can be followed by optically transparent spacer structure 1856 positioned between aperture 1844 and collimating lens 1851 in the receiver channel. Optically transparent spacer structure 1856 forms a tube of substantially similar or larger diameter to collimating lens 1851.

Figure 18B:
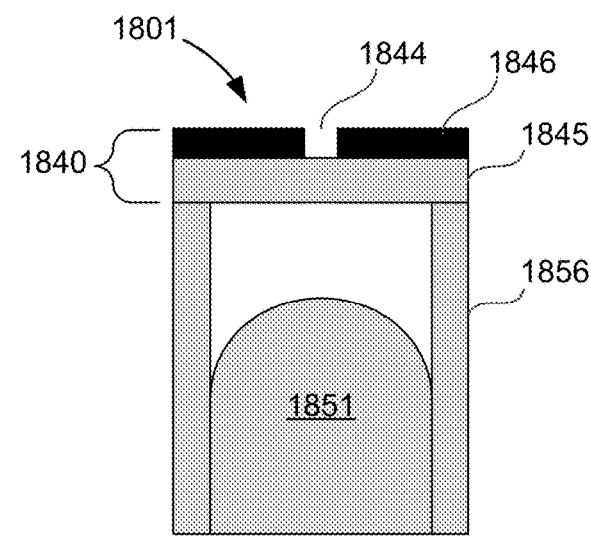

FIG. 18B is a simplified cross-sectional view diagram of a different embodiment 1801 of aperture layer 1840. Optically transparent aperture 1844 and optically non-transparent stop region 1846 are supported on optically transparent substrate 1845. Optically transparent spacer structure 1856 that follows aperture layer 1840 and positioned between aperture 1844 and collimating lens 1851 forms a tube of substantially similar or larger diameter to collimating lens 1851.

Figure 18C:
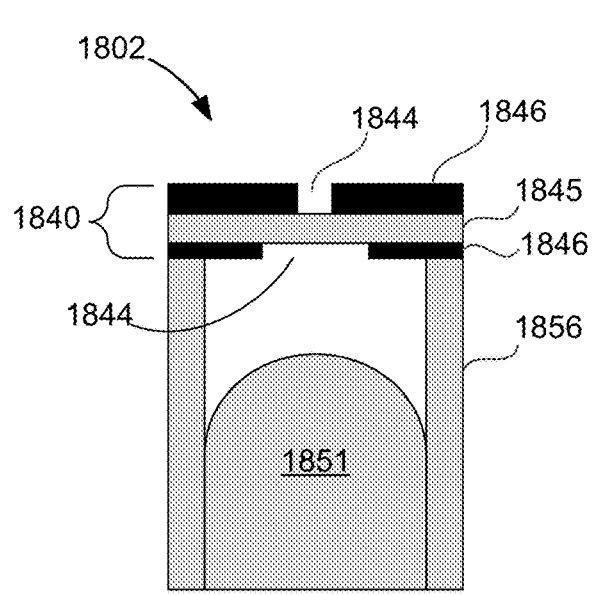

FIG. 18C is a simplified cross-sectional view diagram of an embodiment 1802 of aperture layer 1840 consisting of multiple optically non-transparent stop regions 1846 that are supported on optically transparent substrate 1845. These layers (stop regions 1846) follow the contour of marginal light rays (not shown, but similar to light rays 1733 in FIG. 17) to reduce stray light into the receiver channel. Optically transparent spacer structure 1856 below aperture layer 1840 forms a tube of substantially similar or larger diameter to collimating lens 1851.

Figure 18D:
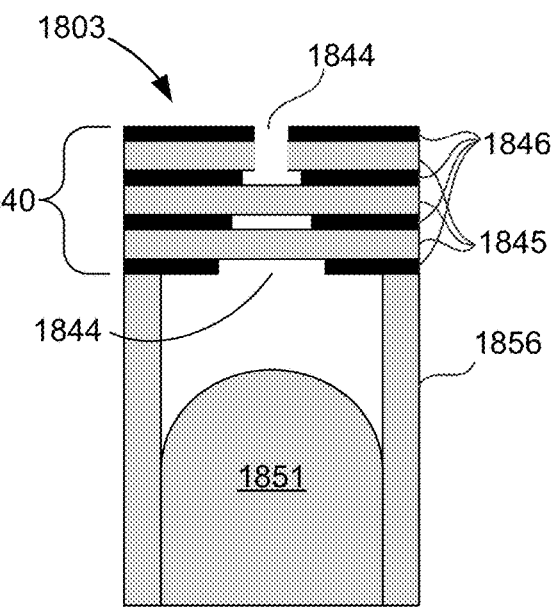

FIG. 18D is a simplified cross-sectional view diagram of an embodiment 1803 of aperture layer 1840 having multiple optically non-transparent stop layers 1846 supported on multiple optically transparent substrate 1845. Aperture layer 1840 follows the contour of marginal light rays (not shown, but similar to light rays 1733 in FIG. 17) to reduce stray light into the receiver channel. Optically transparent spacer structure 1856 below aperture layer 1840 forms a tube of substantially similar or larger diameter to collimating lens 1851.

In some other embodiments of the present disclosure, spacer structure 1856 shown in FIGS. 18A-D, can be optically non-transparent. The optically non-transparent spacer structure in this instance could be formed by etching a silicon or glass wafer and may be coated with an optically non-transparent material (e.g. black chrome). Additionally, the spacer structure in this instance would prevent any light in the spacer region from traveling outside the receiver channel.

B. Spacer Structure Between Aperture Layer and Optical Lens Layer

Figure 19A:
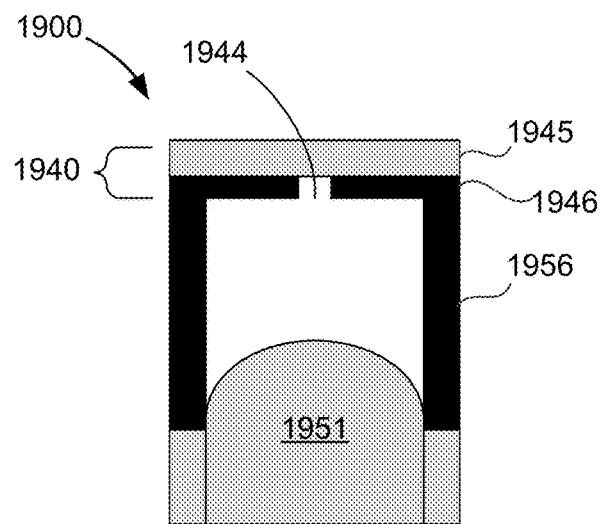
FIGS. 19A-19D are simplified cross-sectional view diagrams of various spacer structures between the aperture layer and the optical lens layer for a receiver channel, according to some embodiments of the present disclosure.

FIG. 19A is a simplified cross-sectional view diagram of an embodiment 1900 of the present disclosure with an optically non-transparent spacer structure between the aperture layer and the lens layer. FIG. 19A depicts an optically non-transparent spacer structure 1956 positioned between aperture 1944 and collimating lens 1951 in the receiver channel. Optically non-transparent spacer structure 1956 forms a tube of substantially similar or larger diameter to collimating lens 1951 and prevents any light from traveling outside the receiver channel in the region between aperture 1944 and collimating lens 1951. Optically non-transparent spacer structure 1956 could be formed by etching a silicon or glass wafer and may be coated with an optically non-transparent material (e.g. black chrome). Alternatively, optically non-transparent spacer structure 1956 could be a solid non-transparent structure that is fabricated from molded polymer or any other suitable method. FIG. 19A shows the aperture layer having optically transparent substrate 1945 on the top, followed by the optically non-transparent stop region 1946 and aperture 1944, and then by optically non-transparent spacer structure 1956.

Figure 19B:
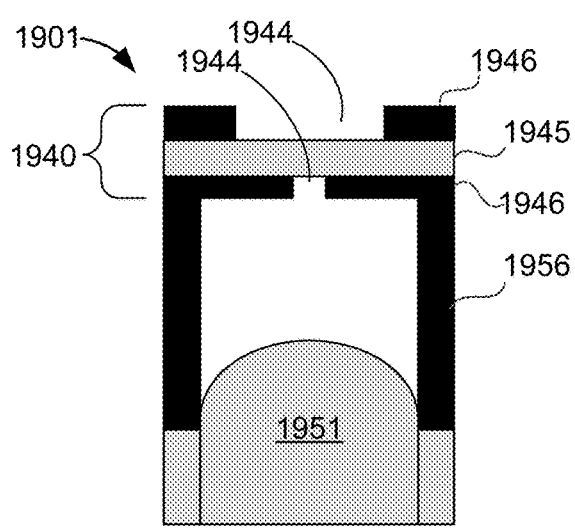

FIG. 19B is a simplified cross-sectional view diagram of an embodiment 1901 of the present disclosure with an optically non-transparent structure between the aperture layer and the lens layer. FIG. 1901 depicts an optically non-transparent spacer structure 1956 positioned between aperture 1944 and collimating lens 1951. Optically non-transparent spacer structure 1956 forms a tube of substantially similar or larger diameter to collimating lens 1951 and prevents any light from traveling outside of the receiver channel in the region between aperture 1944 and collimating lens 1951. FIG. 19B shows multiple optically non-transparent stop regions 1946 supported on optically transparent substrate 1945.

Figure 19C:
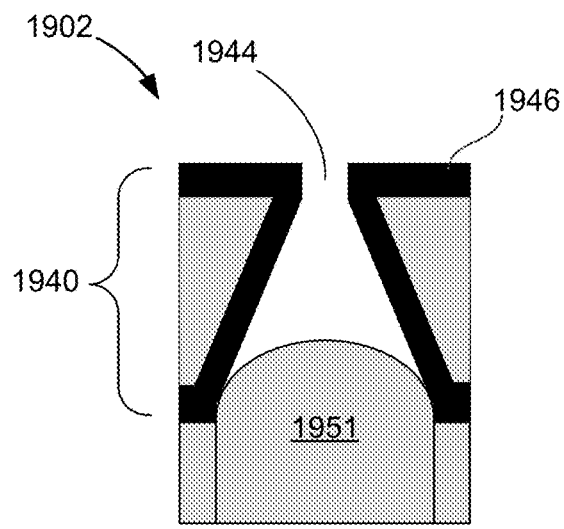

FIG. 19C is a simplified cross-sectional view diagram of an embodiment 1902 of aperture layer 1940 where aperture 1944 is conically aligned, and where the conical structure as an optically non-transparent layer coated on an optically transparent material.

Figure 19D:
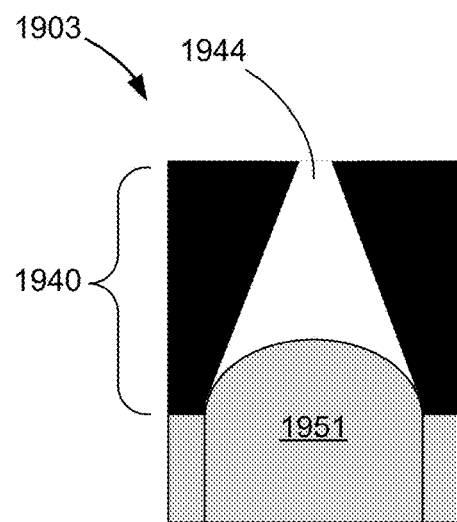

FIG. 19D is a simplified cross-sectional view diagram of an embodiment 1903 of aperture layer 1940 where the aperture 1944 is conically aligned, and where the conical structure is a solid structure formed of an optically non-transparent material. As shown in FIGS. 19C and 19D the optically transparent aperture 1944 and optically non-transparent stop region 1946 are combined into a monolithic layer with a conical cavity aligned with the optical axis of the receiver channel and configured to conform to the shape of marginal ray lines (not shown, but similar to light rays 1733 in FIG. 17).

C. Optical Filter Layer

FIG. 20A is a simplified cross-sectional view diagram of an embodiment 2000 of filter layer 2060 for a receiver channel, according to some embodiments of the present disclosure. Optical filter layer 2060 can include a single optical filter 2061 supported on an optically transparent substrate 2065. Optical filter layer 2060 can be placed on top of optically transparent substrate 2065 or below optically transparent substrate 2065. Optical filter 2061 can be a bandpass filter that blocks incident light outside of a defined set of wavelengths (e.g. 945-950 nm). However, in some other embodiments, optical filter 2061 can be an edge pass filter or any other suitable type of filter that selectively allows light within a wavelength range to pass through itself.

FIG. 20B is a simplified cross-sectional view diagram of an embodiment 2001 of filter layer 2060 for a receiver channel, according to some embodiments of the present disclosure. Optical filter layer 2060 can include two optical filters 2061 sandwiching and supported by an optically transparent substrate 2065. Optical filter layer 2060 can contain any number of optical filters 2061 on any number of substrates 2065. One of the optical filters 2061 as shown in FIG. 20B can be a bandpass filter and can be positioned on either on top of or directly below optically transparent substrate 2065 that blocks all of the incident light for a defined set of wavelengths (e.g. 900-945 nm and 950-995 nm). The other optical filter 2061 placed on the opposite side of the optical substrate 2065 can be a wide spectrum blocking filter (except for the region covered by the bandpass filter), for example covering 200-915 nm and 980-1600 nm. The bandpass filter and blocking filter are designed such that there is no leakage in the transition region between the two filters. However, the filters could be two edge pass filters designed to work in conjunction as a bandpass filter or any other types of filters.

In some other embodiments of the present disclosure, the bandpass filter and wide spectrum blocking filter are merged into a single optical filter 2061 and placed on either the top or bottom of optically clear substrate 2065.

1. Filter Layer with Apertures

FIG. 20C is a simplified cross-sectional view diagram of an embodiment 2002 of filter layer 2060 for a receiver channel, according to some embodiments of the present disclosure. Optical filter layer 2060 can have an additional aperture 2049 on top and an additional aperture 2054 on the bottom of optical filter layer 2060 along with the corresponding optically non-transparent stop regions 2063 & 2055. Aperture 2049 defines the maximal cylinder of light desired to be passed into optical filter layer 2060 by optical filter 2061, and stop region 2063 an absorb or reflect any incident stray light outside the diameter of aperture 2049.

Aperture 2054 defines the maximal cylinder of light desired to be passed out of optical filter layer 2060 and stop region 2055 absorbs or reflects any incident stray light outside the diameter of aperture 2054. Optical filters 2061 can be supported on an optically transparent substrate 2065.

In some embodiments of the present disclosure, filter layer 2060 can have a single aperture 2049 placed on the top of the optical filter layer 2060. In some additional and alternative embodiments of the present disclosure, filter layer 2060 can have a single aperture 2054 placed on the bottom of optical filter layer 2060.

FIG. 20D is a simplified cross-sectional view diagram of an embodiment 2003 of filter layer 2060 for a receiver channel, according to some embodiments of the present disclosure. Optical filter layer 2060 can include multiple optically transparent substrates 2065, and multiple optically non-transparent aperture layers between them in an alternating order. FIG. 20D shows an additional aperture 2049 and corresponding optically non-transparent stop region 2063 positioned on top of optical filter 2061 and supported by optically transparent substrates 2065. Aperture 2049 can define the maximal cylinder of light desired to be passed into optical filter layer 2060 by optical filter 2061, and stop region 2063 absorbs or reflects any incident stray light outside diameter of aperture 2049. FIG. 20D shows an additional aperture 2054 and corresponding optically non-transparent stop region 2055 positioned between optical filter layer 2060 and a photosensor layer (not shown, but similar to photosensor layer 1770 in FIG. 17). Aperture 2054 can define the maximal cylinder of light desired to be passed out of optical filter layer 2060 toward the photosensor, and stop region 2055 can absorb or reflect any incident stray light outside the diameter of aperture 2054. Collectively, these interleaved layers prevent stray light in one optical filter layer 2060 from traveling into an optical filter region of an adjacent receiver channel in a multi receiver channel system.

2. Filter Layer with Tube Structure

Figures 20E, 20F:
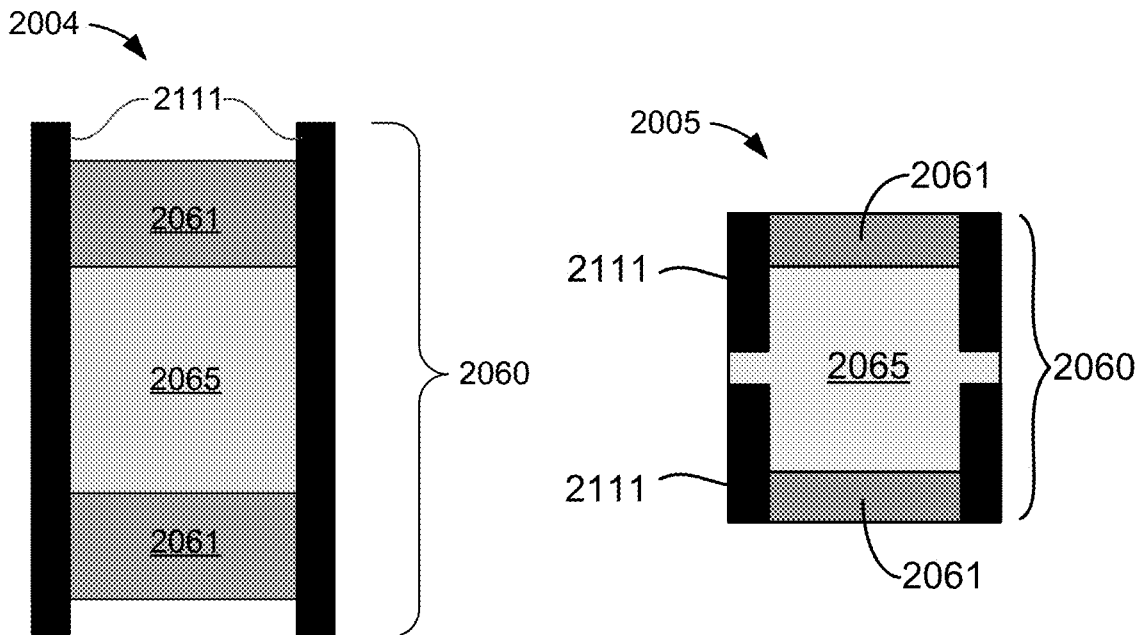

FIG. 20E is a simplified cross-sectional view diagram of an embodiment 2004 of filter layer 2060 for a receiver channel, according to some embodiments of the present disclosure. Optical filter layer 2060 can include optical filter 2061 and optically transparent substrate 2065 and be surrounded by an optically non-transparent tube structure 2111, which prevents stray light in one optical filter layer 2060 from traveling into an optical filter region of an adjacent receiver channel in a multi receiver channel system. Tube structure 2111 can be formed of a variety of materials, including but not limited to silicon, metals, polymers, or glasses.

FIG. 20F is a simplified cross-sectional view diagram of an embodiment 2005 of filter layer 2060 for a receiver channel, according to some embodiments of the present disclosure. Optical filter layer 2060 can include optical filter 2061 and optically transparent substrate 2065 and is surrounded by an optically non-transparent tube structure 2111, which prevents stray light in one optical filter layer 2060 from traveling into an optical filter region of an adjacent receiver channel in a multi receiver channel system. Tube structure 2111 can be formed of a variety of materials, including but not limited to silicon, metals, polymers, or glasses. As shown in FIG. 20F, tube structure 2111 may only pass partially through optical filter layer 2060. This type of structure can be formed by performing deep anisotropic etches on each side of filter substrate 2065 and selectively depositing metal or polymer afterwards.

Figure 20G:
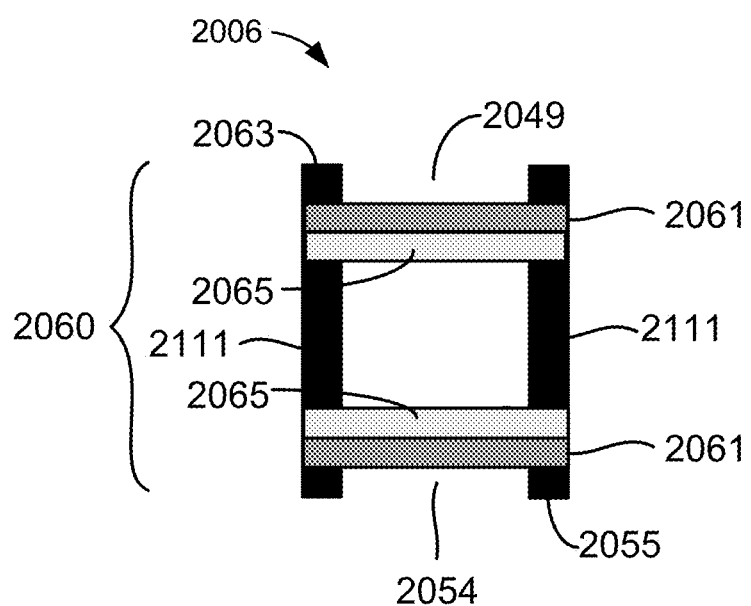

FIG. 20G is a simplified cross-sectional view diagram of an embodiment 2006 of filter layer 2060 for a receiver channel, according to some embodiments of the present disclosure. Optical filter layer 2060 can include two optical filters 2061 supported on optically transparent substrates 2065 and surrounded by an optically non-transparent tube structure 2111, which prevents stray light in one optical filter layer 2060 from traveling into an optical filter region of an adjacent receiver channel in a multi receiver channel system. However, the optical filter region may contain any number of optical filters 2061 on any number of substrates 2065 within the optical filter layer 2060. FIG. 20G illustrates an additional aperture 2049 and corresponding optically non-transparent stop region 2063 positioned on top of optical filter 2061 and supported by optically transparent substrate 2065. Aperture 2049 can define the maximal cylinder of light desired to be passed into optical filter layer 2060 and stop region 2063 can absorb or reflect any incident stray light outside the diameter of aperture 2049.

Embodiment 2006 of optical filter layer 2060 in FIG. 20G can have an additional aperture 2054, and corresponding optically non-transparent stop region 2055 can be positioned between optical filter layer 2060 and the photosensor layer (not shown, but similar to photosensor layer 1770 in FIG. 17). Aperture 2054 can define the maximal cylinder of light desired to be passed out of optical filter layer 2060 toward the photosensor, and stop region 2055 can absorb or reflect any incident stray light outside the diameter of aperture 2054. Tube structure 2111 can be formed of a variety of materials, including but not limited to silicon, metals, polymers, or glasses.

D. Photosensor Layer

As can be appreciated herein, various different photosensor layer designs can be implemented in a micro-optic receiver channel.

1. Photosensor Layer with Diffuser

Figure 21A:
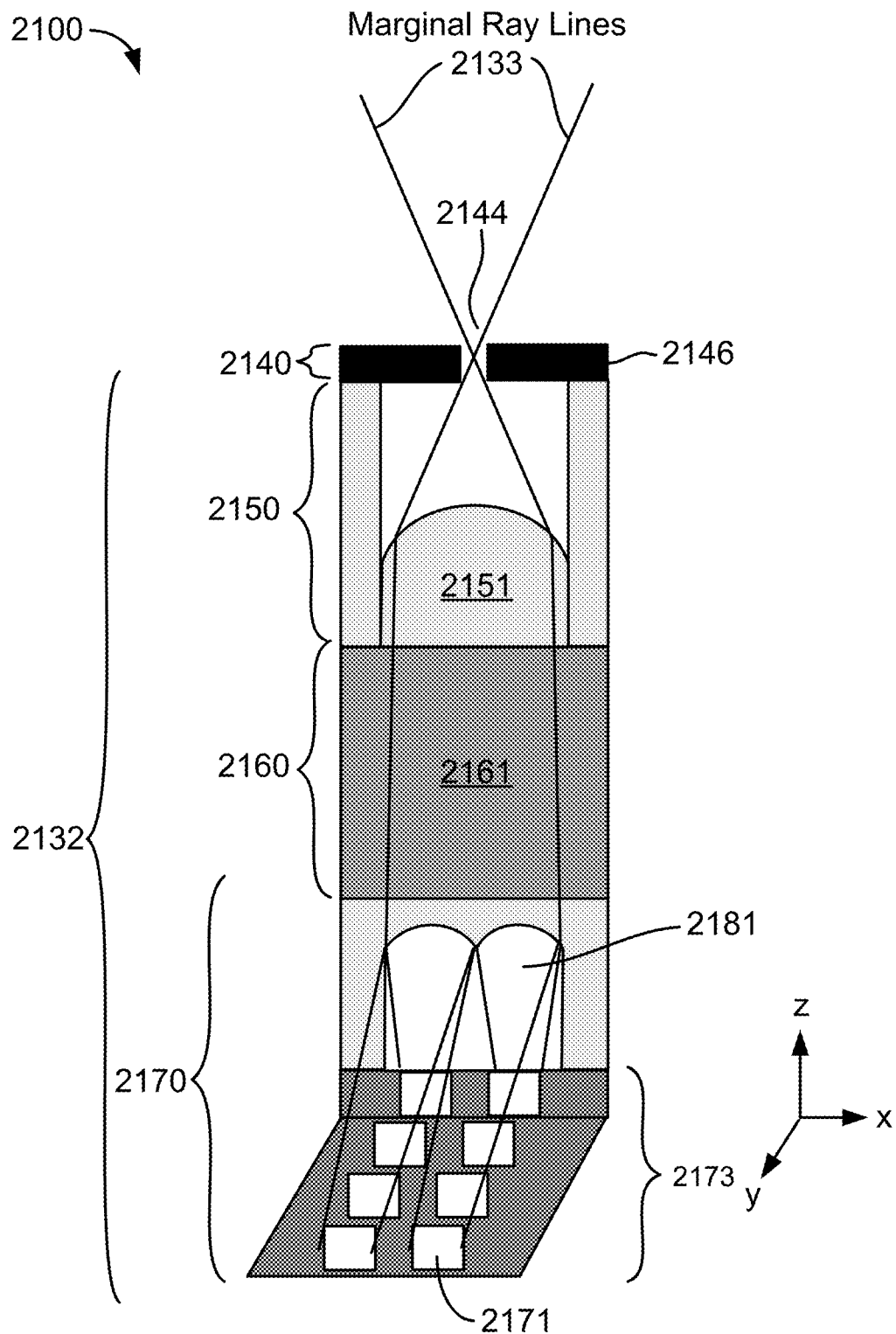

FIG. 21A is a simplified cross-sectional view diagram of an embodiment 2100 of receiver channel 2132 containing an optional diffuser 2181 located in photosensor layer 2170 between optical filter 2161 and photosensor 2173, according to some embodiments of the present disclosure. Diffuser 2181 can be configured to spread collimated photons that are output from collimating lens 2151 and passed by optical filter region 2160, across the full width of a corresponding photosensor 2173. Photosensor 2173 may be non-square or non-circular in geometry (e.g., short and wide) in order to extend the sensing area of photosensor 2173 to be wider or taller than width or height of the other components in receiver channel 2132.

Diffuser 2181 is configured to spread light rays across the area of photosensor 2173 such that photosensor 2173 is able to detect the incident photons across its full width and height, thereby increasing the dynamic range of receiver channel 2132, even where the overall height of receiver channel 2132 has to be limited for practical considerations. In particular, in this embodiment, receiver channel 2132 may include widened photosensors exhibiting greater photodetectors 2171 (i.e., areas sensitive to incident photons) and a diffuser 2181 arranged over photosensor 2173 that spreads light passed by optical filter 2161 across the full area of photosensor 2173, thereby yielding increased dynamic range.

In some embodiments, photosensor 2173 includes an array of single-photon avalanche diode detectors 2171 (hereinafter "SPADs"). The height and width of the receiver channel (usually defined by the diameter of collimating lens 2151) may accommodate only a relatively small number of (e.g., two) vertically-stacked SPADs. Photosensor 2173 can therefore define an aspect ratio greater than 1:1, and diffuser 2181 can spread light rays passed by the optical filter region 2160 according to the geometry of photosensor 2173 in order to accommodate a larger sensing area per photosensor. By incorporating more SPADs per photosensor, the dynamic range of the photosensor can be increased, as it less likely for all SPADs to be unable to detect photons (i.e., to be "dead") simultaneously.

In some other embodiments, photosensor 2173 includes an array of photodetectors 2171. The height and width of the receiver channel (usually defined by the diameter of collimating lens 2151) may accommodate only a relatively small number of (e.g., two) vertically-stacked photodiodes. Photosensor 2173 can therefore define an aspect ratio greater than 1:1, and diffuser 2181 can spread light rays passed by the optical filter region 2160 according to the geometry of photosensor 2173 in order to accommodate a larger sensing area per photosensor. By incorporating more photodiodes per photosensor, the dynamic range of the photosensor can be increased, as it is unlikely for all photodiodes to be saturated simultaneously.

Receiver channel 2132 can additionally or alternatively include an aperture layer interposed between optical filter region 2160 and diffuser 2181 or between the optical filter region 2160 and photosensor 2173, where aperture 2144 is aligned with a corresponding collimating lens 2151. In this variation, aperture 2144 can absorb or reflect errant light rays passed by the light filter or reflected by the photosensor to further reduce crosstalk between receiver channels, thereby further increasing SNR (Signal to Noise Ratio) of the system.

2. Photosensor Layer with Converging Lens Set

Figure 21B:
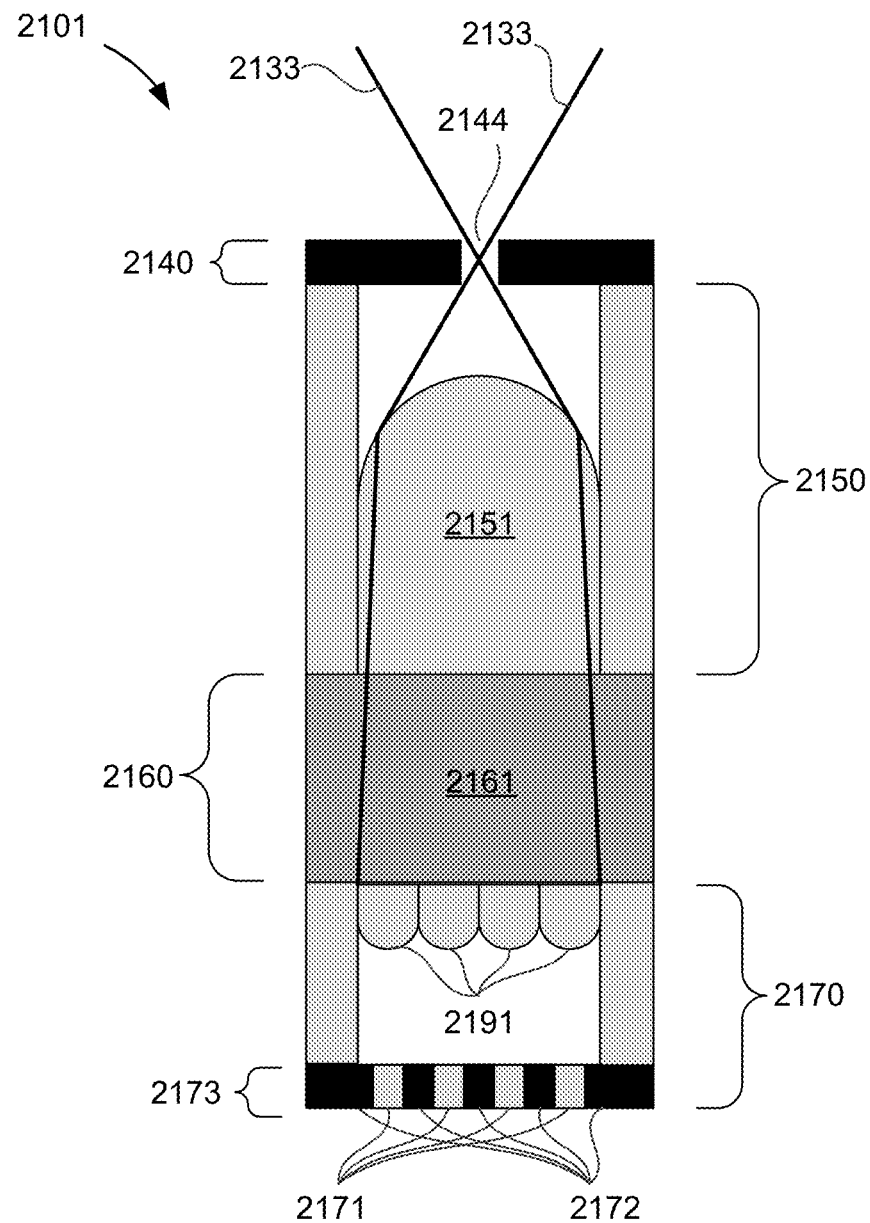

FIG. 21B is a simplified cross-sectional view diagram of an embodiment 2101 of receiver channel 2132, according to some embodiments of the present disclosure. A photosensor layer 2170 of embodiment 2100 can include a photosensor 2173 formed of a set of discrete photodetectors 2171 (e.g., SPADs) and a set of inactive regions 2172 (e.g., integrated logic) encompassing the set of photodetectors, where each photodetector is configured to detect incident photons. Photosensor layer 2170 can also include a converging lens set 2191 interposed between optical filter region 2160 and photosensor 2173 with photodetectors 2171, and including one converging lens 2191 per discrete photodetector 2171 within photosensor 2173, where each lens of the converging lens set 2191 is configured to focus incident photons passed by optical filter region 2160 onto a corresponding discrete photodetector 2171. Each converging lens can exhibit a common focal length, and converging lens set 2191 can be offset above photosensor 2173 by this common focal length (or by a distance substantially similar to this common focal length), and each converging lens can converge incident light—collimated in optical lens layer 2150 and passed by optical filter region 2160—onto a corresponding photodetector 2171 in photosensor 2173.

In some embodiments, converging lens set 2191 interposed between optical filter region 2160 and photosensor 2173 with photodetectors 2171 employs diffracting elements in addition to or replacement of refractive elements.

3. Photosensor Layer with Converging Lens Set and Additional Apertures

Figure 21C:
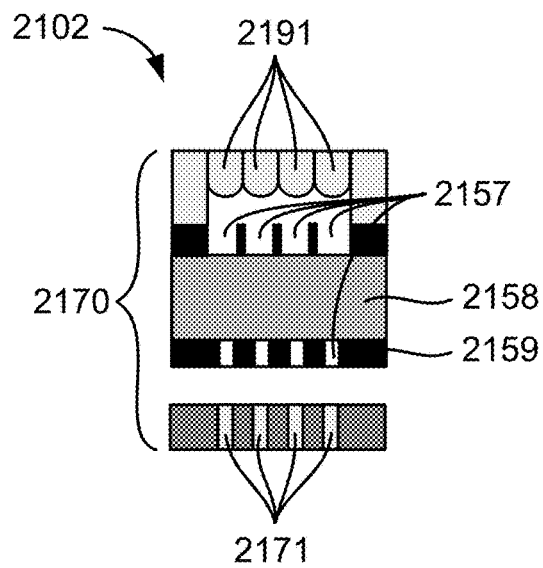

FIG. 21C is a simplified cross-sectional view diagram of an embodiment 2102 of photosensor layer 2170, according to some embodiments of the present disclosure. Photosensor layer 2170 can include a converging lens set 2191, and a set of apertures 2157, wherein each aperture 2157 is aligned with a corresponding converging lens 2191. In this variation, each aperture 2157 can absorb or reflect errant light rays passed by the light filter or reflected by the photosensor to further reduce crosstalk between receiver channels, thereby further increasing the SNR of the system. Set of apertures 2157 and corresponding optically non-transparent stop regions 2159 are built on an optically transparent substrate 2158.

Figure 21D:
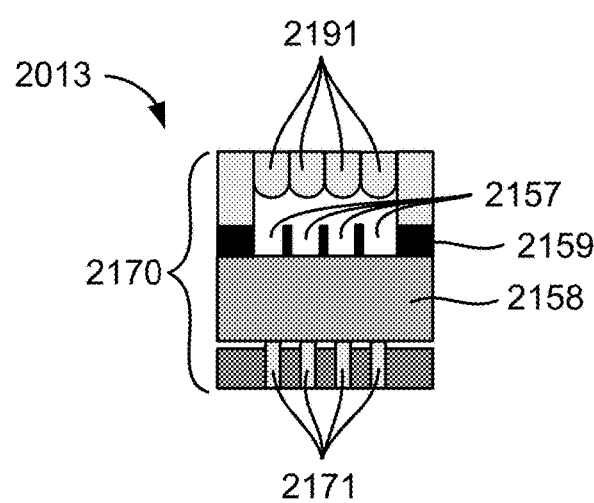

FIG. 21D is a simplified cross-sectional view diagram of an embodiment 2103 of photosensor layer 2170, according to some embodiments of the present disclosure. Photosensor layer 2170 can include converging lens set 2191, and set of apertures 2157, where each aperture 2157 is aligned with a corresponding converging lens 2191. Apertures 2157 and corresponding optically non-transparent stop regions 2159 are built on an optically transparent substrate 2158. In this variation, apertures 2157 do not go all the way through to photodetector 2171.

Figure 21E:
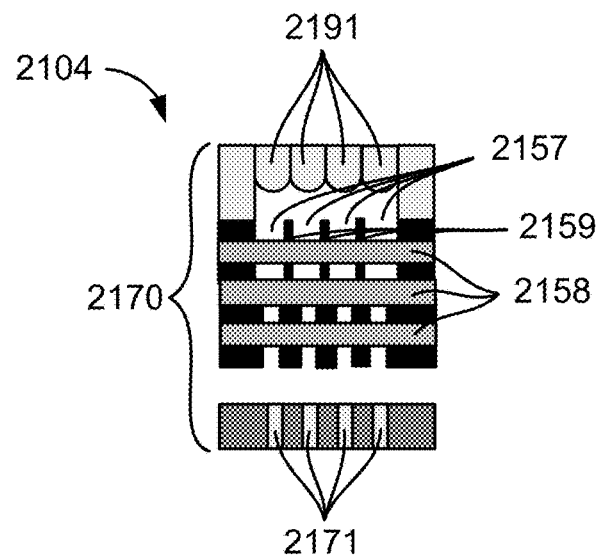

FIG. 21E is a simplified cross-sectional view diagram of an embodiment 2104 of photosensor layer 2170, according to some embodiments of the present disclosure. An additional set of apertures 2157 and corresponding optically non-transparent stop regions 2159 defining desired maximal light cones can be positioned between lens set 2191 and photodetector 2171. Set of apertures 2157 and corresponding non-transparent stop regions 2159 define a light cone for every lens in lens set 2191 and function to absorb or reflect any stray light traveling along a path not encompassed by the desired light cones. The apertures may be fabricated using standard semiconductor processes.

4. Photosensor Layer with Converging Lens Set and Spacer Structure Between the Lens Set and the Photosensor FIG. 21F is a simplified cross-sectional view diagram of an embodiment 2105 of photosensor layer 2170, according to some embodiments of the present disclosure. Here, an optically non-transparent spacer structure 2163 is positioned between lens set 2191 and photosensor 2173 having photodetectors 2171 in receiver channel 2132. Optically non-transparent spacer structure 2163 forms a tube of substantially similar or larger diameter to a collimating lens (e.g., collimating lens 1751 shown in FIG. 17) and prevents any light from traveling outside of receiver channel 2132 in the region between lens set 2191 and photosensor 2173. Optically non-transparent spacer structure 2163 could be made from optically non-transparent bulk media (e.g. silicon or polymer).

FIG. 21G is a simplified cross-sectional view diagram of an embodiment 2106 of photosensor layer 2170, according to some embodiments of the present disclosure. Here, optically non-transparent spacer structure 2163 is positioned between lens set 2191 and photosensor 2173, and is made from an optically non-transparent coating on an optically transparent substrate (e.g. black chrome on glass). Optically non-transparent spacer structure 2163 forms a tube of substantially similar or larger diameter to collimating lens 2151 and prevents any light from traveling outside of receiver channel 2132 in the region between lens set 2191 and photodetector 2171.

5. Photosensor Layer Spacer Structure Between the Filter Layer and the Photosensor Layer FIG. 21H is a simplified cross-sectional view diagram of an embodiment 2107 of photosensor layer 2170, according to some embodiments of the present disclosure. Optically non-transparent spacer structure 2163 can be positioned between an optical filter layer (e.g., any of the above-mentioned optical filter layers) and photosensor layer 2170. Optically non-transparent spacer structure 2163 forms a tube of substantially similar or larger diameter to a collimating lens (e.g., collimating lens 1751 in FIG. 17) and prevents any light from traveling outside of the receiver channel (e.g., channel 1700 in FIG. 17) in the region between the optical filter layer and photosensor layer 2170. Optically non-transparent spacer structure 2163 can be formed by etching a silicon or glass wafer and may be coated with an optically non-transparent material (e.g. black chrome). Alternatively, optically non-transparent spacer structure 2163 can be fabricated from molded polymer. In this embodiment, lens set 2191 is directly bonded to photosensor 2173. Similar to its function in previous embodiments, lens set 2191 serves to focus light onto photodetectors 2171 of photosensor 2173, rather than the inactive areas. These lenses could be integrated directly on top of an ASIC containing photosensor 2173 in a wafer fabrication process, easing production.

6. Photosensor Layer with Conical Spacer Structures

Figure 21I:
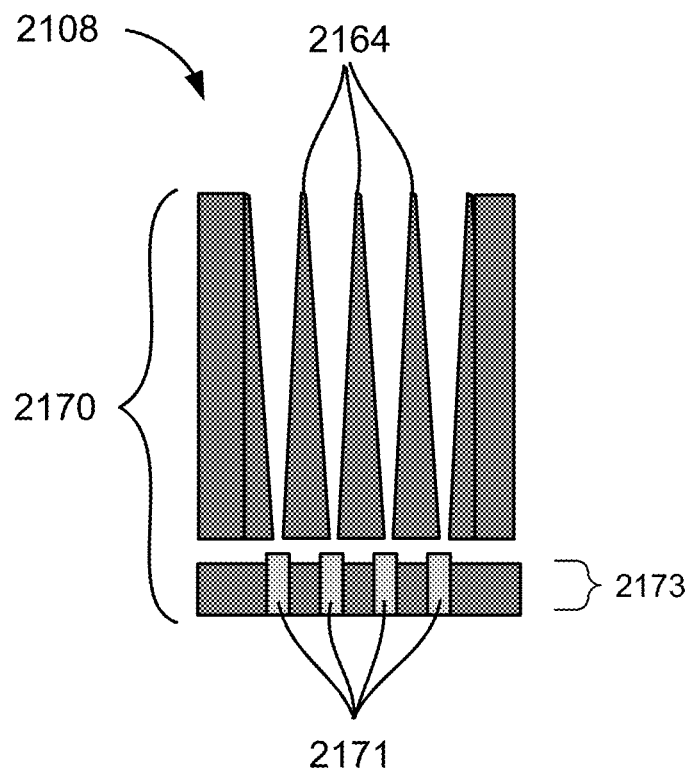

FIG. 21I is a simplified cross-sectional view diagram of an embodiment 2108 of photosensor layer 2170, according to some embodiments of the present disclosure. In this embodiment, photosensor layer 2170 includes a set of conical, optically non-transparent spacer structures 2164 that is positioned between a lens set (not shown but, e.g., lens set 2191 in FIGS. 21F and 21G) and photosensor 2173. Set of conical, optically non-transparent spacer structures 2164 can form tapered tubes, each with substantially similar entrance diameter to individual lenses in the lens set, and each with substantially similar exit diameter to the individual photodetectors 2171 of photosensor 2173. Set of conical, optically non-transparent spacer structures 2164 prevents any light from traveling outside of the receiver channel in regions between the lens set and photosensor 2173 and also guide light toward the photodetectors 2171 of photosensor 2173. The set of conical, optically non-transparent spacer structures 2164 can be formed by etching a silicon or glass wafer and may be coated with an optically non-transparent material (e.g. black chrome). Alternatively, set of conical, optically non-transparent spacer structures 2164 can be fabricated from molded polymer.

Figure 21J:
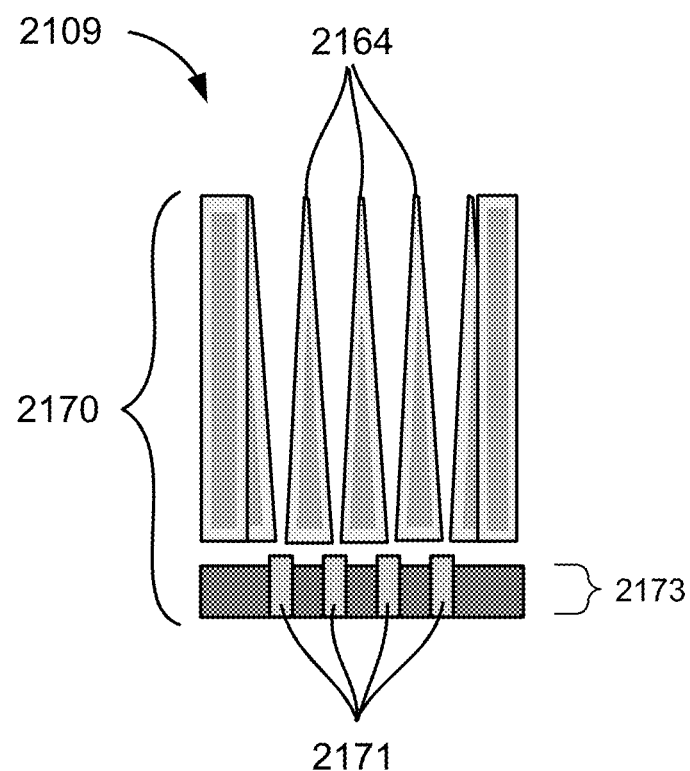

FIG. 21J is a simplified cross-sectional view diagram of an embodiment 2109 of photosensor layer 2173, according to some embodiments of the present disclosure. In this embodiment, photosensor layer 2173 includes a set of conical, optically non-transparent spacer structures 2164 that is positioned between a lens set (not shown but, e.g., lens set 2191 in FIGS. 21F and 21G) and photodetector 2171. The inner walls of the set of conical, optically non-transparent spacer structures 2164 are coated with a reflective material (e.g. chrome) in order to further enhance the structures' ability to act as a light pipe. Set of conical, optically non-transparent spacer structures 2164 form tapered tubes, each with substantially similar entrance diameter to individual lenses in the lens set, and each with substantially similar exit diameter to the individual photodetectors 2171 of photosensor 2173. Set of conical, optically non-transparent spacer structures 2164 prevents any light from traveling outside of the receiver channel in regions between the lens set and photosensor 2171 and also guide light toward the photodetectors 2171 of photosensor 2173.

7. Photosensor Layer with Resonant Photo-Cavity Diodes

Figure 21K:
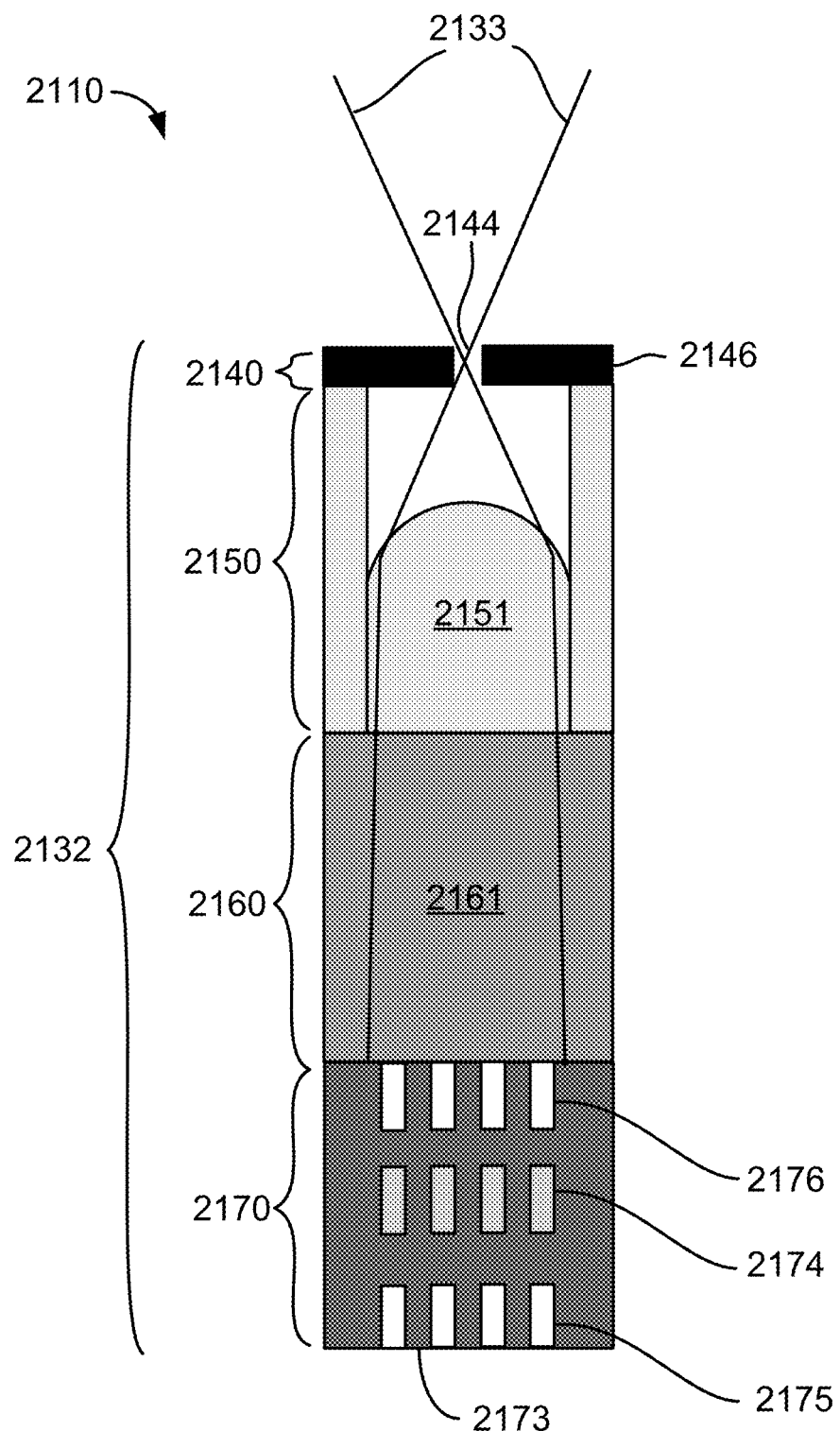

FIG. 21K is a simplified cross-sectional view diagram of a receiver channel 2132 including an embodiment 2110 of photosensor layer 2170, according to some embodiments of the present disclosure. In this embodiment, photosensor layer 2170 is configured with a resonant cavity around a photo sensitive diode to improve the photon detection efficiency. Each photosensor 2173 includes one or more resonant photo-cavity diodes. Each photosensor 2173 includes one or more photo-diodes 2174 (photodetectors) along with highly-reflective (e.g., partially-mirrored) surfaces facing the top and bottom of the area (the resonant cavity). Generally, an photodetector of a non-resonant cavity diode may have a relatively low quantum efficiency. To improve the percentage of photons detected by the photodetector, resonant photo-cavity diode 2174 is used that includes: a first mirrored surface 2175 below and facing the photodetector; and a second partially mirrored surface 2176 above and facing the photodetector, that also allows light to enter the cavity as shown in FIG. 21K. Thus, when a photon passes through and is not detected by an photodetector of resonant photo-cavity diode 2174, first mirrored surface 2175 surrounding the photodetector of resonant photo-cavity diode 2174 reflects the photon back toward top reflective surface 2176 of the cavity and through the photodetector again, which may detect the photon upon its second transition through the photodetector. However, if the photodetector fails to detect the photon upon this second collision, the reflection process is repeated with the second mirrored surface reflecting the photon back toward the photodetector, which again may detect the photon upon its third collision with the photodetector. This process may repeat until the photon is detected by the photodetector of the photosensor or the photon escapes or is absorbed by the cavity. Resonant photo-cavity diode 2174 can thus achieve a relatively high rate of photon detection (i.e. approaching 100%). Note that a particle interpretation of light is used in the preceding description, but consideration of wave interference effects are critical for a complete description of resonant cavity photodiodes. Also note that the active region of resonant photo-cavity diode 2174 may be comprised of a standard photodiode, an avalanche photodiode, a SPAD, or any other photosensor.

FIG. 21K further shows that one or more resonant cavity photodiodes (or "RCPs") 2174 may be combined with aperture 2144, collimating lens 2151, optical filter region 2160, and any combination of the aforementioned diffusers, converging lens sets, or crosstalk mitigation structures to form a variant of receiver channel 2132. A typical RCP will have similar wavelength sensitivity as optical filter region 2160 and can be designed to be sensitive to a similar set of wavelengths of light as optical filter region 2160. However, due to fabrication or other limitations, the RCP may have more part-to-part variability of the center wavelength of the RCP's operating spectrum and thus necessitate a broader operating wavelength band in order for every photosensor to be capable of detecting photons at the system's operating wavelength. Alternatively, it may simply be impossible to reliably fabricate an RCP with an operating wavelength band as narrow as the filter passband. For instance, optical filter region 2160 may have a passband as narrow as 0.1 nm, while the RCP may have an operating band of 10 nm. With the optical filter region 2160 on top of the RCP 2174, the combined filter and RCP system has an effective operating wavelength band substantially similar to optical filter region 2160. In addition, the RCP performance is improved when sensing collimated light, as opposed to focused light, which is provided as a result of collimating lens 2151 as depicted in FIG. 21K. In this way, a system employing aperture 2144, collimating lens 2151, optical filter region 2160, and RCP 2174 may achieve high photon detection efficiency and narrow wavelength selectivity to maximize the SNR within receiver channel 2132.

E. Hemispherical Receiver Structures

Figures 22A, 22B:
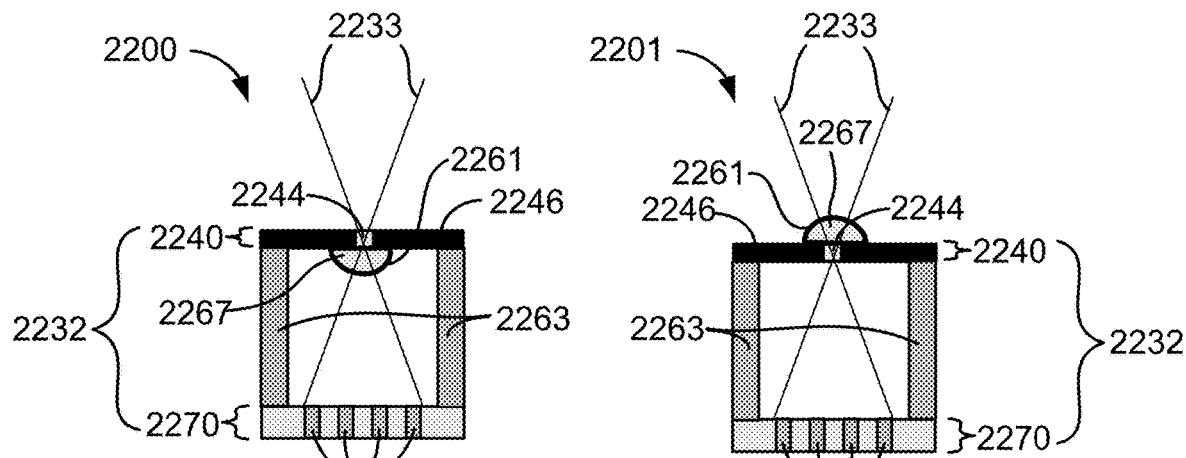
FIGS. 22A-22I are simplified cross-sectional view diagrams of various hemispherical receiver structures for a receiver channel, according to some embodiments of the present disclosure.

FIG. 22A is a simplified cross-sectional view diagram of an embodiment 2200 of a receiver channel 2232, according to some embodiments of the present disclosure. Receiver channel 2232 of embodiment 2200 can include convex hemispheres supported on an optically non-transparent material. In this embodiment, an aperture layer 2240 is combined with an optical filter 2261 coated on a convex hemisphere 2267, with the center of hemisphere 2267 located at or near the focal point of incoming light (marginal ray lines 2233). The center of hemisphere 2267 also corresponds to, or nearly corresponds to, the center of aperture 2244. In some embodiments, hemisphere 2267 can be below aperture 2244, as shown in FIG. 22A. An advantage of the embodiment is that for a sufficiently well-focused cone of rays, any ray lines 2233 will pass through optical filter 2261 normal to the filter's surface, thereby eliminating CWL (Center Wave Length) shift due to variations in incident angle of the light (e.g. light rays 2233) on optical filter 2261, thereby allowing the use of very narrow bandpass (e.g. 850-852 nm) filters.

This is further illustrated in FIG. 22B, which is a simplified cross-sectional view diagram of an embodiment 2201 of receiver channel 2232, according to some embodiments of the present disclosure. Unlike embodiment 2200 in FIG. 22A, embodiment 2201 in FIG. 2B can be configured so that hemisphere 2267 is positioned above aperture 2244 to achieve similar functionality but with a less compact footprint. As shown in FIG. 22B, the angle of incidence on optical filter 2261 is normal for marginal ray lines 2233 (and all other ray lines not shown explicitly in FIG. 22B) that pass through the center of hemisphere 2267. Note that, while not shown in FIG. 22B or 22C, the rays will refract upon exiting the hemisphere structure since they are not normal to the planar exit surface. Similarly, in FIG. 22A, there will be some amount of refraction when rays enter the flat side of the hemispherical structure.

As illustrated in FIGS. 22A to 22B, receiver channel 2232 includes sidewalls 2263 between optically non-transparent stop region 2246 and photosensor layer 2270 with photodetectors 2271 to reduce crosstalk. Sidewalls 2263 can be made up of optically non-transparent material or made up of optically transparent material. In addition, sidewalls 2263 can also be coated with reflective or absorptive material.

Figure 22C:
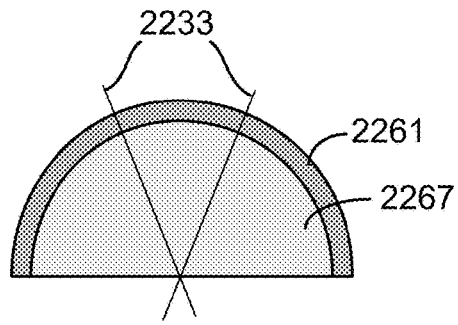

A close-up view of the convex hemispherical surface is shown in FIG. 22C, which is a simplified cross-sectional view diagram of convex hemisphere 2267 of FIGS. 22A and 22B. Convex hemisphere 2267 can be coated with optical filter 2261 and positioned on a self-supporting, optically non-transparent stop region 2246 such as metal, silicon, polymer etc. In some embodiments where the convex hemispherical surfaces of the micro-optic channels are used for hyperspectral imagers, optical filter 2261 can be configured to be non-uniform. For example, optical filter 2261 can be a graduated filter increasing gradually or in a step-wise manner in one direction (e.g., the thickness direction) that different micro-optic channels have different optical filter layers that have different thicknesses. This allows different micro-optic channels to measure a different range of wavelengths as discussed herein with respect to FIGS. 3A and 3B.

Figures 22D, 22E:
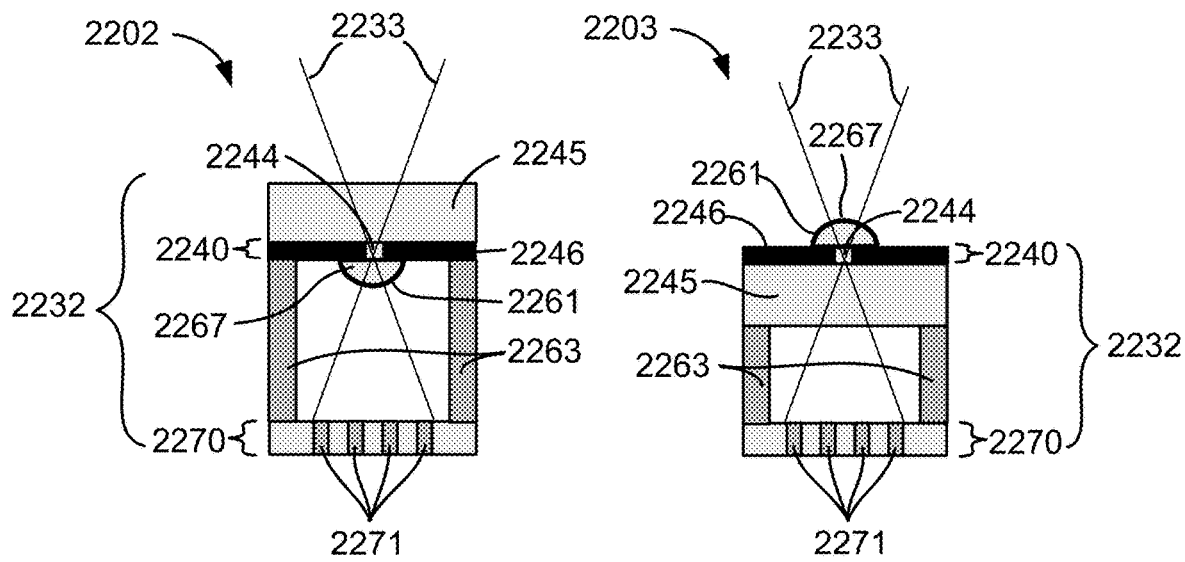

FIG. 22D is a simplified cross-sectional view diagram of an embodiment 2202 of a receiver channel 2232, according to some embodiments of the present disclosure. Receiver channel 2232 of embodiment 2202 can include convex hemisphere 2267 supported on a rigid optically transparent layer. In this embodiment, aperture layer 2240 is combined with optical filter 2261 and coated on convex hemisphere 2267, where the center of hemisphere 2267 is located at or near the focal point of incoming light (ray lines 2233). The center of hemisphere 2267 also corresponds to, or nearly corresponds to, the center of the aperture 2244. As shown in FIG. 22D, hemisphere 2267 can be below aperture layer 2240. In some other embodiments, hemisphere 2267 can be above aperture layer 2240, as shown in FIG. 22E.

FIG. 22E is a simplified cross-sectional view diagram of an embodiment 2203 of a receiver channel 2232, according to some embodiments of the present disclosure. Unlike embodiment 2202 in FIG. 22D, embodiment 2215 in FIG. 2E can be configured so that hemisphere 2267 is positioned above aperture 2244 to achieve similar functionality as embodiment 2202 but with a more compact footprint.

FIGS. 22D and 22E show convex hemisphere 2267 as being coated with optical filter 2261 and imprinted on aperture layer 2240 that is supported on a rigid optically transparent layer 2245 (e.g. glass, polymer) with aperture 2244 along with the corresponding optically non-transparent stop regions 2246. As illustrated in FIGS. 22D and 22E, receiver channel 2232 includes sidewalls 2263 between optically transparent layer 2245 and photosensor layer 2270 with photodetectors 2271 to reduce crosstalk. Sidewalls 2263 can be made up of optically non-transparent material or made up of optically transparent material. In addition, sidewalls 2263 can also be coated with reflective or absorptive material. Note that, while not shown in FIGS. 22D and 22E, there may be refraction of rays 2233 entering and exiting the rigid optically transparent layer 2245.

Figure 22F:
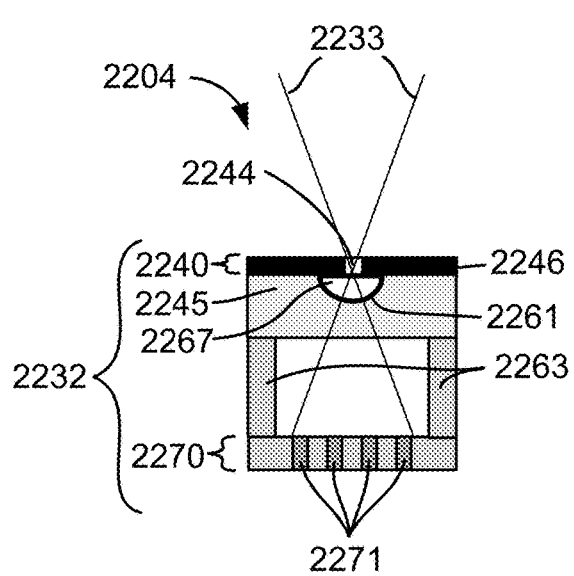

FIG. 22F is a simplified cross-sectional view diagram of an embodiment 2204 of a receiver channel 2232, according to some embodiments of the present disclosure. Embodiment 2204 can include a concave hemisphere 2267 made of optically transparent material (e.g. glass, polymer) with a coated optical filter 2261. Self-supported aperture layer 2240 can overhang concave hemisphere 2267 and can be perforated or etched with an optically non-transparent rigid material (e.g. metal film) to form the optically non-transparent stop regions 2246. As shown in FIG. 22F, hemisphere 2267 can be positioned below aperture layer 2240. The center of aperture 2244 can be located at or near the focal point of the incoming light (rays 2233). Additionally, the center of the hemisphere 2267 can be located at or near the focal point of the incoming light (rays 2233). As illustrated in FIG. 22F, receiver channel 2232 includes sidewalls 2263 between optically transparent layer 2245 and photosensor layer 2270 with photodetectors 2271 to reduce crosstalk. Sidewalls 2263 can be made up of optically non-transparent material or made up of optically transparent material. In addition, sidewalls 2263 can also be coated with reflective or absorptive material.

Figure 22G:
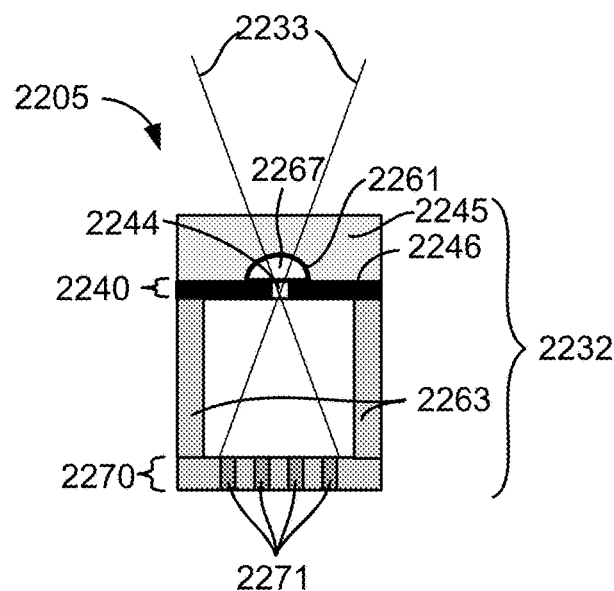

FIG. 22G is a simplified cross-sectional view diagram of an embodiment 2205 of receiver channel 2232, according to some embodiments of the present disclosure. Unlike embodiment 2204 in FIG. 22F, embodiment 2205 in FIG. 2G can be configured so that hemisphere 2267 is positioned above aperture 2244 to achieve similar functionality as embodiment 2204, but embodiment 2204 may have a more compact footprint.

Figure 22H:
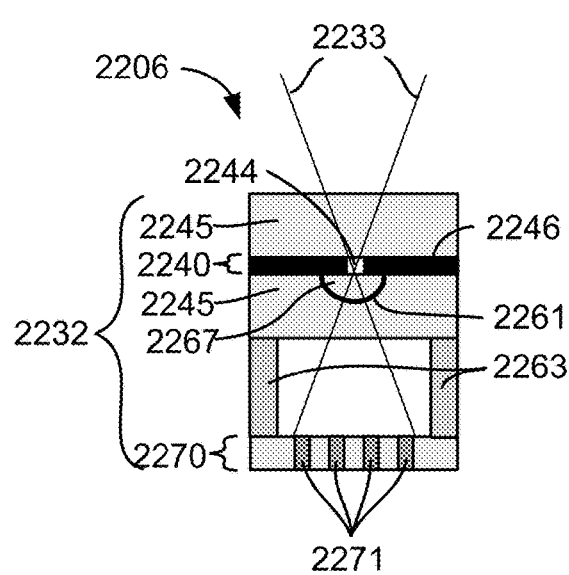

FIG. 22H is a simplified cross-sectional view diagram of an embodiment 2206 of receiver channel 2232, according to some embodiments of the present disclosure. Receiver channel 2232 of embodiment 2206 can include a concave hemisphere 2267 and aperture layer 2240 supported by a rigid, optically transparent layer 2245. In some embodiments, concave hemisphere 2267 can be below the aperture layer 2240 as shown in FIG. 22H. Concave hemisphere 267 can be made of optically transparent material (e.g. glass, polymer) with a coated optical filter 2261. Aperture layer 2240 with optically transparent aperture 2244 and corresponding optically non-transparent stop regions 244 is supported by optically transparent layer 2245 on both top and bottom sides of aperture layer 2240. The center of aperture 2244 is located at or near the focal point of the incoming light (rays 2233). Additionally, the center of concave hemisphere 2267 is located at or near the focal point of the incoming light (rays 2233). As illustrated in FIG. 22H, receiver channel 2232 includes sidewalls 2263 between optically transparent layer 2245 and photosensor layer 2270 with photodetectors 2271 to reduce crosstalk. Sidewalls 2263 can be made up of optically non-transparent material or made up of optically transparent material. In addition, sidewalls 2263 can also be coated with reflective or absorptive material.

Figure 22I:
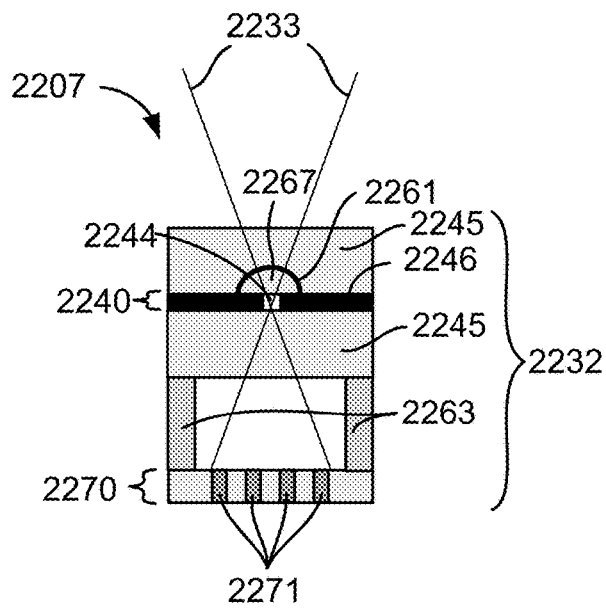

FIG. 22I is a simplified cross-sectional view diagram of an embodiment 2207 of receiver channel 2232, according to some embodiments of the present disclosure. Unlike embodiment 2206 in FIG. 22H, embodiment 2207 in FIG. 2I can be configured so that hemisphere 2267 is positioned above aperture 2244 to achieve similar functionality as embodiment 2206.

F. Bottom Micro-Lens Layer

FIG. 23A is a simplified cross-sectional view diagram of an embodiment 2300 of a receiver channel 2332, according to some embodiments of the present disclosure. Receiver channel 2332 of embodiment 2300 can include a Bottom Micro-Lens Layer (BMLL), which consists of one or more micro-lenses 2391 that are configured to guide divergent light rays into active portion of the photosensors. The BMLL performs ray angle correction to guide light from dissimilar angles into evenly spaced photosensors. Ray angle correction can be achieved by controlling the lateral offset between lens center and the photosensor center, tilting of the lens, or adjusting the form of the lens. A better illustration of this operation can be seen in FIG. 23B.

FIG. 23B is a simplified cross-sectional view diagram of a close-up view of the propagation of light during ray angle correction by a BMLL, according to some embodiments of the present disclosure. As illustrated, the pitch of the micro-optics is either not constant or is not equal to the pitch of lenses 2391 in order to steer the divergent rays (2333) to active portions of photodetectors 2371 in the photosensor layer. With reference back to FIG. 23A, each micro-lens 2391 can be positioned to correspond with a respective photodetector 2371.

FIG. 23C is a simplified cross-sectional view diagram of an embodiment 2301 of a receiver channel 2332, according to some embodiments of the present disclosure. Receiver channel 2332 of embodiment 2301 can include a single micro-lens 2391, instead of a plurality of micro-lenses as shown in FIG. 23A. Single micro-lens 2391 can be positioned over and centered to a single photodetector 2371. Micro-lens 2391 can be configured to guide light to single photodetector 2371.

Figures 23D, 23E:
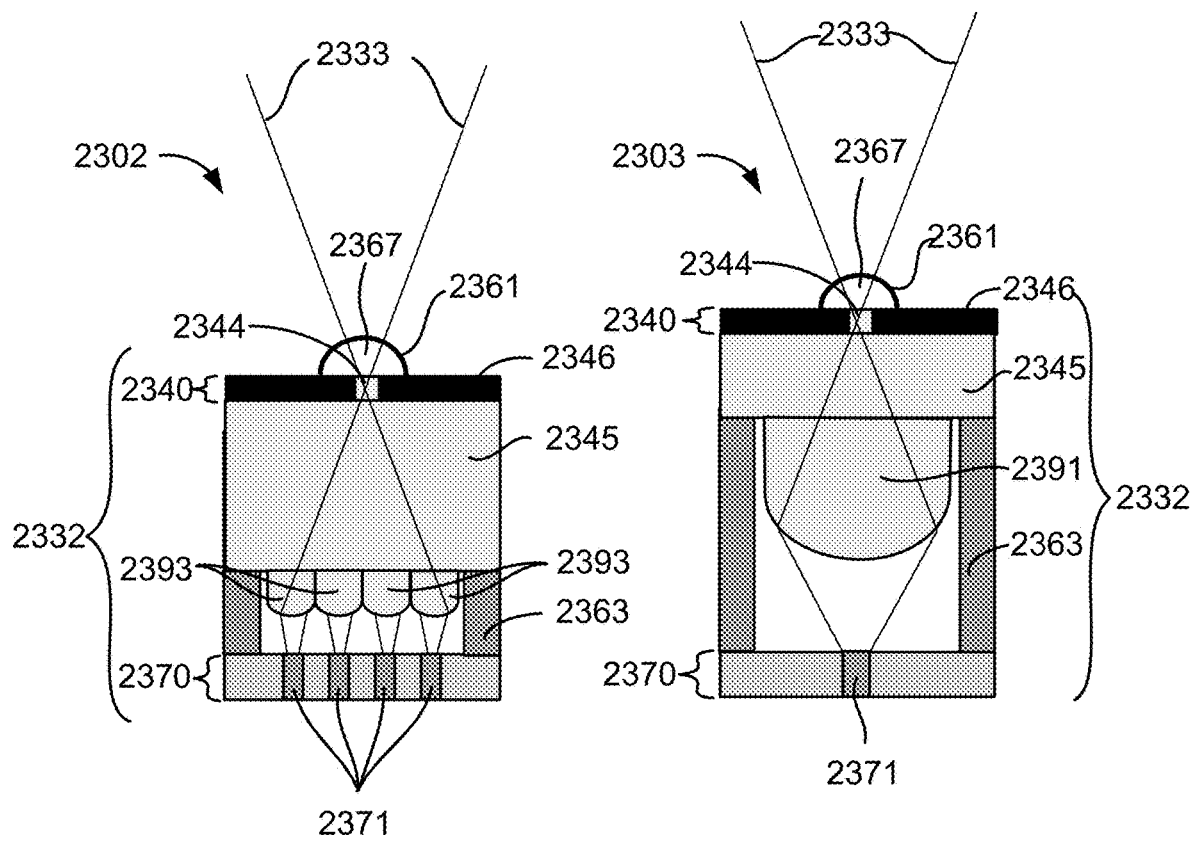

FIGS. 23D and 23E is a simplified cross-sectional view diagram of embodiments 2302 and 2303, respectively, of a receiver channel 2332, according to some embodiments of the present disclosure. Receiver channel 2332 of embodiment 2302 can include a BMLL positioned on the underside of an optically transparent layer 2345 supporting aperture layer 2340 and hemisphere 2367 with optical filter 2361 coated. As shown in FIG. 23D, the BMLL can be formed of multiple lenses 2393 for guiding divergent light to multiple photodetectors 2371. As shown in FIG. 23E, the BMLL can be formed of a single micro-lens 2391 for guiding divergent light to photodetector 2371.

Embodiments 2302 and 2303 in FIGS. 23D and 23E each include a convex hemisphere 2367 supported on a rigid optically transparent layer 2345. In these illustrations, an aperture layer 2340 is combined with an optical filter 2361 coated on hemisphere 2367, where the center of hemisphere 2367 is located at or near the focal point of incoming light (marginal ray lines 2333). The center of hemisphere 2367 can also correspond to, or nearly correspond to, the center of aperture 2344. Convex hemisphere 2367 can be coated with optical filter 2361 and imprinted on aperture layer 2340 that is supported on rigid optically transparent layer 2345 (e.g. layer formed of glass, polymer) and the corresponding optically non-transparent stop regions 2346. As illustrated in FIGS. 23D and 23E, receiver channel 2332 includes sidewalls 2363 between optically transparent layer 2345 and photosensor layer 2370 to reduce crosstalk. Sidewalls 2363 can be made up of optically non-transparent material or made up of optically transparent material. In addition, sidewalls 2363 can also be coated with reflective or absorptive material.

G. Additional Exemplary Receiver Channels

Figure 24:
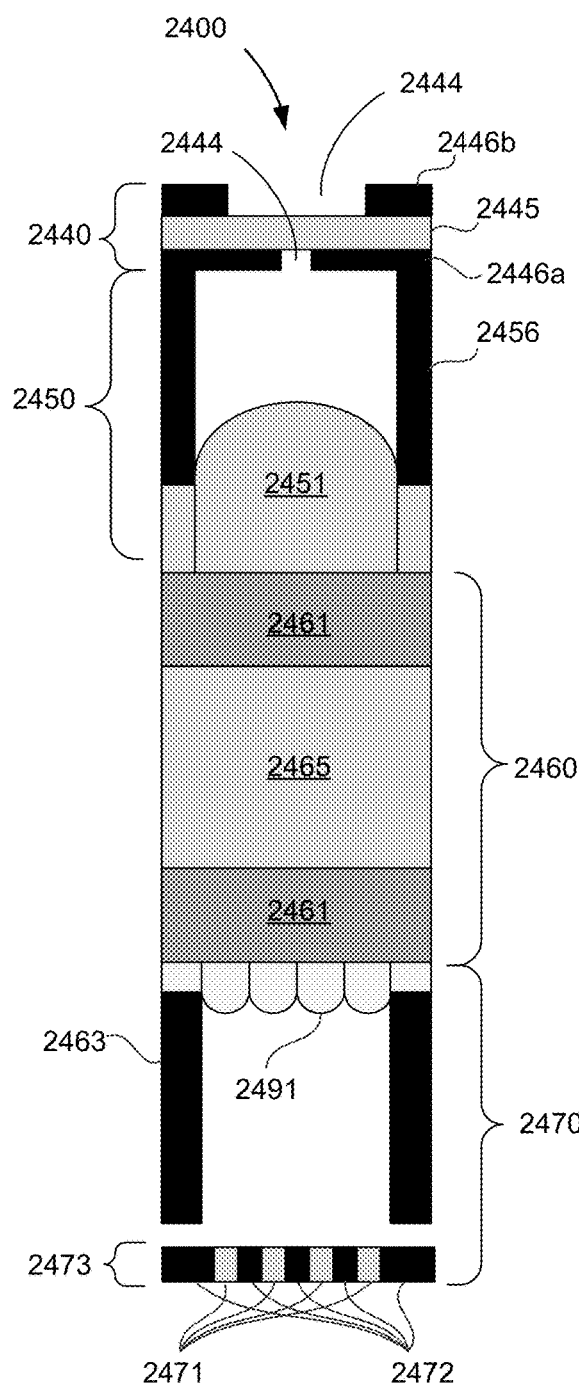
FIGS. 24 and 25 are simplified cross-sectional view diagrams of exemplary receiver channels, according to some embodiments of the present disclosure.
Figure 25:
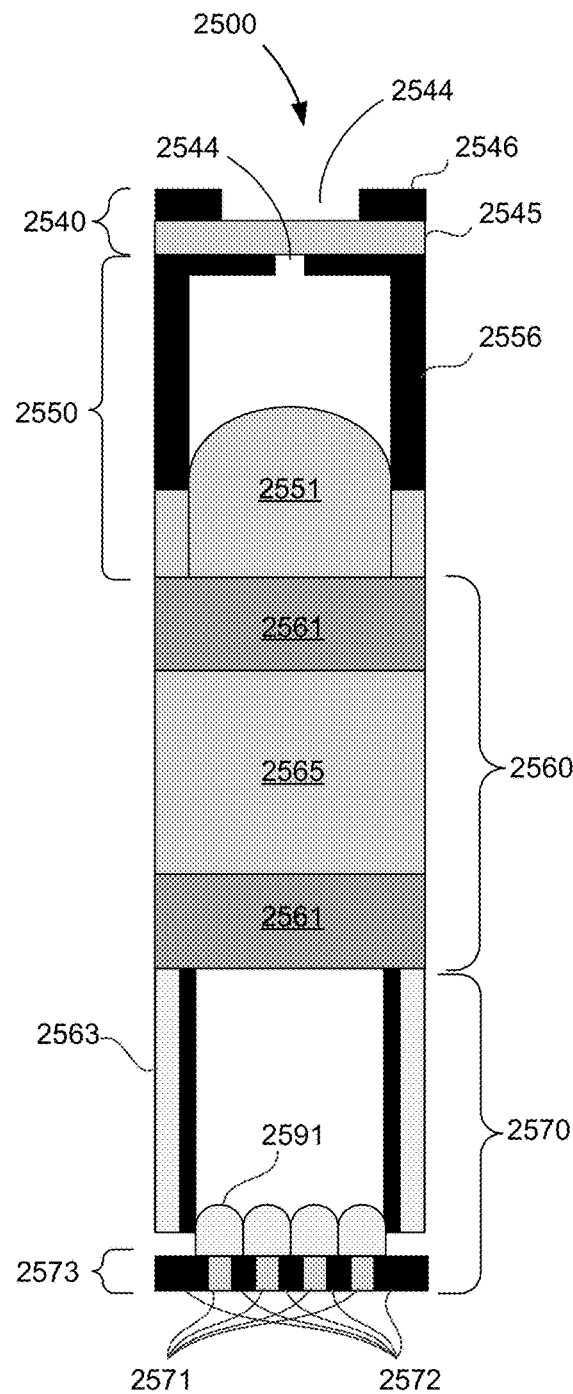

It is to be appreciated that a receiver channel is a structure at the micro-optic level, e.g., a micro-optic receiver channel discussed above, that can be formed from multiple layers including one or more of an aperture layer, an optical lens layer below the aperture layer, an optical filter layer below the aperture and optical lens layer, and a photosensor layer below all the other layers. Each such layer can be configured in various ways to mitigate cross-talk. i.e., exposing stray light to adjacent receiver channels, as discussed herein with respect to FIGS. 17-23E. Various examples of receiver channels are discussed above with respect to FIGS. 17, 22A-22I, and 23A-23E. Two other examples of receiver channels according to the present disclosure are illustrated in FIGS. 24 and 25. Embodiments of the present disclosure are not limited to the particular receiver channels described herein. Instead, based on the present disclosure a person of skill in the art will appreciate that in other embodiments a receiver channel according to the disclosure can include, among other options, an aperture layer as described above with respect to any of FIGS. 18A-18D or 19A-19D, a filter layer as described above with respect to any of FIGS. 20A-20G, and/or a photosensor layer as described above with respect to any of FIGS. 21A-21K.

FIG. 24 is a simplified cross-sectional view diagram of an exemplary embodiment of a receiver channel 2400, according to some embodiments of the present disclosure. Receiver channel 2400 can include an aperture layer 2440 composed of first and second apertures 2444, each formed in respective optically non-transparent layers 2446a and 2446b. First and/or second apertures 2444 can be formed of void space defined by openings within layers 2446a and 2446b in some embodiments, while first and/or second apertures 2444 can be formed by optically transparent materials in some other embodiments. First and second optically non-transparent layers 2446a and 2446b can be supported by an optically transparent substrate 2445 sandwiched between first and second optically non-transparent layers 2446a and 2446b.

Receiver channel 2400 can also include an optical lens layer 2450 disposed below aperture layer 2440. Optical lens layer 2450 can include a collimating lens 2451 and an optically non-transparent spacer structure 2456. Collimating lens 2451 can be separated from aperture layer 2440 by optically non-transparent spacer structure 2456. In some embodiments, optically non-transparent spacer structure 2456 forms a tube having a circumference that surrounds collimating lens 2451 and extends toward aperture layer 2440. Optically non-transparent spacer structure 2456 can be formed of an optically reflective or absorptive material that prevents any light from traveling outside of receiver channel 2400 in the region between aperture layer 2440 and collimating lens 2451.

In addition to aperture layer 2440 and optical lens layer 2450, receiver channel 2400 can further include an optical filter layer 2460 positioned directly below optical lens layer 2450. Optical filter layer 2460 can include two optical filters 2461 sandwiching an optically transparent substrate 2465 that structurally supports optical filters 2461. Optical filter layer 2460 can contain any number and type of optical filters 2461 on any number of substrates 2065. For instance, one of optical filters 2461 can be a bandpass filter and be positioned on either on top of or directly below optically transparent substrate 2465 that blocks all of the incident light for a defined set of wavelengths (e.g. 900-945 nm and 950-995 nm). The other optical filter 2461 placed on the opposite side of optically transparent substrate 2465 can be a different filter, such as a wide spectrum blocking filter (except for the region covered by the bandpass filter), for example covering 200-915 nm and 980-1600 nm. The bandpass filter and blocking filter are designed such that there is no leakage in the transition region between the two filters. However, the filters could be two edge pass filters designed to work in conjunction as a bandpass filter or any other type of filter.

Immediately below optical filter layer 2460 can be a photosensor layer 2470. In some embodiments, photosensor layer 2470 of embodiment 2400 can include an optically non-transparent spacer structure 2463 positioned between a converging lens set 2491 and a photosensor 2473. Photosensor 2473 can be formed of a set of discrete photodetectors 2471 (e.g., SPADs) positioned between a set of inactive regions 2172 (e.g., integrated logic) in an alternating arrangement, where each discrete photodetector is configured to detect incident photons. Converging lens set 2491 can be interposed between optical filter layer 2460 and photosensor 2473 with photodetectors 2471, and including one converging lens 2491 per discrete photodetector 2471 within photosensor 2173, where each lens of the converging lens set 2491 is configured to focus incident photons passed by optical filter layer 2460 onto a corresponding discrete photodetector 2471. Each converging lens can exhibit a common focal length, and converging lens set 2491 can be offset above the sensing plane of the photosensor by this common focal length (or by a distance substantially similar to this common focal length), and each converging lens can converge incident light—collimated in optical lens layer 2450 and passed by optical filter layer 2460—onto one corresponding photodetector 2471 in photosensor 2473. Optically non-transparent spacer structure 2463 forms a tube of substantially similar or larger diameter to a collimating lens 2451 and prevents any light from traveling outside of receiver channel 2400 in the region between lens set 2491 and photosensor 2473. Optically non-transparent spacer structure 2163 could be made from optically non-transparent bulk media (e.g. silicon or polymer).

Another exemplary embodiment of a receiver channel is shown in FIG. 25. FIG. 25 is a simplified cross-sectional view diagram of an exemplary receiver channel 2500, according to some embodiments of the present disclosure. Receiver channel 2500 can include an aperture layer 2540, an optical lens layer 2550 disposed below aperture layer 2540, and an optical filter layer 2560 below both aperture layer 2540 and optical lens layer 2550. Aperture layer 2540, optical lens layer 2550, and optical filter layer 2560 can have the same construction and function as corresponding components in FIG. 24.

Receiver channel 2500 can also include a photosensor layer 2570 positioned immediately below optical filter layer 2560. In some embodiments, photosensor layer 2570 of embodiment 2400 can include an optically non-transparent spacer structure 2563, a converging lens set 2591, and a photosensor 2573. Unlike converging lens set 2491 of receiver channel 2400 in FIG. 24, converging lens set 2591 of receiver channel 2500 can be positioned directly on at top surface of photosensor 2573 instead of directly on an underside of optical filter layer 2560. Furthermore, optically non-transparent spacer structure 2563 can be formed of an optically non-transparent material (e.g., black chrome) coated on an optically transparent layer, such as a silicon or glass substrate, instead of being a solid optically non-transparent structure, e.g., optically non-transparent spacer structure 2463 of receiver channel 2400 in FIG. 24. Lens set 2591 serves to focus light onto photodetectors 2571 of photosensor 2573, rather than inactive areas 2572.

By implementing a receiver channel according to any of embodiments 2400 and 2500, errant light can be prevented from exposing on adjacent receiver channels, thereby improving the accuracy of each photosensor's ability to capture photons for imaging.

VI. Micro Optical Receiver Channel Array Variations

According to some embodiments of the present disclosure, micro-optical receiver channels can be organized in an array. The array can have various dimensions according to design. For instance, an array of micro-optical receiver channels can be arranged in a M×N array where M and N are equal to or greater than 1. Accordingly, micro-optical receiver channels can be one- and two-dimensional arrays, as will be discussed furthered herein with respect to FIGS. 26-30, which illustrate different embodiments of micro-optical receiver channel arrays where each dot represents a micro-optical receiver channel. As aforementioned herein, each receiver channel can include a plurality of layers stacked upon each other. Thus, it can be appreciated that when arranged in an array, each micro-optic receiver channel is part of a monolithic layer composed of the individual elements reproduced many times in the M×N arrangement, e.g., an M×N aperture layer array, an M×N micro lens layer array, and an M×N photosensor layer array. When bonded together, these array layers create a monolithic multi-channel micro optical receiver array.

Figure 26:
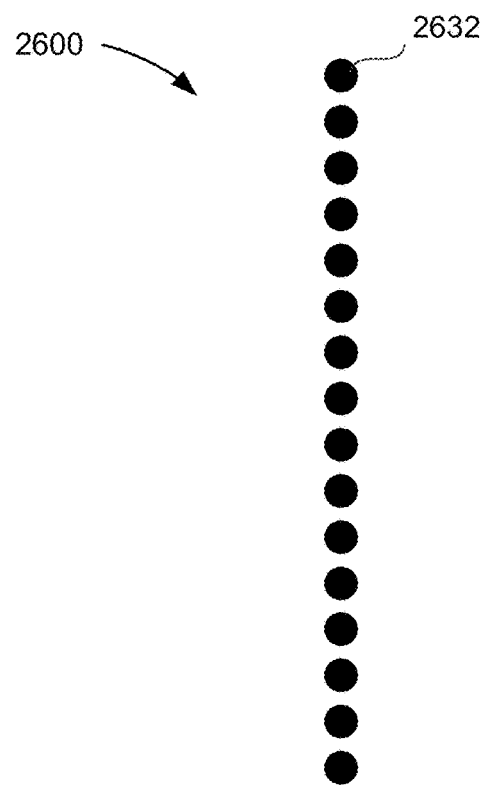

FIG. 26 is a simplified illustration of an exemplary micro-optical receiver array 2600, according to some embodiments of the present disclosure. Micro-optical receiver array 2600 is configured as a linear (M×1) array, specifically a 16×1 array. This layout can achieve a high resolution (e.g. 16×1024) as the implementation is amenable to scanning the array in one dimension. As an example, for a receiver channel pitch of 500 microns the layout illustrated can be implemented in a chip of a size that is approximately 500 microns by 8000 microns.

Figure 27:
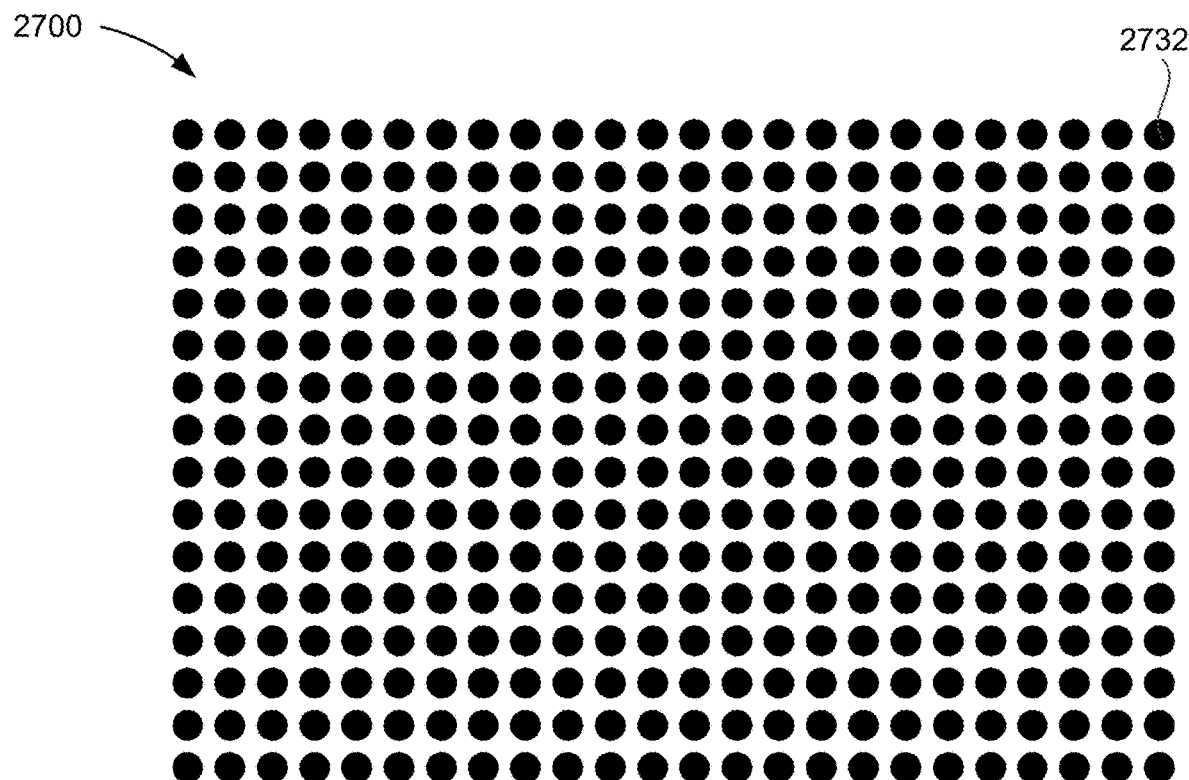

FIG. 27 is a simplified illustration of an exemplary micro-optical receiver array 2700, according to some embodiments of the present disclosure. Micro-optical receiver array 2700 is configured as a rectangular (M×N) array, specifically a 16×32 array. Thus, for a receiver channel pitch of 500 microns the layout illustrated can be implemented in a chip of size 8,000 microns by 12000 microns.

FIG. 28 is a simplified illustration of an exemplary micro-optical receiver array 2800, according to some embodiments of the present disclosure. Micro-optical receiver array 2800 is configured as an M×N staggered array. In this illustration, receiver channels 2832 are laid out in a 16×4 staggered array. This layout can achieve a high resolution (e.g. 64×1024) as the implementation is amenable to sweeping. For a receiver channel pitch of 500 microns the layout illustrated in FIG. 28 can be implemented in a chip of a size that is approximately 2000 microns by 8375 microns.

FIG. 29 is a simplified illustration of an exemplary micro-optical receiver array 2900, according to some embodiments of the present disclosure. Micro-optical receiver array 2900 is configured as a warped linear (M×1) array. In this embodiment, the spacing between receiver channels 2932 is uneven. Receiver channels near the center, shown as 2932-01, are placed close together (e.g. 400 microns apart), while the exterior channels, shown as 2932-02, are placed farther apart (e.g., greater than 400 microns apart), or vice versa. This layout has an advantage of being able to allow for correction of the distortion curve of a lens (i.e. the angles between the receiver channel fields of view are evenly spaced in the object space). The arrangement shown in FIG. 29 can be used to achieve a high resolution (e.g. 16×1024) as the implementation is amenable to sweeping. For an average receiver channel pitch of 500 microns the layout illustrated can be implemented in a chip of a size that is approximately 500 microns by 8000 microns.

In some embodiments, the receiver channels can be configured in a M×N warped array (where N≥1). In such embodiments, the receiver channels in the center are placed further from each other in both the x and y direction than the exterior receiver channels. This corrects for another possible form of lens distortion.

FIG. 29 is a simplified illustration of an exemplary micro-optical receiver array 2900, according to some embodiments of the present disclosure. Micro-optical receiver array 2900 is configured in an arbitrary pattern. This layout arrangement has the advantage of being able to accommodate lens distortion, to make adjustments to compensate for any timing or routing variations, and also to match an arbitrary pattern from an illumination source.

Although the present disclosure has been described with respect to specific embodiments, it will be appreciated that the present disclosure is intended to cover all modifications and equivalents within the scope of the following claims.

What is claimed is:

1. An optical system, comprising:
a bulk receiver optic configured to receive light rays originating from a field external to the optical system; and
an optical assembly having a plurality of micro-optic receiver channels defining a plurality of discrete, non-overlapping fields of view in the field, the optical assembly comprising:
an aperture layer having a plurality of discrete apertures arranged along a focal plane of the bulk receiver optic;
an array of photosensors disposed behind the aperture layer; and
a non-uniform optical filter layer configured to allow different micro-optic channels to measure different ranges of wavelengths;
wherein the optical assembly further comprises a plurality of lenses, each channel further including a lens from the plurality of lenses, and wherein the lens for each channel is axially aligned with and configured to collimate lights rays received through its corresponding aperture and pass the collimated light rays into its corresponding photosensor.

2. The optical system set forth in claim 1 wherein the non-uniform optical filter comprises a graduated optical filter.

3. The optical system set forth in claim 2 wherein the graduated optical filter gradually increases in thickness in one dimension.

4. The optical system set forth in claim 2 wherein the graduated optical filter increases in thickness in a step-wise fashion in one dimension such that each channel has a constant optical filter layer thickness, but wherein the thicknesses for different micro-optic channels are different.

5. The optical system set forth in claim 1 wherein the array of photosensors comprises an array of photodetectors with each photodetector comprising an array of single-photon avalanche detectors (SPADs).

6. The optical system set forth in claim 1 wherein each channel includes an aperture from the plurality of discrete apertures, and a photosensor in the array of photosensors.

7. The optical system set forth in claim 1 wherein the lens for each channel is configured as a hemisphere positioned along a path of light from the bulk receiver optic, wherein the optical filter is coated on a curved surface of the lens.

8. The optical system set forth in claim 1 wherein the photosensor in each channel comprises a plurality of single-photon avalanche detectors (SPADs).

9. An optical system, comprising:
a bulk receiver optic configured to receive light rays originating from a field external to the optical system; and
an optical assembly having a plurality of micro-optic receiver channels defining a plurality of discrete, non-overlapping fields of view in the field, the optical assembly comprising:
an aperture layer having a plurality of discrete apertures arranged along a focal plane of the bulk receiver optic;
a plurality of lenses;
an array of photosensors disposed behind the aperture layer; and
a non-uniform optical filter layer configured to allow different micro-optic channels to measure different ranges of wavelengths;
wherein each channel includes an aperture from the plurality of discrete apertures, a lens from the plurality of lenses and a photosensor in the array of photosensors, the photosensor comprising a plurality of single-photon avalanche detectors (SPADs);
wherein the lens for each channel collimates lights rays received through its corresponding aperture and passes the collimated light rays into its corresponding photosensor; and
each channel further comprises a second plurality of lenses that corresponds in number to the plurality of SPADs and wherein each lens in the second plurality of lenses focuses incident photons received at the photosensor on an individual SPAD in the plurality of SPADs in the channel.

10. An optical system, comprising:
a bulk receiver optic configured to receive light rays originating from a field external to the optical system; and
an optical assembly having a plurality of micro-optic receiver channels defining a plurality of discrete, non-overlapping fields of view in the field, the optical assembly comprising:

an aperture layer having a plurality of discrete apertures arranged along a focal plane of the bulk receiver optic;

an array of photosensors disposed behind the aperture layer; and a non-uniform optical filter layer configured to allow different micro-optic channels to measure different ranges of wavelengths;

wherein the optical assembly comprises a monolithic ASIC constructed on a common substrate, within which the array of photosensors are fabricated, and the separate layers for the aperture layer, a plurality of lenses, and the filter layer are formed on the monolithic ASIC such that they become part of the monolithic structure of the ASIC.

11. The optical system set forth in claim 10 wherein each of the separate layers for the aperture layer, the plurality of lenses, the filter layer and the array of photosensors is bonded to its adjacent layer.

12. An optical system comprising:
a bulk receiver optic configured to receive light from a field external to the optical system;
an aperture layer disposed behind the bulk optic and including a plurality of apertures located at a focal plane of the bulk optic;
a lens layer including a plurality of collimating lenses having a focal length, the lens layer disposed behind the aperture layer and separated from the aperture layer by the focal length;
a non-uniform optical filter layer behind the lens layer; and
a photosensor layer including a plurality of photosensors;
wherein the aperture layer, lens layer, non-uniform optical filter layer and photosensor layer are arranged to form a plurality of micro-optic channels defining a plurality of discrete, non-overlapping fields of view in the field with each micro-optic channel in the plurality of micro-optic channels including an aperture from the plurality of apertures, a lens from the plurality of lenses, a filter from the filter layer, and a photosensor from the plurality of photosensors and being configured to communicate light incident from the bulk receiver optic to the photosensor of the micro-optic channel; and
wherein the non-uniform optical filter layer is configured to allow different micro-optic channels to measure different ranges of wavelengths.

13. The optical system set forth in claim 12 wherein the non-uniform optical filter comprises a graduated optical filter.

14. The optical system set forth in claim 13 wherein the graduated optical filter gradually increases in thickness in one dimension.

15. The optical system set forth in claim 13 wherein the graduated optical filter increases in thickness in a step-wise fashion in one dimension such that each channel has a constant optical filter layer thickness, but wherein the thicknesses for different micro-optic channels are different.

16. An optical system, comprising:
a bulk receiver optic configured to receive light rays originating from a field external to the optical system; and
an optical assembly having a plurality of micro-optic receiver channels defining a plurality of discrete, non-overlapping fields of view in the field, the optical assembly comprising:
a monolithic ASIC including a processor, a memory, and a plurality of photosensors fabricated in the ASIC;
an aperture layer having a plurality of discrete apertures arranged along a focal plane of the bulk receiver optic, the array of photosensors disposed behind the aperture layer;
a plurality of lenses positioned between the aperture layer and the array of photosensors; and
a non-uniform optical filter layer configured to allow different micro-optic channels to measure different ranges of wavelengths, wherein the aperture layer, plurality of lenses, and non-uniform optical filter layer are formed on the ASIC such that they form part of the monolithic structure of the ASIC.

17. The optical system set forth in claim 16 wherein the micro-optic receiver channels are configured such that each micro-optic receiver channel is paired with a light emitter of a plurality of light emitters.

18. The optical system set forth in claim 16 wherein the non-uniform optical filter comprises a graduated optical filter.

19. The optical system set forth in claim 18 wherein the graduated optical filter gradually increases in thickness in one dimension.

20. The optical system set forth in claim 1 wherein a sensing area of each photosensor in the plurality of photosensors is larger than an area of its corresponding aperture in the plurality of apertures.

21. The optical system set forth in claim 12 wherein a sensing area of each photosensor in the array of photosensors is larger than an area of its corresponding aperture in the plurality of apertures.

* * * * *